(12) United States Patent
Myung et al.

(10) Patent No.: US 10,735,242 B2
(45) Date of Patent: *Aug. 4, 2020

(54) TRANSMITTING APPARATUS AND MAPPING METHOD THEREOF

(71) Applicant: SAMSUNG ELECTRONICS CO., LTD., Suwon-si (KR)

(72) Inventors: Se-ho Myung, Yongin-si (KR); Belkacem Mouhouche, Staines (GB); Daniel Ansorregui Lobete, Staines (GB); Kyung-joong Kim, Seoul (KR); Hong-sil Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/119,566

(22) Filed: Aug. 31, 2018

(65) Prior Publication Data
US 2018/0375610 A1     Dec. 27, 2018

Related U.S. Application Data

(63) Continuation of application No. 15/700,386, filed on Sep. 11, 2017, now Pat. No. 10,069,598, which is a continuation of application No. 14/716,023, filed on May 19, 2015, now Pat. No. 9,780,917.

(51) Int. Cl.
H04L 27/34     (2006.01)
H04L 27/26     (2006.01)
H04L 1/00      (2006.01)

(52) U.S. Cl.
CPC .......... *H04L 27/34* (2013.01); *H04L 27/2647* (2013.01); *H04L 1/0041* (2013.01); *H04L 1/0057* (2013.01)

(58) Field of Classification Search
CPC ... H04L 1/0042; H04L 27/2626; H04L 27/34; H04L 27/2647
See application file for complete search history.

(56) References Cited

U.S. PATENT DOCUMENTS

| | | | |
|---|---|---|---|
| 9,780,917 B2* | 10/2017 | Myung | H03M 13/1165 |
| 10,069,598 B2* | 9/2018 | Myung | H03M 13/1165 |
| 2007/0211822 A1 | 9/2007 | Olesen et al. | |
| 2014/0075271 A1 | 3/2014 | Petrov | |
| 2016/0156498 A1 | 6/2016 | Loghin et al. | |
| 2016/0204804 A1 | 7/2016 | Ikegaya et al. | |

* cited by examiner

*Primary Examiner* — Kevin C. Harper
(74) *Attorney, Agent, or Firm* — Sughrue Mion, PLLC

(57) ABSTRACT

A transmitting apparatus is disclosed. The transmitting apparatus includes an encoder to perform channel encoding with respect to bits and generate a codeword, an interleaver to interleave the codeword, and a modulator to map the interleaved codeword onto a non-uniform constellation according to a modulation scheme, and the constellation may include constellation points defined based on various tables according to the modulation scheme.

2 Claims, 68 Drawing Sheets

FIG. 19
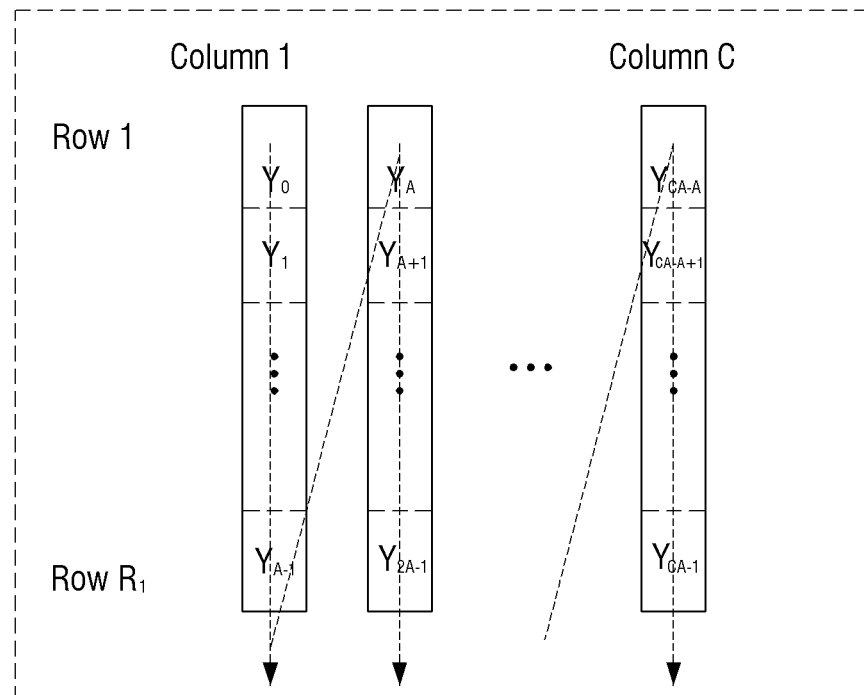
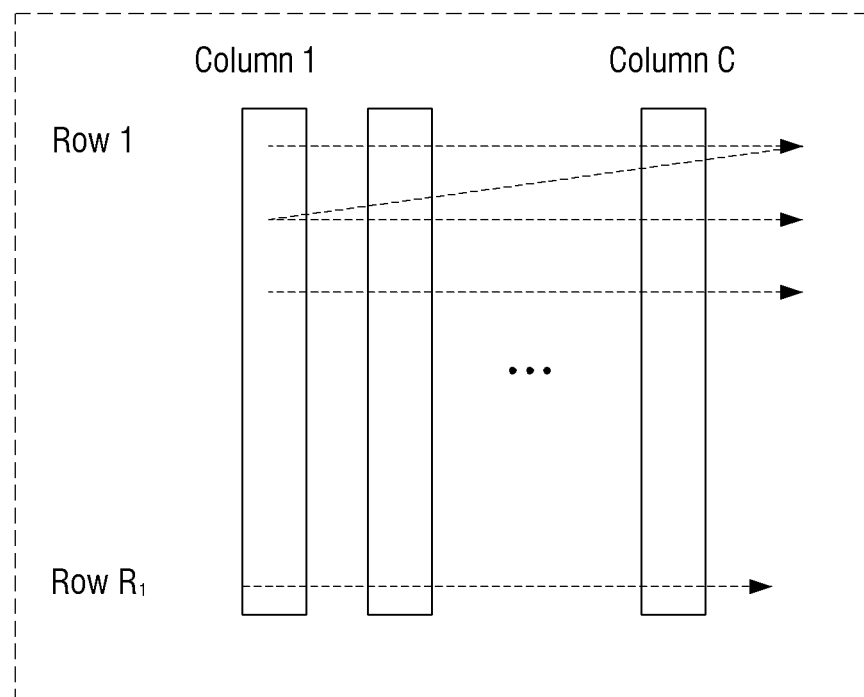

FIG. 34

Example1: (1D -> NUQAM)

- Direction is up or down

○ » First iteration all the 3 points are computed, the upper one is the best one.
● ● » second iteration only the top one is computed, the upper is the best one.
● ○ ○ » Third iteration only the top one is computed, the middle is the best one.
○ ○ » Instead of 9 points, We needed only 5.
○

Example2: (2D -> NUC)

- Direction are 9 values.

○ ○ ○ » First iteration all the 9 points are computed, the bottom one is the best one.
○ ○ ○ » second iteration only the 3 bottom ones is computed, the conner is the best one.
○ ● ○ » Third iteration only the 5 borders are computed, the middle is the best one.
○ ○ ○ » Instead of 9*3=27 points, we needed only 9+3+5=17.
○ ○ ○
○ ○ ●

Block for performing a first process.

Block for obtaining a first constellation defined by one or more parameter values.

Block for generating a second constellation based on the first constellation using a second process.

Block for obtaining a set of candidate constellations.

Block for determining the performance of each candidate constellation according to a predetermined performance measure.

Block for selecting the candidate constellation having the best performance as the second constellation.

Block for determining a difference between the first constellation and the second constellation.

Block for, if the second constellation differs from the first constellation by more than a threshold amount, causing the block for performing the first process to repeat the first process using the second constellation generated in the current iteration of the first process as the first constellation in the next iteration

TRANSMITTING APPARATUS AND MAPPING METHOD THEREOF

CROSS-REFERENCE TO RELATED APPLICATION

This application is a Continuation of application Ser. No. 15/700,386 filed Sep. 11, 2017, which is a Continuation of application Ser. No. 14/716,023 filed May 19, 2015, and issued as U.S. Pat. No. 9,780,917 on Oct. 3, 2017, the disclosures of which are incorporated herein by reference in their entirety.

BACKGROUND

1. Field

Apparatuses and methods consistent with exemplary embodiments of the inventive concept relate to transmitting and receiving date using broadcasting, more particularly, to the design of non-uniform constellations used in a Bit Interleaved Coded Modulation (BICM) mapping bits at an output of an encoder and interleaver to complex constellations.

2. Description of the Related Art

The current broadcasting systems consistent with the Digital Video Broadcasting Second Generation Terrestrial (DVB-T2) use a Bit Interleaved and Coded Modulation (BICM) chain in order to encode bits to be transmitted. The BICM chain includes a channel encoder like a Low Density Parity Check (LDPC) encoder followed by a Bit Interleaver and a Quadrature Amplitude Modulation (QAM) mapper. The role of the QAM mapper is to map different bits output from the channel encoder and interleaved using the Bit Interleaver to QAM cells. Each cell represents a complex number having real and imaginary part. The QAM mapper groups M bits into one cell. Each cell is translated into a complex number. M, which is the number of bits per cell, is equal to 2 for QPSK, 4 for 16QAM, 6 for 64QAM, and 8 for 256. It is possible to use a higher QAM size in order to increase a throughput. For example: 1K QAM is a constellation containing 1024 possible points and used to map M=10 bits. The DVB-T2 and previous standards use a uniform QAM. The uniform QAM has two important properties: possible points of constellation are rectangular, and spacing between each two successive points is uniform. The uniform QAM is very easy to map and demap.

The QAM is also easy to use since it does not need to be optimised as a function of the signal to noise ratio (SNR) or the coding rate of the channel code like the LDPC code. However, the capacity of the uniform QAM leaves a big gap from the theoretical limit, known as the Shannon limit. The performance in terms of bit error rate (BER) or frame error rate (FER) may be far from optimal.

SUMMARY

In order to reduce the gap from Shannon limit and provide a better BER/FER performance, a non-uniform constellation (NUC) is generated by relaxing the two properties of the uniform QAM, namely: the square shape and the uniform distance between constellations points.

It is an aim of certain exemplary embodiments of the present invention to address, solve and/or mitigate, at least partly, at least one of the problems and/or disadvantages associated with the related art, for example at least one of the problems and/or disadvantages described above. It is an aim of certain exemplary embodiments of the present invention to provide at least one advantage over the related art, for example at least one of the advantages described below.

The present invention is defined in the independent claims. Advantageous features are defined in the dependent claims.

Other aspects, advantages, and salient features of the invention will become apparent to those skilled in the art from the following detailed description, which, taken in conjunction with the annexed drawings, disclose exemplary embodiments of the invention.

BRIEF DESCRIPTION OF THE DRAWINGS

The above and/or other aspects will be more apparent by describing certain exemplary embodiments with reference to the accompanying drawings, in which:

FIGS. 19 to 22 are views to illustrate an interleaving method of a block interleaver, according to exemplary embodiments;

FIG. 34 further illustrates the sixth algorithm illustrated in FIG. 33, according to an exemplary embodiment;

FIG. 40 illustrates an apparatus for implementing an algorithm according to an exemplary embodiment;

DETAILED DESCRIPTION OF THE EXEMPLARY EMBODIMENTS

Figure 1A:
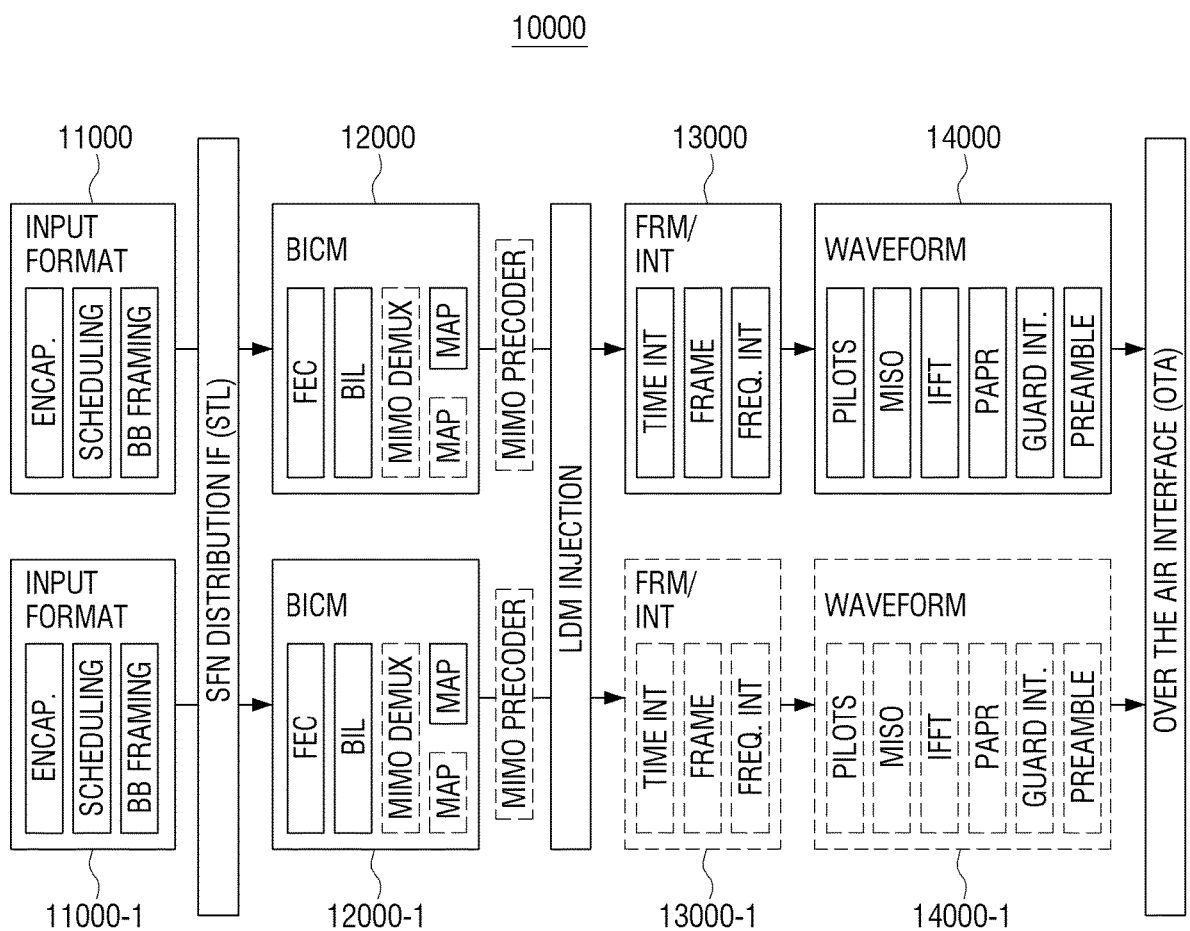
FIGS. 1A to 12 are views to illustrate a transmitting apparatus according to exemplary embodiments.

Various exemplary embodiments will now be described in greater detail with reference to the accompanying drawings.

In the following description, same drawing reference numerals are used for the same elements even in different drawings. The matters defined in the description, such as detailed construction and elements, are provided to assist in a comprehensive understanding of the invention. Thus, it is apparent that the exemplary embodiments can be carried out without those specifically defined matters. Also, well-known functions or constructions are not described in detail since they would obscure the exemplary embodiments with unnecessary detail.

The following description of the exemplary embodiments with reference to the accompanying drawings is provided to assist in a comprehensive understanding of the inventive concept, as defined by the claims. The description includes various specific details to assist in that understanding but these are to be regarded as merely exemplary. Accordingly, those of ordinary skill in the art will recognize that various changes and modifications of the embodiments described herein can be made without departing from the scope of the inventive concept.

The same or similar components may be designated by the same or similar reference numerals, although they may be illustrated in different drawings.

Detailed descriptions of techniques, structures, constructions, functions or processes known in the art may be omitted for clarity and conciseness, and to avoid obscuring the subject matter of the exemplary embodiments.

The terms and words used herein are not limited to the bibliographical or standard meanings, but, are merely used by the inventors to enable a clear and consistent understanding of the exemplary embodiments.

Throughout the description and claims of this specification, the words "comprise", "contain" and "include", and variations thereof, for example "comprising", "containing" and "including", means "including but not limited to", and is not intended to (and does not) exclude other features, elements, components, integers, steps, operations, processes, functions, characteristics, and the like.

Throughout the description and claims of this specification, the singular form, for example "a", "an" and "the", encompasses the plural unless the context otherwise requires. For example, reference to "an object" includes reference to one or more of such objects.

Throughout the description and claims of this specification, language in the general form of "X for Y" (where Y is some action, process, function, activity or step and X is some means for carrying out that action, process, function, activity or step) encompasses means X adapted, configured or arranged specifically, but not necessarily exclusively, to do Y.

Features, elements, components, integers, steps, operations, processes, functions, characteristics, and the like, described in conjunction with a particular aspect, embodiment, example or claim of the inventive concept are to be understood to be applicable to any other aspect, embodiment, example or claim described herein unless incompatible therewith.

The exemplary embodiments may be implemented in the form of any suitable method, system and/or apparatus for use in digital broadcasting, for example in the form of a mobile/portable terminal (e.g. mobile telephone), hand-held device, personal computer, digital television and/or digital radio broadcast transmitter and/or receiver apparatus, set-top-box, etc. Any such system and/or apparatus may be compatible with any suitable existing or future digital broadcast system and/or standard, for example one or more of the digital broadcasting systems and/or standards referred to herein.

FIG. 1A is provided to explain transmitting apparatus according to an exemplary embodiment.

According to FIG. 1A, a transmitting apparatus 10000 according to an exemplary embodiment may include an Input Formatting Block (or part) 11000, 11000-1, a BIT Interleaved and Coded Modulation (BICM) block 12000, 12000-1, a Framing/Interleaving block 13000, 13000-1 and a Waveform Generation block 14000, 14000-1.

The transmitting apparatus 10000 according to an exemplary embodiment illustrated in FIG. 1A includes normative blocks shown by solid lines and informative blocks shown by dotted lines. Here, the blocks shown by solid lines are normal blocks, and the blocks shown by dotted lines are blocks which may be used when implementing an informative MIMO.

The Input Formatting block 11000, 11000-1 generates a baseband frame (BBFRAME) from an input stream of data to be serviced. Herein, the input stream may be a transport stream (TS), Internet protocol (IP) stream, a generic stream (GS), a generic stream encapsulation (GSE), etc.

The BICM block 12000, 12000-1 determines a forward error correction (FEC) coding rate and a constellation order depending on a region where the data to be serviced will be transmitted (e.g., a fixed PHY frame or mobile PHY frame), and then, performs encoding. Signaling information on the data to be serviced may be encoded through a separate BICM encoder (not illustrated) or encoded by sharing the BICM encoder 12000, 12000-1 with the data to be serviced, depending on a system implementation.

The Framing/Interleaving block 13000, 13000-1 combines time interleaved data with signaling information to generate a transmission frame.

The Waveform Generation block 14000, 14000-1 generates an OFDM signal in the time domain on the generated transmission frame, modulates the generated OFDM signal to a radio frequency (RF) signal and transmits the modulated RF signal to a receiver.

Figure 1B:
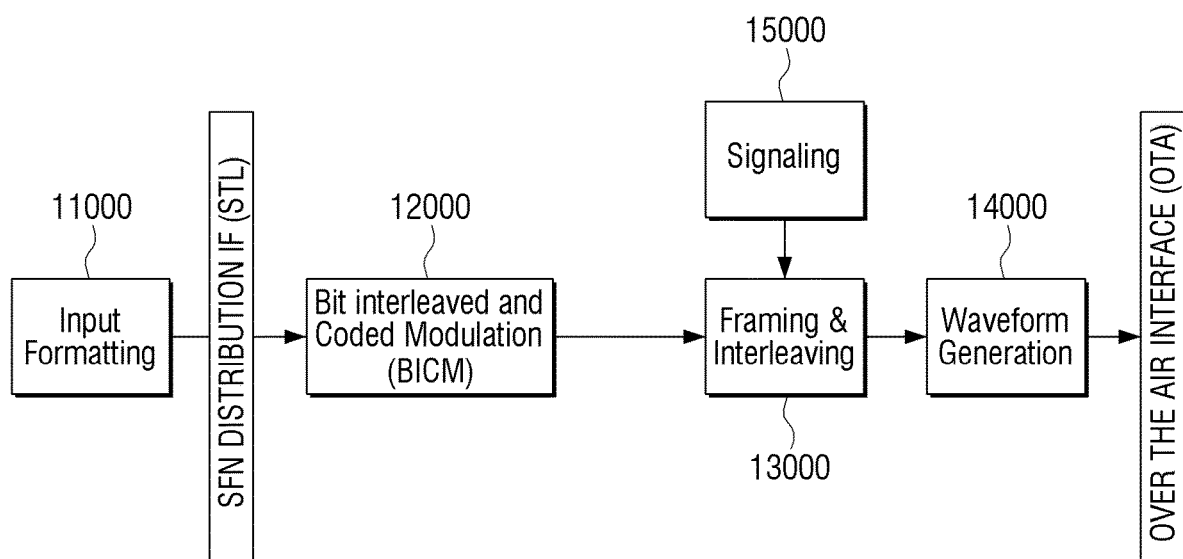
Figure 1C:
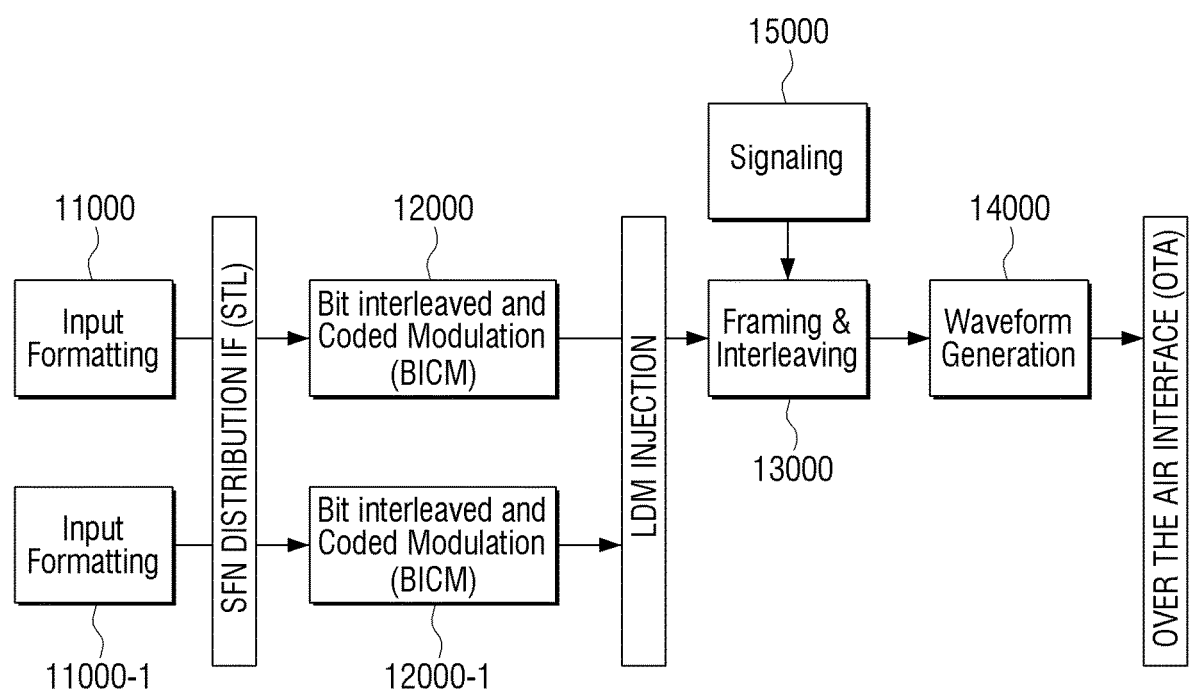

FIGS. 1B and 1C are provided to explain methods of multiplexing according to an exemplary embodiment.

FIG. 1B illustrates a block diagram to implement a Time Division Multiplexing according to an exemplary embodiment.

In the TDM system architecture, there are four main blocks (or parts): the Input Formatting block 11000, the BICM block 12000, the Framing/Interleaving block 13000, and the Waveform Generation block 14000.

Data is input and formatted in the Input Formatting block, and forward error correction applied and mapped to constellations in the BICM block 12000. Interleaving, both time and frequency, and frame creation done in the Framing/Interleaving block 13000. Subsequently, the output waveform is created in the Waveform Generation block 14000.

FIG. 2B illustrates a block diagram to implement a Layered Division Multiplexing (LDM) according to another exemplary embodiment.

In the LDM system architecture, there are several different blocks compared with the TDM system architecture. Specifically, there are two separate Input Formatting blocks 11000, 11000-1 and BICM blocks 12000, 12000-1, one for each of the layers in LDM. These are combined before the Framing/Interleaving block 13000 in the LDM Injection block. The Waveform Generation block 14000 is similar to TDM.

Figure 2:
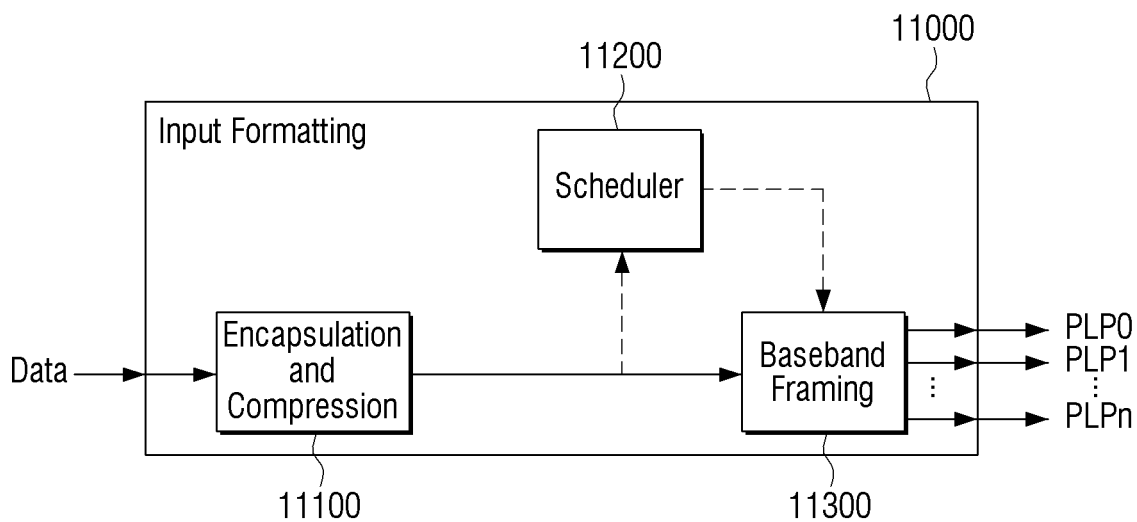

FIG. 2 is a block diagram which illustrates detailed configuration of the Input Formatting block illustrated in FIG. 1A.

As illustrated in FIG. 2, the Input Formatting block 11000 consists of three blocks which control packets distributed into PLPs. Specifically, the Input Formatting block 11000 includes a packet encapsulation and compression block 11100, a baseband framing block 11200 and a scheduler block 11300.

Input data packets input to the Input Formatting block 11000 can consist of various types, but at the encapsulation operation these different types of packets become generic packets which configure baseband frames. Here, the format of generic packets is variable. It is possible to easily extract the length of the generic packet from the packet itself without additional information. The maximum length of the generic packet is 64 kB. The maximum length of the generic packet, including header, is four bytes. Generic packets must be of integer byte length.

The scheduler 11200 receives an input stream of encapsulated generic packets and forms them into physical layer pipes (PLPs), in the form of baseband frames. In the above-mentioned TDM system there may be only one PLP, called single PLP or S-PLP, or there may be multiple PLPs, called M-PLP. One service cannot use more than four PLPs. In the case of an LDM system consisting of two layers, two PLPs are used, one for each layer.

The scheduler 11200 receives encapsulated input packet streams and directs how these packets are allocated to physical layer resources. Specifically, the scheduler 11200 directs how the baseband framing block will output baseband frames.

The functional assets of the Scheduler 11200 are defined by data size(s) and time(s). The physical layer can deliver portions of data at these discrete times. The scheduler 11200 uses the inputs and information including encapsulated data packets, quality of service metadata for the encapsulated data packets, a system buffer model, constraints and configuration from system management, and creates a conforming solution in terms of configuration of the physical layer parameters. The corresponding solution is subject to the configuration and control parameters and the aggregate spectrum available.

Meanwhile, the operation of the Scheduler 11200 is constrained by combination of dynamic, quasi-static, and static configurations. The definition of these constraints is left to implementation.

Figure 3A:
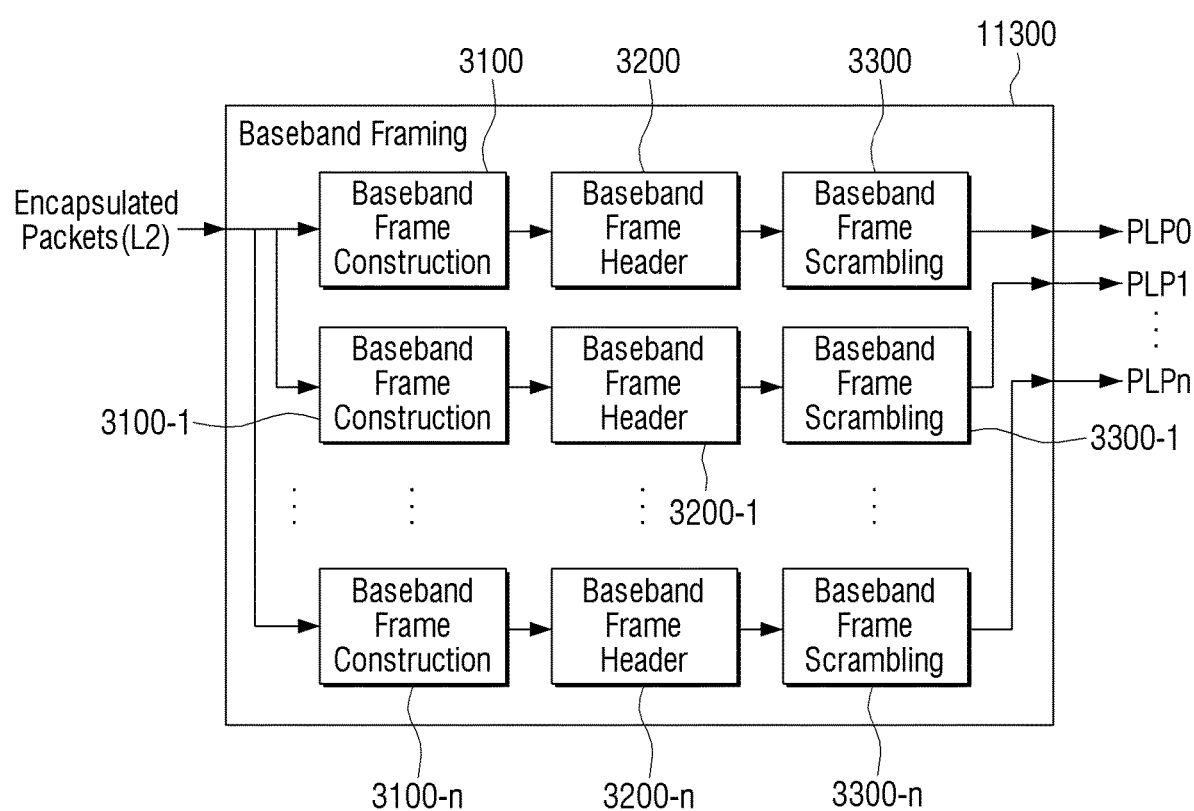

In addition, for each service a maximum of four PLPs shall be used. Multiple services consisting of multiple time interleaving blocks may be constructed, up to a total maximum of 64 PLPs for bandwidths of 6, 7 or 8 MHz. The baseband framing block 11300, as illustrated in FIG. 3A, consists of three blocks, baseband frame construction 3100, 3100-1, . . . 3100-n, baseband frame header construction block 3200, 3200-1, . . . 3200-n, and the baseband frame scrambling block 3300, 3300-1, . . . 3300-n. In a M-PLP operation, the baseband framing block creates multiple PLPs as necessary.

Figure 3B:
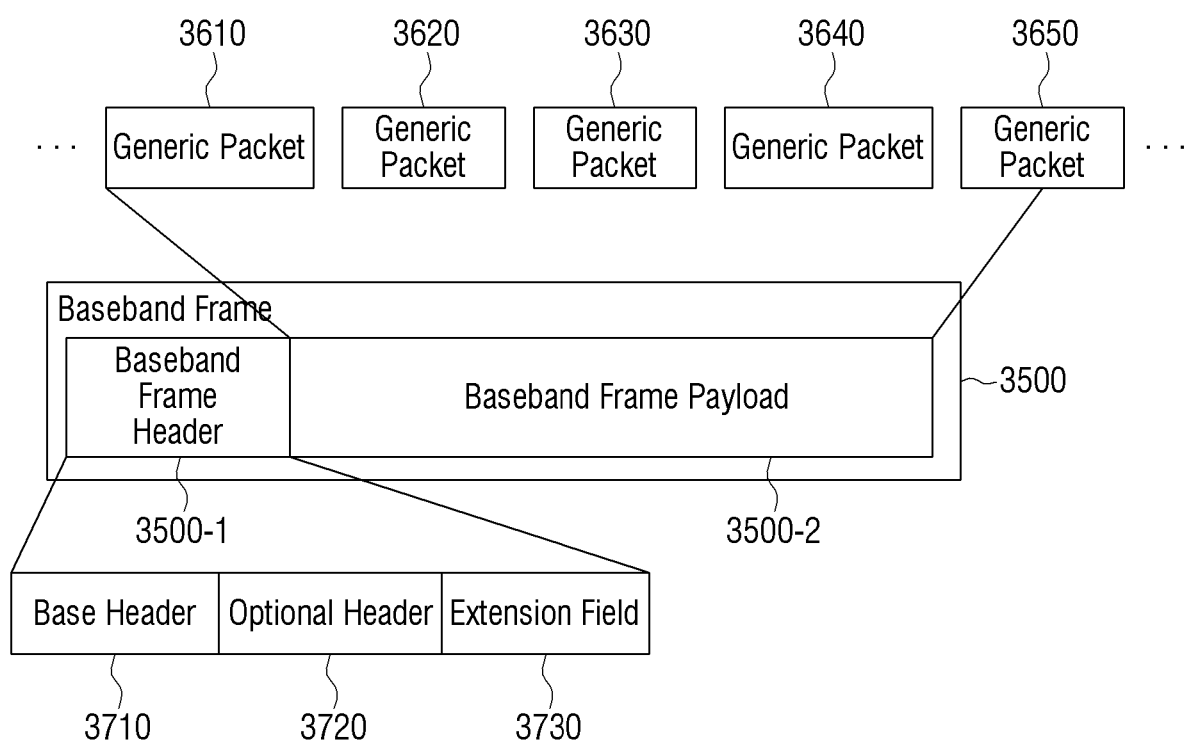

A baseband frame 3500, as illustrated in FIG. 3B, consists of a baseband frame header 3500-1 and payload 3500-2 consisting of generic packets. Baseband frames have fixed length $K_{payload}$. Generic packets 3610-3650 shall be mapped to baseband frames 3500 in order. If generic packets 3610-3650 do not completely fit within a baseband frame, packets are split between the current baseband frame and the next baseband frame. Packet splits shall be in byte units only.

The baseband frame header construction block 3200, 3200-1, . . . 3200-n configures the baseband frame header. The baseband frame header 3500-1, as illustrated in FIG. 3B, is composed of three parts, including the base header 3710, the optional header (or option field 3720) and the extension field 3730. Here, the base header 3710 appears in every baseband frame, and the optional header 3720 and the extension field 3730 may not be present in every time.

The main feature of the base header 3710 is to provide a pointer including an offset value in bytes as an initiation of the next generic packet within the baseband frame. When the generic packet initiates the baseband frame, the pointer value becomes zero. If there is no generic packet which is initiated within the baseband frame, the pointer value is 8191, and a 2-byte base header may be used.

The extension field (or extension header) 3730 may be used later, for example, for the baseband frame packet counter, baseband frame time stamping, and additional signaling, etc.

The baseband frame scrambling block 3300, 3300-1, . . . 3300-n scrambles the baseband frame.

In order to ensure that the payload data when mapped to constellations does not always map to the same point, such as when the payload mapped to constellations consists of a repetitive sequence, the payload data shall always be scrambled before forward error correction encoding.

The scrambling sequences shall be generated by a 16-bit shift register that has 9 feedback taps. Eight of the shift register outputs are selected as a fixed randomizing byte, where each bit from this byte is used to individually XOR the corresponding input data. The data bits are XORed MSB to MSB and so on until LSB to LSB. The generator polynomial is $G(x)=1+X+X^3+X^6+X^7+X^{11}+X^{12}+X^{13}+X^{16}$.

Figure 4:
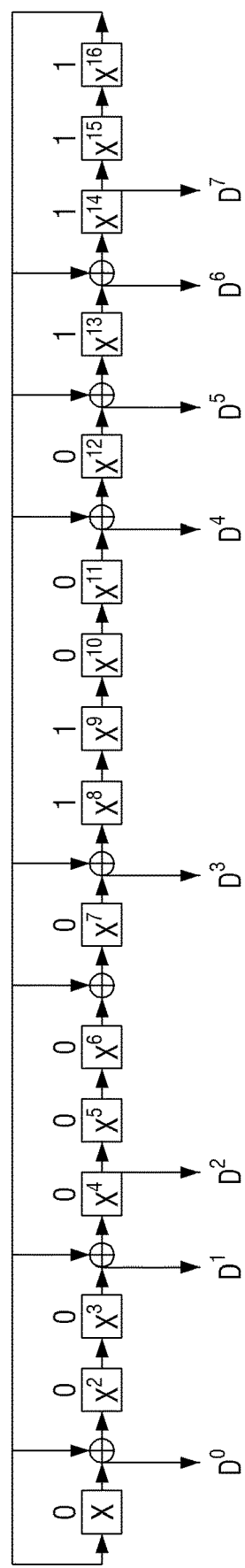

FIG. 4 illustrates a shift register of a PRBS encoder for scrambling a baseband according to an exemplary embodiment, wherein loading of the sequence into the PRBS register, as illustrated in FIG. 4 and shall be initiated at the start of every baseband frame.

Figure 5:
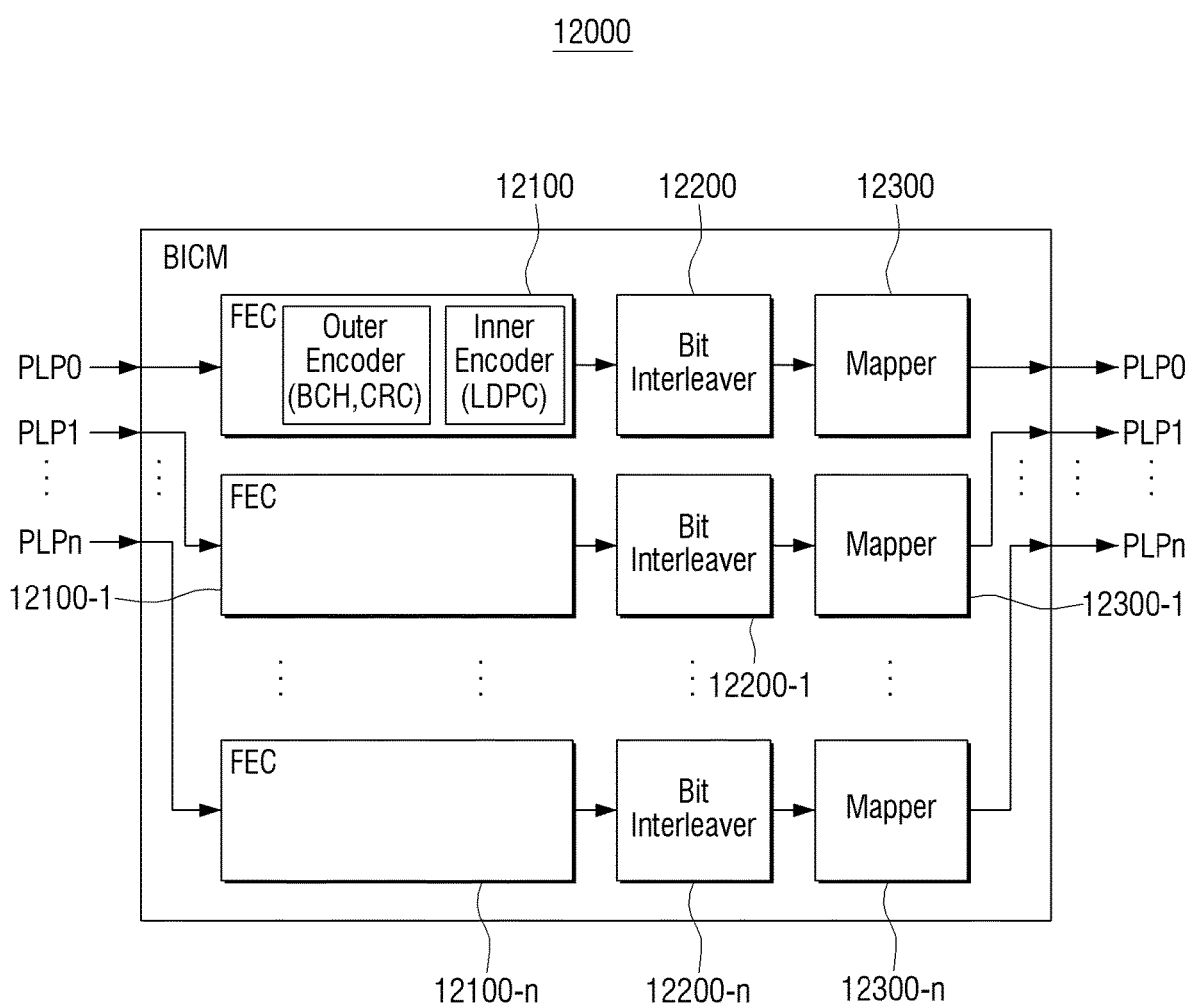

FIG. 5 is a block diagram provided to explain detailed configuration of the BICM block illustrated in FIG. 1A.

As illustrated in FIG. 5, the BICM block includes the FEC block 14100, 14100-1, . . . , 14100-n, Bit Interleaver block 14200, 14200-1, . . . , 14200-n and Mapper blocks 14300, 14300-1, . . . , 14300-n.

Figure 6A:
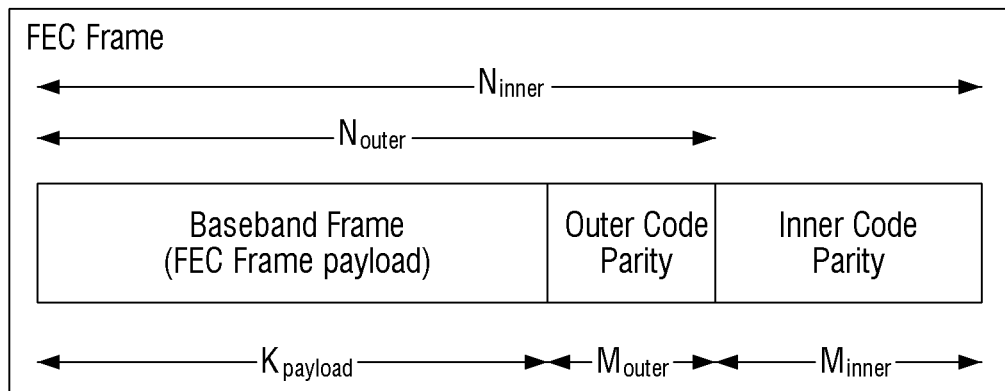

The input to the FEC block 1400, 14100-1, . . . , 14100-n is a Baseband frame, of length $K_{payload}$, and the output from the FEC block is a FEC frame. The FEC block 14100, 14100-1, . . . , 14100-n is implemented by concatenation of an outer code and an innter code with the information part. The FEC frame has length $N_{inner}$. There are two different lengths of LDPC code defined: $N_{inner}$=64800 bits and $N_{inner}$=16200 bits The outer code is realized as one of either Bose, Ray-Chaudhuri and Hocquenghem (BCH) outer code, a Cyclic Redundancy Check (CRC) or other code. The inner code is realized as a Low Density Parity Check (LDPC) code. Both BCH and LDPC FEC codes are systematic codes where the information part I contained within the codeword. The resulting codeword is thus a concatenation of information or payload part, BCH or CRC parities and LDPC parities, as shown in FIG. 6A.

The use of LDPC code is mandatory and is used to provide the redundancy needed for the code detection. There are two different LDPC structures that are defined, these are called Type A and Type B. Type A has a code structure that shows better performance at low code rates while Type B code structure shows better performance at high code rates. In general $N_{inner}$=64800 bit codes are expected to be employed. However, for applications where latency is critical, or a simpler encoder/decoder structure is preferred, $N_{inner}$=16200 bit codes may also be used.

Figure 6B:
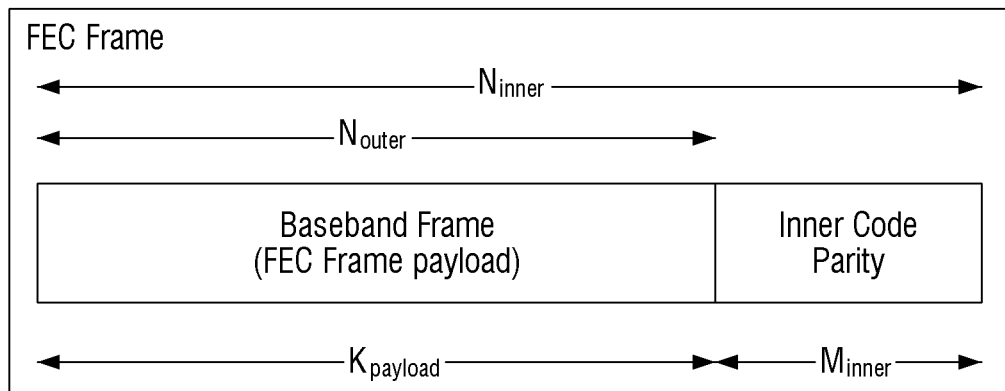

The outer code and CRC consist of adding $M_{outer}$ bits to the input baseband frame. The outer BCH code is used to lower the inherent LDPC error floor by correcting a pre-defined number of bit errors. When using BCH codes the length of $M_{outer}$ is 192 bits ($N_{inner}$–64800 bit codes) and 168 bits (for $N_{inner}$=16200 bit codes). When using CR C the length of $M_{outer}$ is 32 bits. When neither BCH nor CRC are used the length of $M_{outer}$ is zero. The outer code may be omitted if it is determined that the error correcting capability of the inner code is sufficient for the application. When there is no outer code the structure of the FEC frame is as shown in FIG. 6B.

Figure 7:
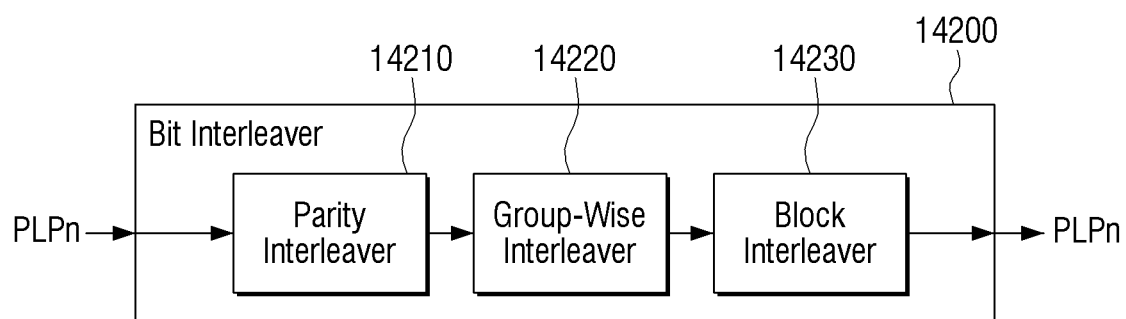

FIG. 7 is a block diagram provided to explain detailed configuration of the Bit Interleaver block illustrated in FIG. 5.

The LDPC codeword of the LDPC encoder, i.e., a FEC Frame, shall be bit interleaved by a Bit Interleaver block 14200. The Bit Interleaver block 14200 includes a parity interleaver 14210, a group-wise interleaver 14220 and a block interleaver 14230. Here, the parity interleaver is not used for Type A and is only used for Type B codes.

The parity interleaver 14210 converts the staircase structure of the parity-part of the LDPC parity-check matrix into a quasi-cyclic structure similar to the information-part of the matrix.

Meanwhile, the parity interleaved LDPC coded bits are split into $N_{group}=N_{inner}/360$ bit groups, and the group-wise interleaver 14220 rearranges the bit groups.

The block interleaver 14230 block interleaves the group-wise interleaved LDPC codeword.

Specifically, the block interleaver 14230 divides a plurality of columns into part 1 and part 2 based on the number of columns of the block interleaver 14230 and the number of bits of the bit groups. In addition, the block interleaver 14230 writes the bits into each column configuring part 1 column wise, and subsequently writes the bits into each column configuring part 2 column wise, and then reads out row wise the bits written in each column.

In this case, the bits constituting the bit groups in the part 1 may be written into the same column, and the bits constituting the bit groups in the part 2 may be written into at least two columns.

Back to FIG. 5, the Mapper block 14300, 14300-1, . . . , 14300-n maps FEC encoded and bit interleaved bits to complex valued quadrature amplitude modulation (QAM) constellation points. For the highest robustness level, quaternary phase shift keying (QPSK) is used. For higher order constellations (16-QAM up to 4096-QAM), non-uniform constellations are defined and the constellations are customized for each code rate.

Each FEC frame shall be mapped to a FEC block by first de-multiplexing the input bits into parallel data cell words and then mapping these cell words into constellation values.

Figure 8:
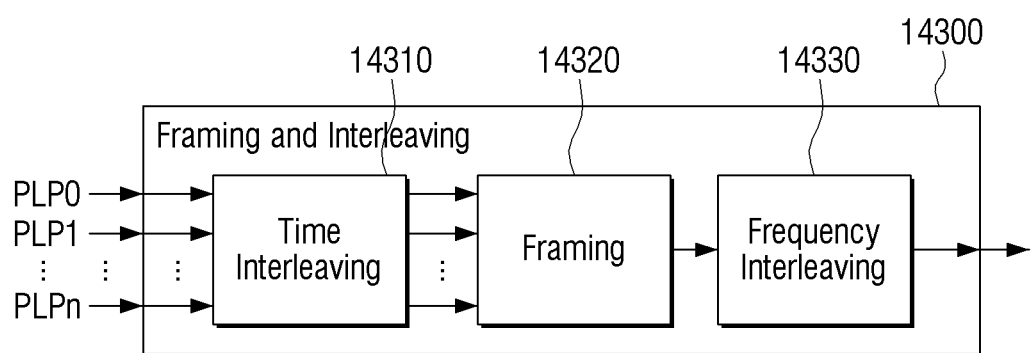

FIG. 8 is a block diagram provided to explain detailed configuration of a Framing/Interleaving block illustrated in FIG. 1A.

As illustrated in FIG. 8, the Framing/Interleaving block 14300 includes a time interleaving block 14310, a framing block 14320 and a frequency interleaving block 14330.

The input to the time interleaving block 14310 and the framing block 14320 may consist of M-PLPs however the output of the framing block 14320 is OFDM symbols, which are arranged in frames. The frequency interleaver included in the frequency interleaving block 14330 operates an OFDM symbols.

The time interleaver (TI) configuration included in the time interleaving block 14310 depends on the number of PLPs used. When there is only a single PLP or when LDM is used, a sheer convolutional interleaver is used, while for multiple PLP a hybrid interleaver consisting of a cell interleaver, a block interleaver and a convolutional interleaver is used. The input to the time interleaving block 14310 is a stream of cells output from the mapper block (FIG. 5, 14300, 14300-1, . . . , 14300-n), and the output of the time interleaving block 14310 is also a stream of time-interleaved cells.

Figure 9A:
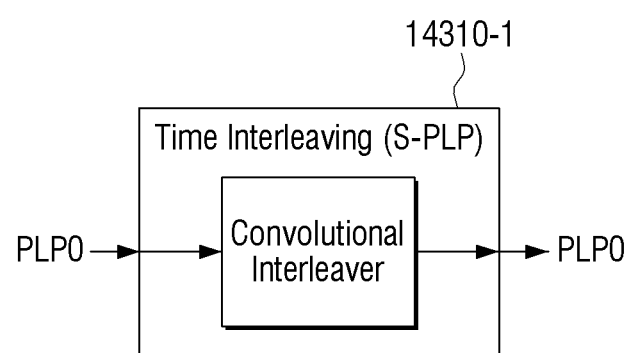

FIG. 9A illustrates the time interleaving block for a single PLP (S-PLP), and it consists of a convolutional interleaver only.

Figure 9B:
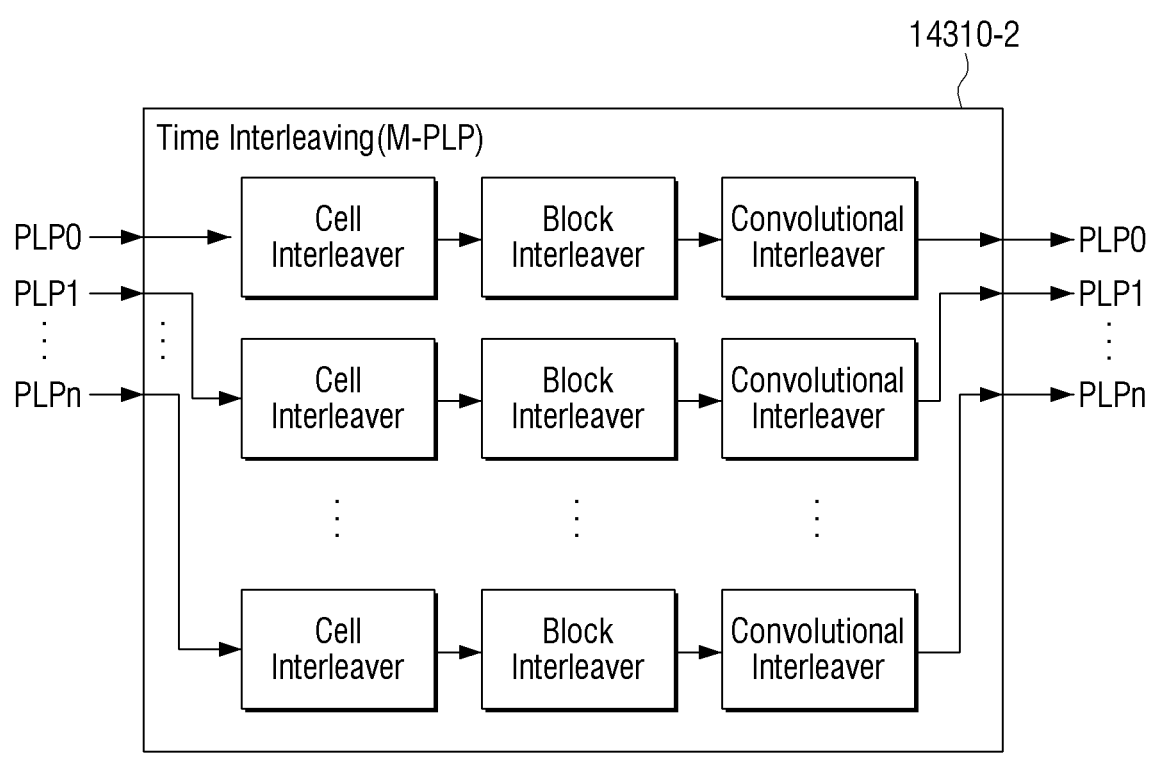

FIG. 9B illustrates the time interleaving block for a plurality of PLPs (M-PLP), and it can be divided in several sub-blocks as illustrated.

The framing block 14320 maps the interleaved frames onto at least one transmitter frame. The framing block 14320, specifically, receives inputs (e.g. data cell) from at least one physical layer pipes and outputs symbols.

In addition, the framing block 14320 creates at least one special symbol known as preamble symbols. These symbols undergo the same processing in the waveform block mentioned later.

Figure 10:
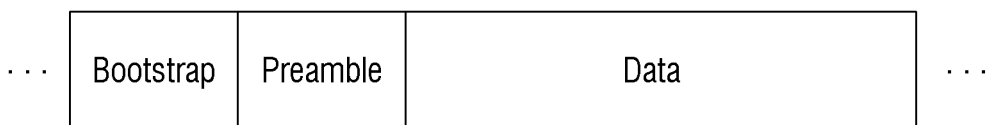

FIG. 10 is a view illustrating an example of a transmission frame according to an exemplary embodiment.

As illustrated in FIG. 10, the transmission frame consists of three parts, the bootstrap, preamble and data payload. Each of the three parts consists of at least one symbol.

Meanwhile, the purpose of the frequency interleaving block 14330 is to ensure that sustained interference in one part of the spectrum will not degrade the performance of a particular PLP disproportionately compared to other PLPs. The frequency interleaver 14330, operating on the all the data cells of one OFDM symbol, maps the data cells from the framing block 14320 onto the N data carriers.

Figure 11:
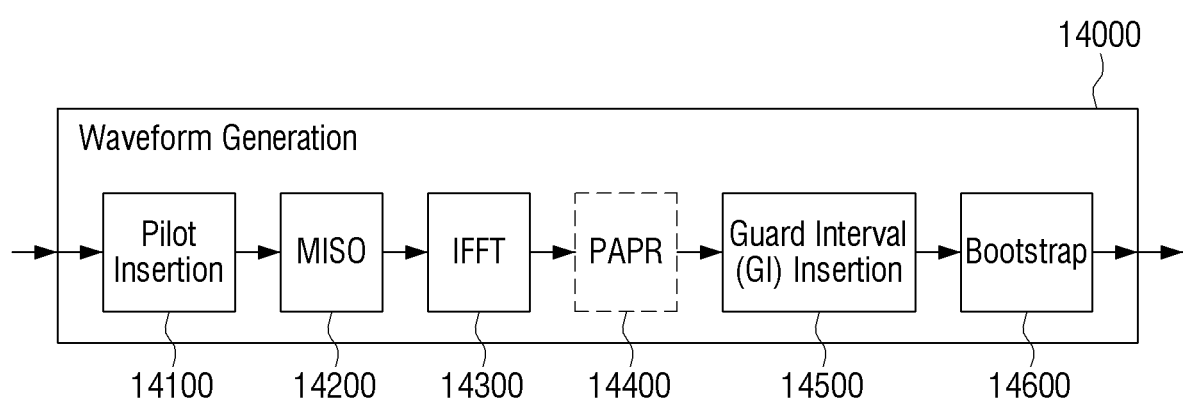

FIG. 11 is a block diagram provided to explain detailed configuration of a Waveform Generation block illustrated in FIG. 1A.

As illustrated in FIG. 11, the Waveform Generation block 14000 includes a pilot inserting block 14100, a MISO block 14200, an IFFT block 14300, a PAPR block 14400, a GI inserting block 14500 and a bootstrap block 14600.

The pilot inserting block 14100 inserts a pilot to various cells within the OFDM frame.

Various cells within the OFDM frame are modulated with reference information whose transmitted value is known to the receiver.

Cells containing the reference information are transmitted at a boosted power level. The cells are called scattered, continual, edge, preamble or frame-closing pilot cells. The value of the pilot information is derived from a reference sequence, which is a series of values, one for each transmitted carrier on any given symbol.

The pilots can be used for frame synchronization, frequency synchronization, time synchronization, channel estimation, transmission mode identification and can also be used to follow the phase noise.

The pilots are modulated according to reference information, and the reference sequence is applied to all the pilots (e.g. scattered, continual edge, preamble and frame closing pilots) in every symbol including preamble and the frame-closing symbol of the frame.

The reference information, taken from the reference sequence, is transmitted in scattered pilot cells in every symbol except the preamble and the frame-closing symbol of the frame.

In addition to the scattered pilots described above, a number of continual pilots are inserted in every symbol of the frame except for Preamble and the frame-closing symbol. The number and location of continual pilots depends on both the FFT size and scattered pilot pattern in use.

The MISO block 14200 applies a MISO processing.

The Transmit Diversity Code Filter Set is a MISO pre-distortion technique that artificially decorrelates signals from multiple transmitters in a Single Frequency Network in order to minimize potential destructive interference. Linear frequency domain filters are used so that the compensation in the receiver can be implemented as part of the equalizer process. The filter design is based on creating all-pass filters with minimized cross-correlation over all filter pairs under the constraints of the number of transmitters M∈{2,3,4} and the time domain span of the filters N∈{64,256}. The longer time domain span filters will increase the decorrelation level, but the effective guard interval length will be decreased by the filter time domain span and this should be taken into consideration when choosing a filter set for a particular network topology.

The IFFT block 14300 specifies the OFDM structure to use for each transmission mode. The transmitted signal is organized in frames. Each frame has a duration of $T_F$, and consists of $L_F$ OFDM symbols. N frames constitute one super-frame. Each symbol is constituted by a set of $K_{total}$ carriers transmitted with a duration $T_S$. Each symbol is composed of a useful part with duration $T_U$ and a guard interval with a duration Δ. The guard interval consists of a cyclic continuation of the useful part, $T_U$, and is inserted before it.

The PAPR block 14400 applies the Peak to Average Power Reduction technique.

The GI inserting block 14500 inserts the guard interval into each frame.

The bootstrap block 14600 prefixes the bootstrap signal to the front of each frame.

Figure 12:
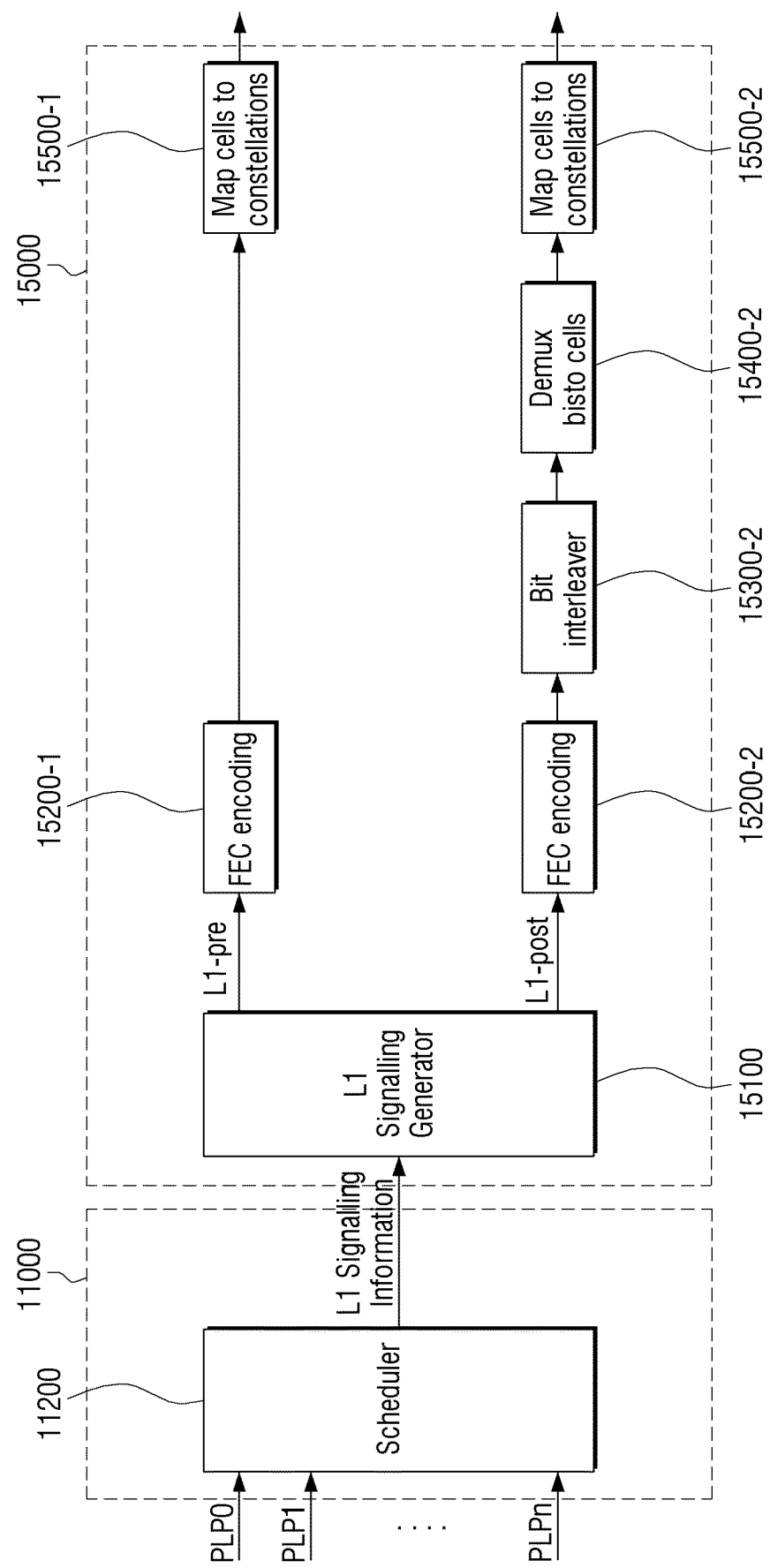

FIG. 12 is a block diagram provided to explain a configuration of signaling information according to an exemplary embodiment.

The input processing block 11000 includes a scheduler 11200. The BICM block 15000 includes an L1 signaling generator 15100, an FEC encoder 15200-1 and 15200-2, a bit interleaver 15300-2, a demux 15400-2, constellation mappers 15500-1 and 15500-2. The L1 signaling generator 15100 may be included in the input processing block 11000, according to an exemplary embodiment.

An n number of service data are mapped to a PLP0 to a PLPn respectively. The scheduler 11200 determines a position, modulation and coding rate for each PLP in order to map a plurality of PLPs to a physical layer of T2. In other words, the scheduler 11200 generates L1 signaling information. The scheduler 11200 may output dynamic field information among L1 post signaling information of a current frame, using the raming/Interleaving block 13000 (FIG. 1) which may be referred to as a frame builder. Further, the scheduler 11200 may transmit the L1 signaling information to the BICM block 15000. The L1 signaling information includes L1 pre signaling information and L1 post signaling information.

The L1 signaling generator 15100 may differentiate the L1 pre signaling information from the L1 post signaling information to output them. The FEC encoders 15200-1 and 15200-2 perform respective encoding operations which include shortening and puncturing for the L1 pre signaling information and the L1 post signaling information. The bit interleaver 15300-2 performs interleaving by bit for the encoded L1 post signaling information. The demux 15400-2 controls robustness of bits by modifying an order of bits constituting cells and outputs the cells which include bits. Two constellation mappers 15500-1 and 15500-2 map the L1 pre signaling information and the L1 post signaling information to constellations, respectively. The L1 pre signaling information and the L1 post signaling information processed through the above described processes are output to be included in each frame by the Framing/Interleaving block 13000 (FIG. 1).

Figure 13:
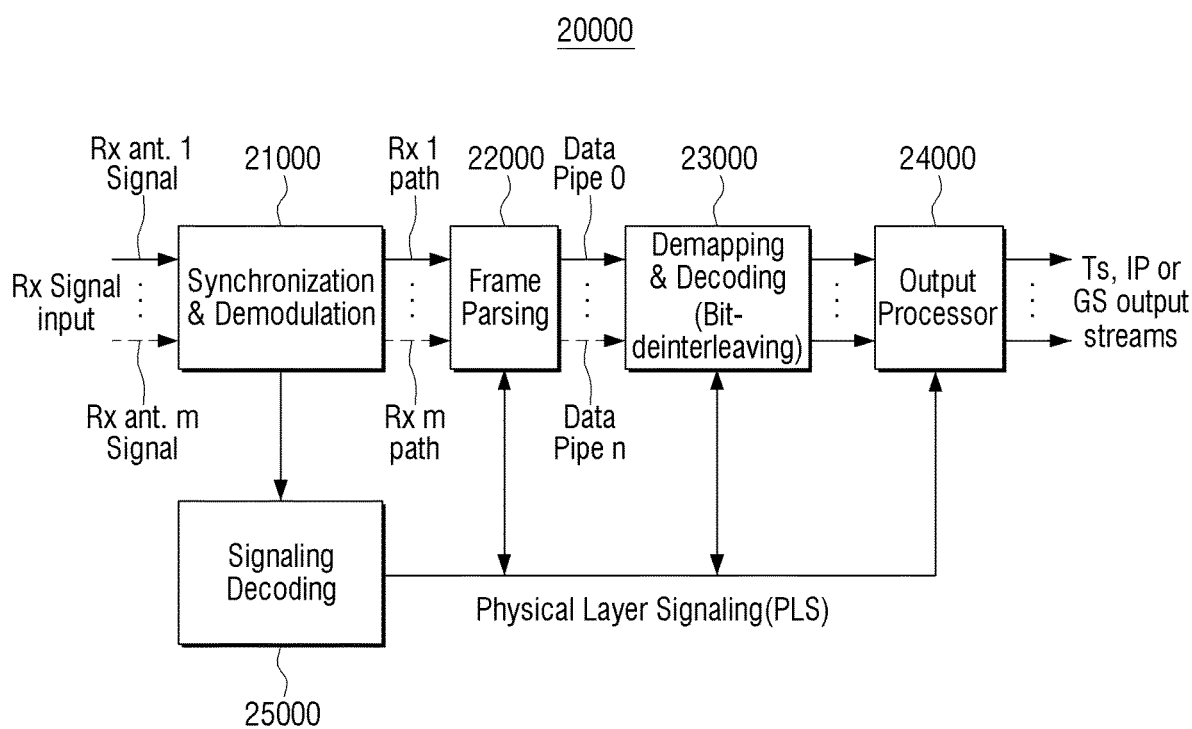
FIGS. 13 to 18 are views to illustrate a receiving apparatus according to exemplary embodiments.

FIG. 13 illustrates a structure of an receiving apparatus according to an embodiment of the present invention.

The apparatus 20000 for receiving broadcast signals according to an embodiment of the present invention can correspond to the apparatus 10000 for transmitting broadcast signals, described with reference to FIG. 1. The apparatus 20000 for receiving broadcast signals according to an embodiment of the present invention can include a synchronization & demodulation module 21000, a frame parsing module 22000, a demapping & decoding module 23000, an output processor 24000 and a signaling decoding module 25000. A description will be given of operation of each module of the apparatus 20000 for receiving broadcast signals.

The synchronization & demodulation module 21000 can receive input signals through m Rx antennas, perform signal detection and synchronization with respect to a system corresponding to the apparatus 20000 for receiving broadcast signals and carry out demodulation corresponding to a reverse procedure of the procedure performed by the apparatus 10000 for transmitting broadcast signals.

The frame parsing module 22000 can parse input signal frames and extract data through which a service selected by a user is transmitted. If the apparatus 10000 for transmitting broadcast signals performs interleaving, the frame parsing module 22000 can carry out deinterleaving corresponding to a reverse procedure of interleaving. In this case, the positions of a signal and data that need to be extracted can be obtained by decoding data output from the signaling decoding module 25200 to restore scheduling information generated by the apparatus 10000 for transmitting broadcast signals.

The demapping & decoding module 23000 can convert the input signals into bit domain data and then deinterleave the same as necessary. The demapping & decoding module 23000 can perform demapping for mapping applied for transmission efficiency and correct an error generated on a transmission channel through decoding. In this case, the demapping & decoding module 23000 can obtain transmission parameters necessary for demapping and decoding by decoding the data output from the signaling decoding module 25000.

The output processor 24000 can perform reverse procedures of various compression/signal processing procedures which are applied by the apparatus 10000 for transmitting broadcast signals to improve transmission efficiency. In this case, the output processor 24000 can acquire necessary control information from data output from the signaling decoding module 25000. The output of the output processor 24000 corresponds to a signal input to the apparatus 10000 for transmitting broadcast signals and may be MPEG-TSs, IP streams (v4 or v6) and generic streams.

The signaling decoding module 25000 can obtain PLS information from the signal demodulated by the synchronization & demodulation module 21000. As described above, the frame parsing module 22000, demapping & decoding module 23000 and output processor 24000 can execute functions thereof using the data output from the signaling decoding module 25000.

Figure 14:
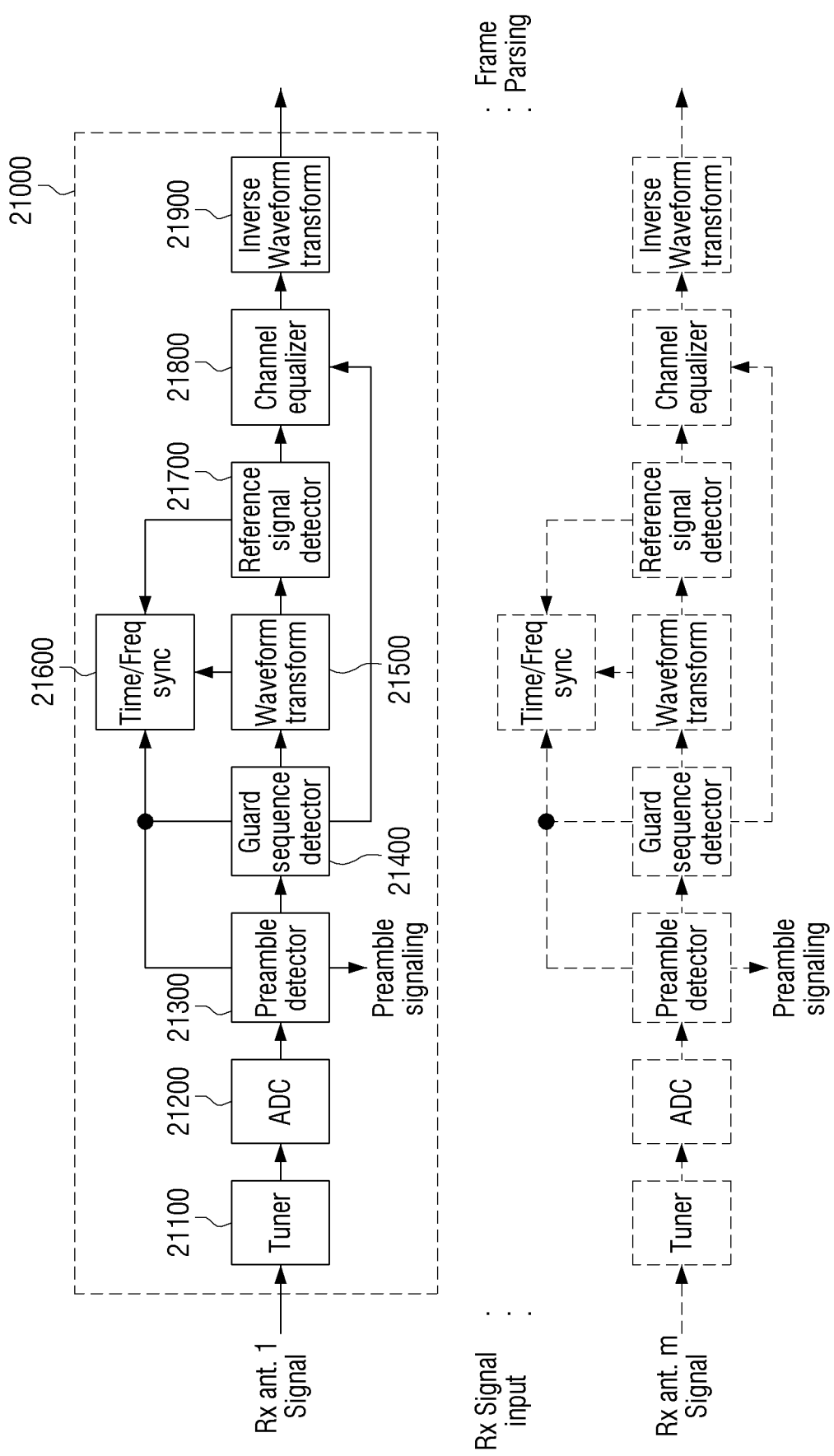

FIG. 14 illustrates a synchronization & demodulation module according to an embodiment of the present invention.

As shown in FIG. 14, the synchronization & demodulation module 21000 according to an embodiment of the present invention corresponds to a synchronization & demodulation module of an apparatus 20000 for receiving broadcast signals using m Rx antennas and can include m processing blocks for demodulating signals respectively input through m paths. The m processing blocks can perform the same processing procedure. A description will be given of operation of the first processing block 21000 from among the m processing blocks.

The first processing block 21000 can include a tuner 21100, an ADC block 21200, a preamble detector 21300, a guard sequence detector 21400, a waveform transform block 21500, a time/frequency synchronization block 21600, a reference signal detector 21700, a channel equalizer 21800 and an inverse waveform transform block 21900.

The tuner 21100 can select a desired frequency band, compensate for the magnitude of a received signal and output the compensated signal to the ADC block 21200.

The ADC block 21200 can convert the signal output from the tuner 21100 into a digital signal.

The preamble detector 21300 can detect a preamble (or preamble signal or preamble symbol) in order to check whether or not the digital signal is a signal of the system corresponding to the apparatus 20000 for receiving broadcast signals. In this case, the preamble detector 21300 can decode basic transmission parameters received through the preamble.

The guard sequence detector 21400 can detect a guard sequence in the digital signal. The time/frequency synchronization block 21600 can perform time/frequency synchronization using the detected guard sequence and the channel equalizer 21800 can estimate a channel through a received/restored sequence using the detected guard sequence.

The waveform transform block 21500 can perform a reverse operation of inverse waveform transform when the apparatus 10000 for transmitting broadcast signals has performed inverse waveform transform. When the broadcast transmission/reception system according to one embodiment of the present invention is a multi-carrier system, the waveform transform block 21500 can perform FFT. Furthermore, when the broadcast transmission/reception system according to an embodiment of the present invention is a single carrier system, the waveform transform block 21500 may not be used if a received time domain signal is processed in the frequency domain or processed in the time domain.

The time/frequency synchronization block 21600 can receive output data of the preamble detector 21300, guard sequence detector 21400 and reference signal detector 21700 and perform time synchronization and carrier frequency synchronization including guard sequence detection and block window positioning on a detected signal. Here, the time/frequency synchronization block 21600 can feed back the output signal of the waveform transform block 21500 for frequency synchronization.

The reference signal detector 21700 can detect a received reference signal. Accordingly, the apparatus 20000 for receiving broadcast signals according to an embodiment of the present invention can perform synchronization or channel estimation.

The channel equalizer 21800 can estimate a transmission channel from each Tx antenna to each Rx antenna from the guard sequence or reference signal and perform channel equalization for received data using the estimated channel.

The inverse waveform transform block 21900 may restore the original received data domain when the waveform transform block 21500 performs waveform transform for efficient synchronization and channel estimation/equalization. If the broadcast transmission/reception system according to an embodiment of the present invention is a single carrier system, the waveform transform block 21500 can perform FFT in order to carry out synchronization/channel estimation/equalization in the frequency domain and the inverse waveform transform block 21900 can perform IFFT on the channel-equalized signal to restore transmitted data symbols. If the broadcast transmission/reception system according to an embodiment of the present invention is a multi-carrier system, the inverse waveform transform block 21900 may not be used.

The above-described blocks may be omitted or replaced by blocks having similar or identical functions according to design.

Figure 15:
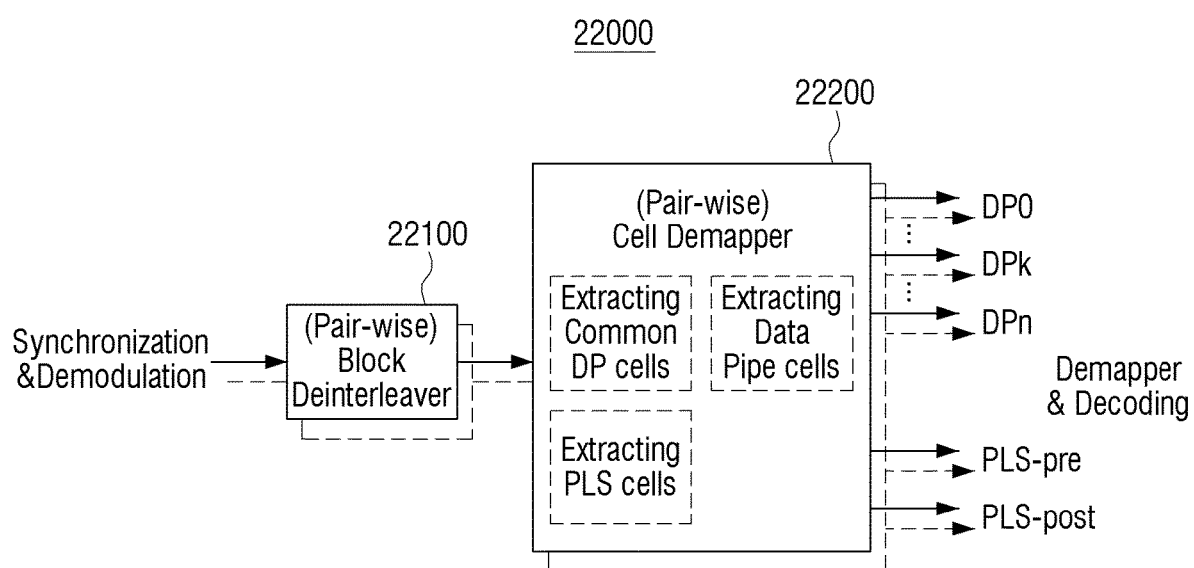

FIG. 15 illustrates a frame parsing module according to an embodiment of the present invention.

As shown in FIG. 15, the frame parsing module 22000 according to an embodiment of the present invention can include at least one block interleaver 22100 and at least one cell demapper 22200.

The block interleaver 22100 can deinterleave data input through data paths of the m Rx antennas and processed by the synchronization & demodulation module 21000 on a signal block basis. In this case, if the apparatus 10000 for transmitting broadcast signals performs pair-wise interleaving, the block interleaver 22100 can process two consecutive pieces of data as a pair for each input path. Accordingly, the block interleaver 22100 can output two consecutive pieces of data even when deinterleaving has been performed. Furthermore, the block interleaver 22100 can perform a reverse operation of the interleaving operation performed by the apparatus 10000 for transmitting broadcast signals to output data in the original order.

The cell demapper 22200 can extract cells corresponding to common data, cells corresponding to data pipes and cells corresponding to PLS data from received signal frames. The cell demapper 22200 can merge data distributed and transmitted and output the same as a stream as necessary. When two consecutive pieces of cell input data are processed as a pair and mapped in the apparatus 10000 for transmitting broadcast signals, the cell demapper 22200 can perform pair-wise cell demapping for processing two consecutive input cells as one unit as a reverse procedure of the mapping operation of the apparatus 10000 for transmitting broadcast signals.

In addition, the cell demapper 22200 can extract PLS signaling data received through the current frame as PLS-pre & PLS-post data and output the PLS-pre & PLS-post data.

The above-described blocks may be omitted or replaced by blocks having similar or identical functions according to design.

Figure 16:
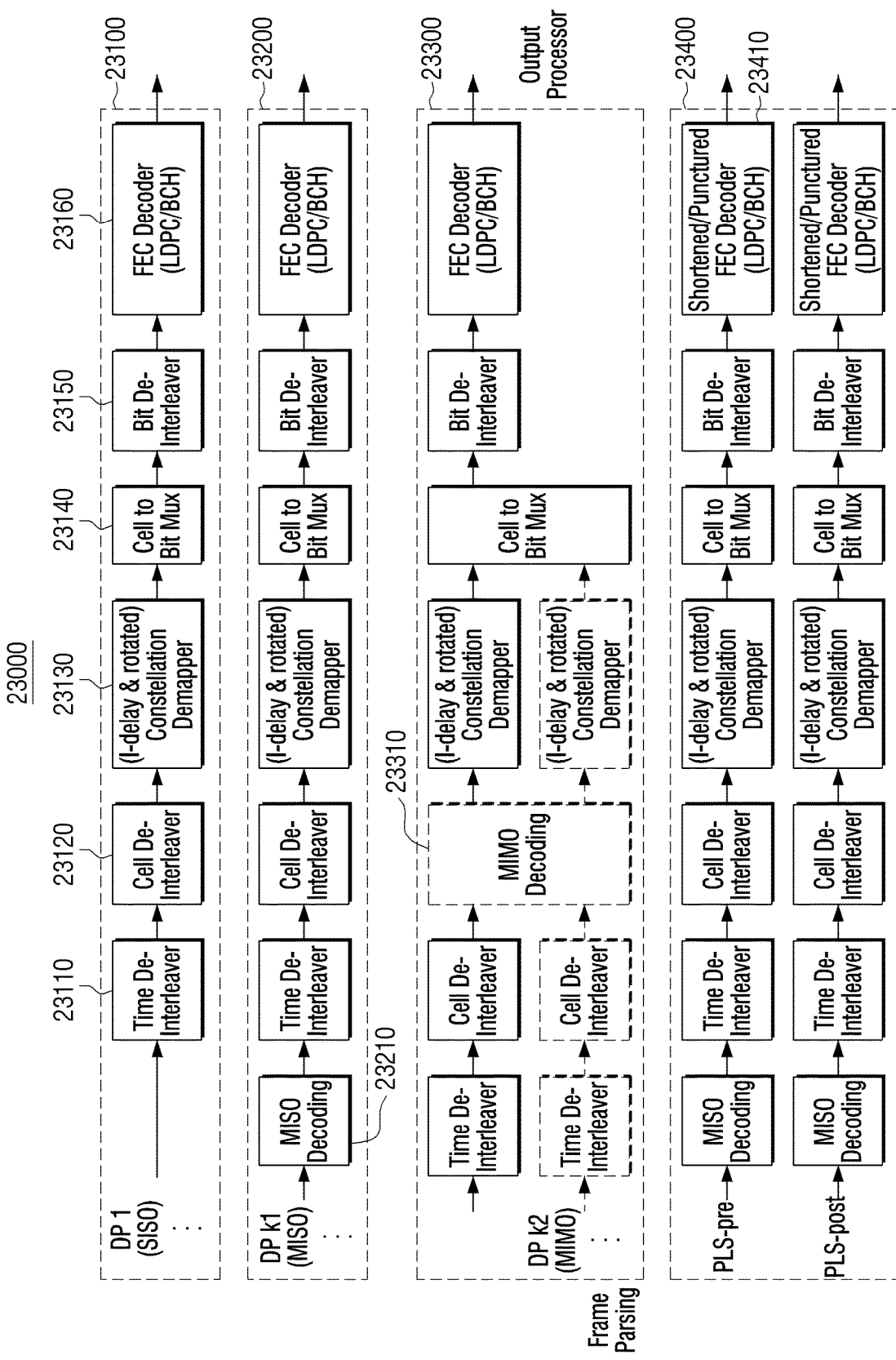

FIG. 16 illustrates a demapping & decoding module according to an embodiment of the present invention.

The demapping & decoding module 23000 shown in FIG. 16 can perform a reverse operation of the operation of the bit interleaved and coded & modulation module illustrated in FIG. 1.

The bit interleaved and coded & modulation module of the apparatus 10000 for transmitting broadcast signals according to an embodiment of the present invention can process input data pipes by independently applying SISO, MISO and MIMO thereto for respective paths, as described above. Accordingly, the demapping & decoding module 23000 illustrated in FIG. 16 can include blocks for processing data output from the frame parsing module according to SISO, MISO and MIMO in response to the apparatus 10000 for transmitting broadcast signals.

As shown in FIG. 16, the demapping & decoding module 23000 according to an embodiment of the present invention can include a first block 23100 for SISO, a second block 23200 for MISO, a third block 23300 for MIMO and a fourth block 23400 for processing the PLS-pre/PLS-post information. The demapping & decoding module 23000 shown in FIG. 16 is exemplary and may include only the first block 23100 and the fourth block 23400, only the second block 23200 and the fourth block 23400 or only the third block 23300 and the fourth block 23400 according to design. That is, the demapping & decoding module 23000 can include blocks for processing data pipes equally or differently according to design.

A description will be given of each block of the demapping & decoding module 23000.

The first block 23100 processes an input data pipe according to SISO and can include a time deinterleaver block 23110, a cell deinterleaver block 23120, a constellation demapper block 23130, a cell-to-bit mux block 23140, a bit deinterleaver block 23150 and an FEC decoder block 23160.

The time deinterleaver block 23110 can perform a reverse process of the process performed by the time interleaving block 14310 illustrated in FIG. 8. That is, the time deinterleaver block 23110 can deinterleave input symbols interleaved in the time domain into original positions thereof.

The cell deinterleaver block 23120 can perform a reverse process of the process performed by the cell interleaver block illustrated in FIG. 9a. That is, the cell deinterleaver block 23120 can deinterleave positions of cells spread in one FEC block into original positions thereof. The cell deinterleaver block 23120 may be omitted.

The constellation demapper block 23130 can perform a reverse process of the process performed by the mapper 12300 illustrated in FIG. 5. That is, the constellation demapper block 23130 can demap a symbol domain input signal to bit domain data. In addition, the constellation demapper block 23130 may perform hard decision and output decided bit data. Furthermore, the constellation demapper block 23130 may output a log-likelihood ratio (LLR) of each bit, which corresponds to a soft decision value or probability value. If the apparatus 10000 for transmitting broadcast signals applies a rotated constellation in order to obtain additional diversity gain, the constellation demapper block 23130 can perform 2-dimensional LLR demapping corresponding to the rotated constellation. Here, the constellation demapper block 23130 can calculate the LLR such that a delay applied by the apparatus 10000 for transmitting broadcast signals to the I or Q component can be compensated.

The cell-to-bit mux block 23140 can perform a reverse process of the process performed by the mapper 12300 illustrated in FIG. 5. That is, the cell-to-bit mux block 23140 can restore bit data mapped to the original bit streams.

The bit deinterleaver block 23150 can perform a reverse process of the process performed by the bit interleaver 12200 illustrated in FIG. 5. That is, the bit deinterleaver block 23150 can deinterleave the bit streams output from the cell-to-bit mux block 23140 in the original order.

The FEC decoder block 23460 can perform a reverse process of the process performed by the FEC encoder 12100 illustrated in FIG. 5. That is, the FEC decoder block 23460 can correct an error generated on a transmission channel by performing LDPC decoding and BCH decoding.

The second block 23200 processes an input data pipe according to MISO and can include the time deinterleaver block, cell deinterleaver block, constellation demapper block, cell-to-bit mux block, bit deinterleaver block and FEC decoder block in the same manner as the first block 23100, as shown in FIG. 16. However, the second block 23200 is distinguished from the first block 23100 in that the second block 23200 further includes a MISO decoding block 23210. The second block 23200 performs the same procedure including time deinterleaving operation to outputting operation as the first block 23100 and thus description of the corresponding blocks is omitted.

The MISO decoding block 11110 can perform a reverse operation of the operation of the MISO processing in the apparatus 10000 for transmitting broadcast signals. If the broadcast transmission/reception system according to an embodiment of the present invention uses STBC, the MISO decoding block 11110 can perform Alamouti decoding.

The third block 23300 processes an input data pipe according to MIMO and can include the time deinterleaver block, cell deinterleaver block, constellation demapper block, cell-to-bit mux block, bit deinterleaver block and FEC decoder block in the same manner as the second block 23200, as shown in FIG. 16. However, the third block 23300 is distinguished from the second block 23200 in that the third block 23300 further includes a MIMO decoding block 23310. The basic roles of the time deinterleaver block, cell deinterleaver block, constellation demapper block, cell-to-bit mux block and bit deinterleaver block included in the third block 23300 are identical to those of the corresponding blocks included in the first and second blocks 23100 and 23200 although functions thereof may be different from the first and second blocks 23100 and 23200.

The MIMO decoding block 23310 can receive output data of the cell deinterleaver for input signals of the m Rx antennas and perform MIMO decoding as a reverse operation of the operation of the MIMO processing in the apparatus 10000 for transmitting broadcast signals. The MIMO decoding block 23310 can perform maximum likelihood decoding to obtain optimal decoding performance or carry out sphere decoding with reduced complexity. Otherwise, the MIMO decoding block 23310 can achieve improved decoding performance by performing MMSE detection or carrying out iterative decoding with MMSE detection.

The fourth block 23400 processes the PLS-pre/PLS-post information and can perform SISO or MISO decoding.

The basic roles of the time deinterleaver block, cell deinterleaver block, constellation demapper block, cell-to-bit mux block and bit deinterleaver block included in the fourth block 23400 are identical to those of the corresponding blocks of the first, second and third blocks 23100, 23200 and 23300 although functions thereof may be different from the first, second and third blocks 23100, 23200 and 23300.

The shortened/punctured FEC decoder 23410 can perform de-shortening and de-puncturing on data shortened/punctured according to PLS data length and then carry out FEC decoding thereon. In this case, the FEC decoder used for data pipes can also be used for PLS. Accordingly, additional FEC decoder hardware for the PLS only is not needed and thus system design is simplified and efficient coding is achieved.

The above-described blocks may be omitted or replaced by blocks having similar or identical functions according to design.

The demapping & decoding module according to an embodiment of the present invention can output data pipes and PLS information processed for the respective paths to the output processor, as illustrated in FIG. 16.

Figure 17:
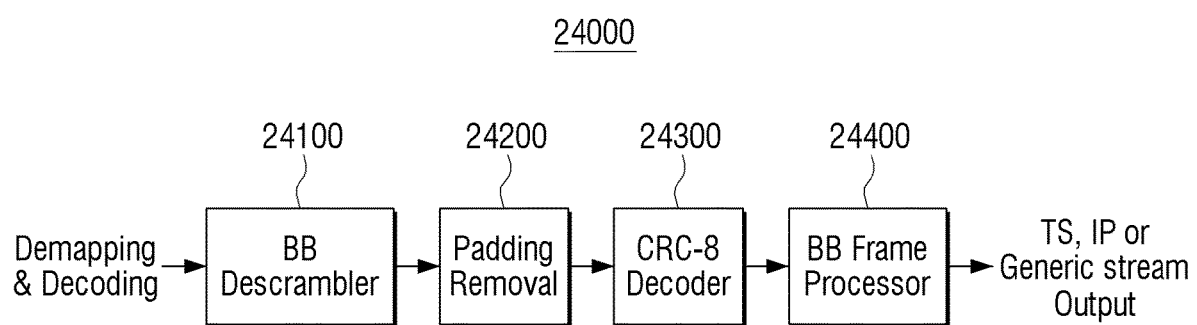
Figure 18:
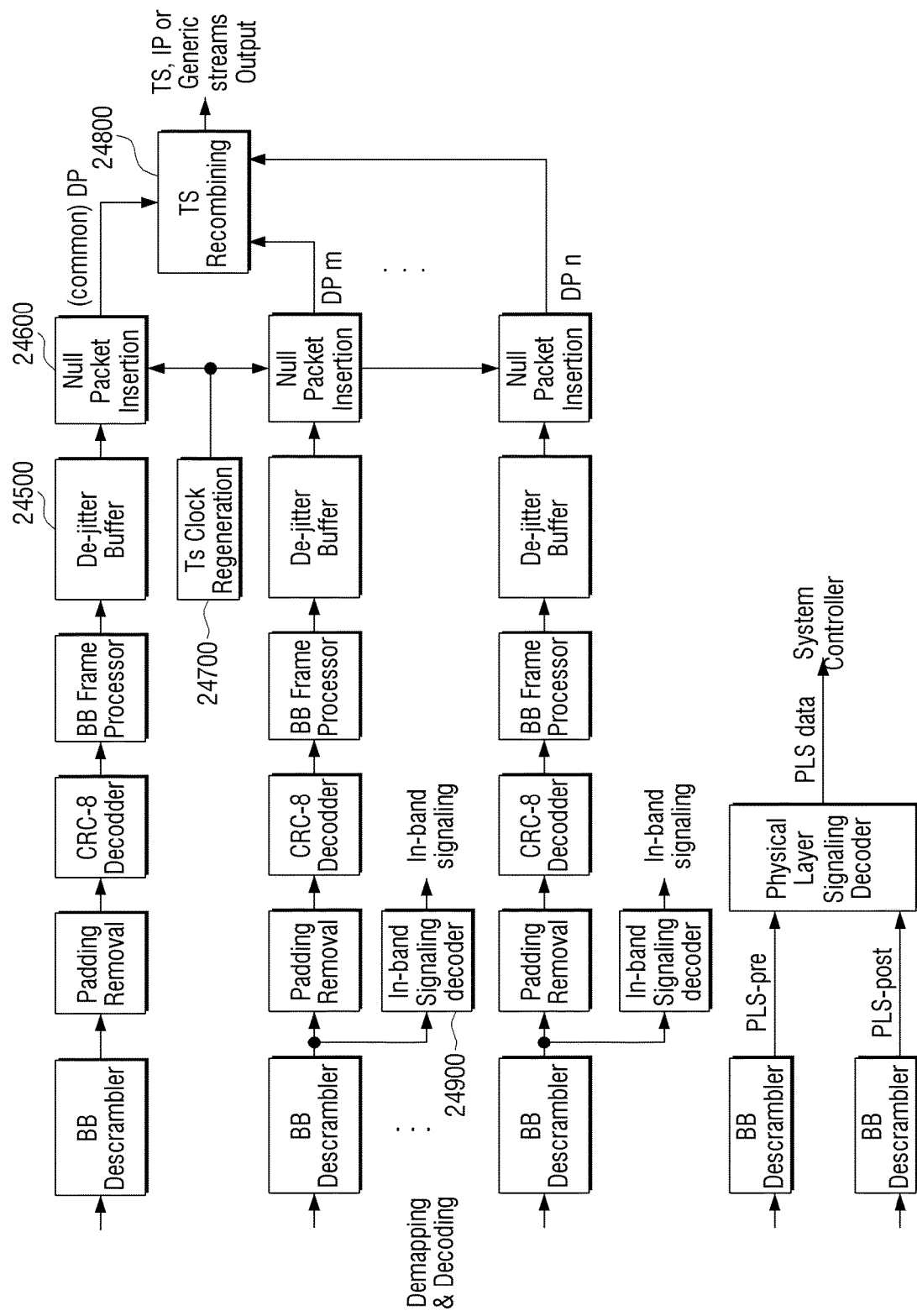

FIGS. 17 and 18 illustrate output processors according to embodiments of the present invention.

FIG. 17 illustrates an output processor 24000 according to an embodiment of the present invention. The output processor 24000 illustrated in FIG. 17 receives a single data pipe output from the demapping & decoding module and outputs a single output stream.

The output processor 24000 shown in FIG. 17 can include a BB scrambler block 24100, a padding removal block 24200, a CRC-8 decoder block 24300 and a BB frame processor block 24400.

The BB scrambler block 24100 can descramble an input bit stream by generating the same PRBS as that used in the apparatus for transmitting broadcast signals for the input bit stream and carrying out an XOR operation on the PRBS and the bit stream.

The padding removal block 24200 can remove padding bits inserted by the apparatus for transmitting broadcast signals as necessary.

The CRC-8 decoder block 24300 can check a block error by performing CRC decoding on the bit stream received from the padding removal block 24200.

The BB frame processor block 24400 can decode information transmitted through a BB frame header and restore MPEG-TSs, IP streams (v4 or v6) or generic streams using the decoded information.

The above-described blocks may be omitted or replaced by blocks having similar or identical functions according to design.

FIG. 18 illustrates an output processor according to another embodiment of the present invention. The output processor 24000 shown in FIG. 18 receives multiple data pipes output from the demapping & decoding module. Decoding multiple data pipes can include a process of merging common data commonly applicable to a plurality of data pipes and data pipes related thereto and decoding the same or a process of simultaneously decoding a plurality of services or service components (including a scalable video service) by the apparatus for receiving broadcast signals.

The output processor 24000 shown in FIG. 18 can include a BB descrambler block, a padding removal block, a CRC-8 decoder block and a BB frame processor block as the output processor illustrated in FIG. 17. The basic roles of these blocks correspond to those of the blocks described with reference to FIG. 17 although operations thereof may differ from those of the blocks illustrated in FIG. 17.

A de-jitter buffer block 24500 included in the output processor shown in FIG. 18 can compensate for a delay, inserted by the apparatus for transmitting broadcast signals for synchronization of multiple data pipes, according to a restored TTO (time to output) parameter.

A null packet insertion block 24600 can restore a null packet removed from a stream with reference to a restored DNP (deleted null packet) and output common data.

A TS clock regeneration block 24700 can restore time synchronization of output packets based on ISCR (input stream time reference) information.

A TS recombining block 24800 can recombine the common data and data pipes related thereto, output from the null packet insertion block 24600, to restore the original MPEG-TSs, IP streams (v4 or v6) or generic streams. The TTO, DNT and ISCR information can be obtained through the BB frame header.

An in-band signaling decoding block 24900 can decode and output in-band physical layer signaling information transmitted through a padding bit field in each FEC frame of a data pipe.

The output processor shown in FIG. 18 can BB-descramble the PLS-pre information and PLS-post information respectively input through a PLS-pre path and a PLS-post path and decode the descrambled data to restore the original PLS data. The restored PLS data is delivered to a system controller included in the apparatus for receiving broadcast signals. The system controller can provide parameters necessary for the synchronization & demodulation module, frame parsing module, demapping & decoding module and output processor module of the apparatus for receiving broadcast signals.

The above-described blocks may be omitted or replaced by blocks having similar r identical functions according to design.

Hereinafter, a method of interleaving of the block interleaver 14230 of FIG. 7 will be described The block interleaver 14230 interleaves the plurality of bit groups the order of which has been rearranged. Specifically, the block interleaver 14230 may interleave the plurality of bit groups the order of which has been rearranged by the group-wise interleaver 14220 in bit group wise (or bits group unit). The block interleaver 14230 is formed of a plurality of columns each including a plurality of rows and may interleave by dividing the plurality of rearranged bit groups based on a modulation order determined according to a modulation method.

In this case, the block interleaver 14230 may interleave the plurality of bit groups the order of which has been rearranged by the group-wise interleaver 14220 in bit group wise. Specifically, the block interleaver 14230 may interleave by dividing the plurality of rearranged bit groups according to a modulation order by using a first part and a second part.

Specifically, the block interleaver 14230 interleaves by dividing each of the plurality of columns into a first part and a second part, writing the plurality of bit groups in the plurality of columns of the first part serially in bit group wise, dividing the bits of the other bit groups into groups (or sub bit groups) each including a predetermined number of bits based on the number of columns, and writing the sub bit groups in the plurality of columns of the second part serially.

Herein, the number of bit groups which are interleaved in bit group wise may be determined by at least one of the number of rows and columns constituting the block interleaver 14230, the number of bit groups and the number of bits included in each bit group. In other words, the block interleaver 14230 may determine the bit groups which are to be interleaved in bit group wise considering at least one of the number of rows and columns constituting the block interleaver 14230, the number of bit groups and the number of bits included in each bit group, interleave the corresponding bit groups in bit group wise, and divide bits of the other bit groups into sub bit groups and interleave the sub bit groups. For example, the block interleaver 14230 may interleave at least part of the plurality of bit groups in bit group wise using the first part, and divide bits of the other bit groups into sub bit groups and interleave the sub bit groups using the second part.

Meanwhile, interleaving bit groups in bit group wise means that the bits included in the same bit group are written in the same column. In other words, the block interleaver 14230, in case of bit groups which are interleaved in bit group wise, may not divide the bits included in the same bit groups and write the bits in the same column, and in case of bit groups which are not interleaved in bit group wise, may divide the bits in the bit groups and write the bits in different columns.

Accordingly, the number of rows constituting the first part is a multiple of the number of bits included in one bit group (for example, 360), and the number of rows constituting the second part may be less than the number of bits included in one bit group.

In addition, in all bit groups interleaved by the first part, the bits included in the same bit group are written and interleaved in the same column of the first part, and in at least one group interleaved by the second part, the bits are divided and written in at least two columns of the second part.

As described above, the block interleaver 14230 may interleave the plurality of bit groups by using the plurality of columns each including the plurality of rows.

In this case, the block interleaver 14230 may interleave the LDPC codeword by dividing the plurality of columns into at least two parts. For example, the block interleaver 14230 may divide each of the plurality of columns into the first part and the second part and interleave the plurality of bit groups constituting the LDPC codeword.

In this case, the block interleaver 14230 may divide each of the plurality of columns into N number of parts (N is an integer greater than or equal to 2) according to whether the number of bit groups constituting the LDPC codeword is an integer multiple of the number of columns constituting the block interleaver 14230, and may perform interleaving.

When the number of bit groups constituting the LDPC codeword is an integer multiple of the number of columns constituting the block interleaver 14230, the block interleaver 14230 may interleave the plurality of bit groups constituting the LDPC codeword in bit group wise without dividing each of the plurality of columns into parts.

Specifically, the block interleaver 14230 may interleave by writing the plurality of bit groups of the LDPC codeword on each of the columns in bit group wise in a column direction, and reading each row of the plurality of columns in which the plurality of bit groups are written in bit group wise in a row direction.

In this case, the block interleaver 14230 may interleave by writing bits included in a predetermined number of bit groups, which corresponds to a quotient obtained by dividing the number of bit groups of the LDPC codeword by the number of columns of the block interleaver 14230, on each of the plurality of columns serially in a column direction, and reading each row of the plurality of columns in which the bits are written in a row direction.

Hereinafter, the group located in the $j^{th}$ position after being interleaved by the group interleaver 14220 will be referred to as group $Y_j$.

For example, it is assumed that the block interleaver 14230 is formed of C number of columns each including $R_1$ number of rows. In addition, it is assumed that the LDPC codeword is formed of $N_{group}$ number of bit groups and the number of bit groups $N_{group}$ is a multiple of C.

In this case, when the quotient obtained by dividing $N_{group}$ number of bit groups constituting the LDPC codeword by C number of columns constituting the block interleaver 14230 is A $(=N_{group}/C)$ (A is an integer greater than 0), the block interleaver 14230 may interleave by writing A $(=N_{group}/C)$ number of bit groups on each column serially in a column direction and reading bits written on each column in a row direction.

For example, as shown in FIG. 19, the block interleaver 14230 writes bits included in bit group $Y_0$, bit group $Y_1, \ldots$, bit group $Y_{A-1}$ in the $1^{st}$ column from the $1^{st}$ row to the $R_1^{th}$ row, writes bits included in bit group $Y_A$, bit group $Y_{A+1}, \ldots$, bit group $Y_{2A-1}$ in the 2nd column from the $1^{st}$ row to the $R_1^{th}$ row, $\ldots$, and writes bits included in bit group $Y_{CA-A}$, bit group $Y_{CA-A+1}, \ldots$, bit group $Y_{CA-1}$ in the column C from the $1^{st}$ row to the $R_1^{th}$ row. The block interleaver 14230 may read the bits written in each row of the plurality of columns in a row direction.

Accordingly, the block interleaver 14230 interleaves all bit groups constituting the LDPC codeword in bit group wise.

However, when the number of bit groups of the LDPC codeword is not an integer multiple of the number of columns of the block interleaver 14230, the block interleaver 14230 may divide each column into 2 parts and interleave a part of the plurality of bit groups of the LDPC codeword in bit group wise, and divide bits of the other bit groups into sub bit groups and interleave the sub bit groups. In this case, the bits included in the other bit groups, that is, the bits included in the number of groups which correspond to the remainder when the number of bit groups constituting the LDPC codeword is divided by the number of columns are not interleaved in bit group wise, but interleaved by being divided according to the number of columns.

Specifically, the block interleaver 14230 may interleave the LDPC codeword by dividing each of the plurality of columns into two parts.

In this case, the block interleaver 14230 may divide the plurality of columns into the first part and the second part based on at least one of the number of columns of the block interleaver 14230, the number of bit groups of the LDPC codeword, and the number of bits of bit groups.

Here, each of the plurality of bit groups may be formed of 360 bits. In addition, the number of bit groups of the LDPC codeword is determined based on the length of the LDPC codeword and the number of bits included in the bit group.

For example, when an LDPC codeword in the length of 16200 is divided such that each bit group has 360 bits, the LDPC codeword is divided into 45 bit groups. Alternatively, when an LDPC codeword in the length of 64800 is divided such that each bit group has 360 bits, the LDPC codeword may be divided into 180 bit groups. Further, the number of columns constituting the block interleaver 14230 may be determined according to a modulation method. This will be explained in detail below.

Accordingly, the number of rows constituting each of the first part and the second part may be determined based on the number of columns constituting the block interleaver 14230, the number of bit groups constituting the LDPC codeword, and the number of bits constituting each of the plurality of bit groups.

Specifically, in each of the plurality of columns, the first part may be formed of as many rows as the number of bits included in at least one bit group which can be written in each column in bit group wise from among the plurality of bit groups of the LDPC codeword, according to the number of columns constituting the block interleaver 14230, the number of bit groups constituting the LDPC codeword, and the number of bits constituting each bit group.

In each of the plurality of columns, the second part may be formed of rows excluding as many rows as the number of bits included in at least some bit groups which can be written in each of the plurality of columns in bit group wise. Specifically, the number rows of the second part may be the same value as a quotient when the number of bits included in all bit groups excluding bit groups corresponding to the first part is divided by the number of columns constituting the block interleaver 14230. In other words, the number of rows of the second part may be the same value as a quotient when the number of bits included in the remaining bit groups which are not written in the first part from among bit groups constituting the LDPC codeword is divided by the number of columns.

That is, the block interleaver 14230 may divide each of the plurality of columns into the first part including as many rows as the number of bits included in bit groups which can be written in each column in bit group wise, and the second part including the other rows.

Accordingly, the first part may be formed of as many rows as the number of bits included in bit groups, that is, as many rows as an integer multiple of M. However, since the number of codeword bits constituting each bit group may be an aliquot part of M as described above, the first part may be formed of as many rows as an integer multiple of the number of bits constituting each bit group.

In this case, the block interleaver 14230 may interleave by writing and reading the LDPC codeword in the first part and the second part in the same method.

Specifically, the block interleaver 14230 may interleave by writing the LDPC codeword in the plurality of columns constituting each of the first part and the second part in a column direction, and reading the plurality of columns constituting the first part and the second part in which the LDPC codeword is written in a row direction.

That is, the block interleaver 14230 may interleave by writing the bits included in at least some bit groups which can be written in each of the plurality of columns in bit group wise in each of the plurality of columns of the first part serially, dividing the bits included in the other bit groups except the at least some bit groups and writing in each of the plurality of columns of the second part in a column direction, and reading the bits written in each of the plurality of columns constituting each of the first part and the second part in a row direction.

In this case, the block interleaver 14230 may interleave by dividing the other bit groups except the at least some bit groups from among the plurality of bit groups based on the number of columns constituting the block interleaver 14230.

Specifically, the block interleaver 14230 may interleave by dividing the bits included in the other bit groups by the number of a plurality of columns, writing each of the divided bits in each of a plurality of columns constituting the second part in a column direction, and reading the plurality of columns constituting the second part, where the divided bits are written, in a row direction.

That is, the block interleaver 14230 may divide the bits included in the other bit groups except the bit groups written in the first part from among the plurality of bit groups of the LDPC codeword, that is, the bits in the number of bit groups which correspond to the remainder when the number of bit groups constituting the LDPC codeword is divided by the number of columns, by the number of columns, and may write the divided bits in each column of the second part serially in a column direction.

For example, it is assumed that the block interleaver 14230 is formed of C number of columns each including $R_1$ number of rows. In addition, it is assumed that the LDPC codeword is formed of $N_{group}$ number of bit groups, the number of bit groups $N_{group}$ is not a multiple of C, and $A \times C + 1 = N_{group}$ (A is an integer greater than 0). In other words, it is assumed that when the number of bit groups constituting the LDPC codeword is divided by the number of columns, the quotient is A and the remainder is 1.

Figure 20:
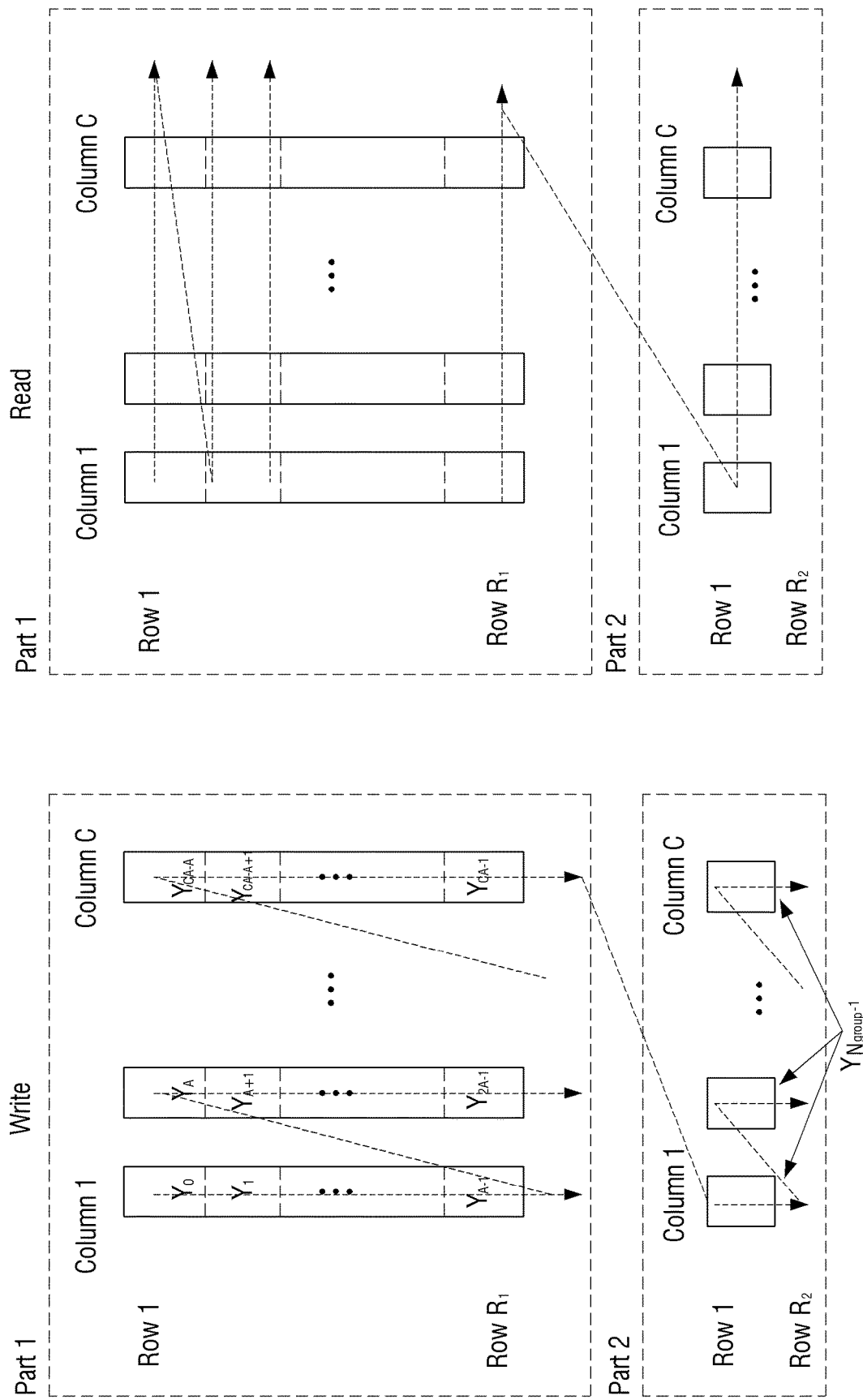
Figure 21:
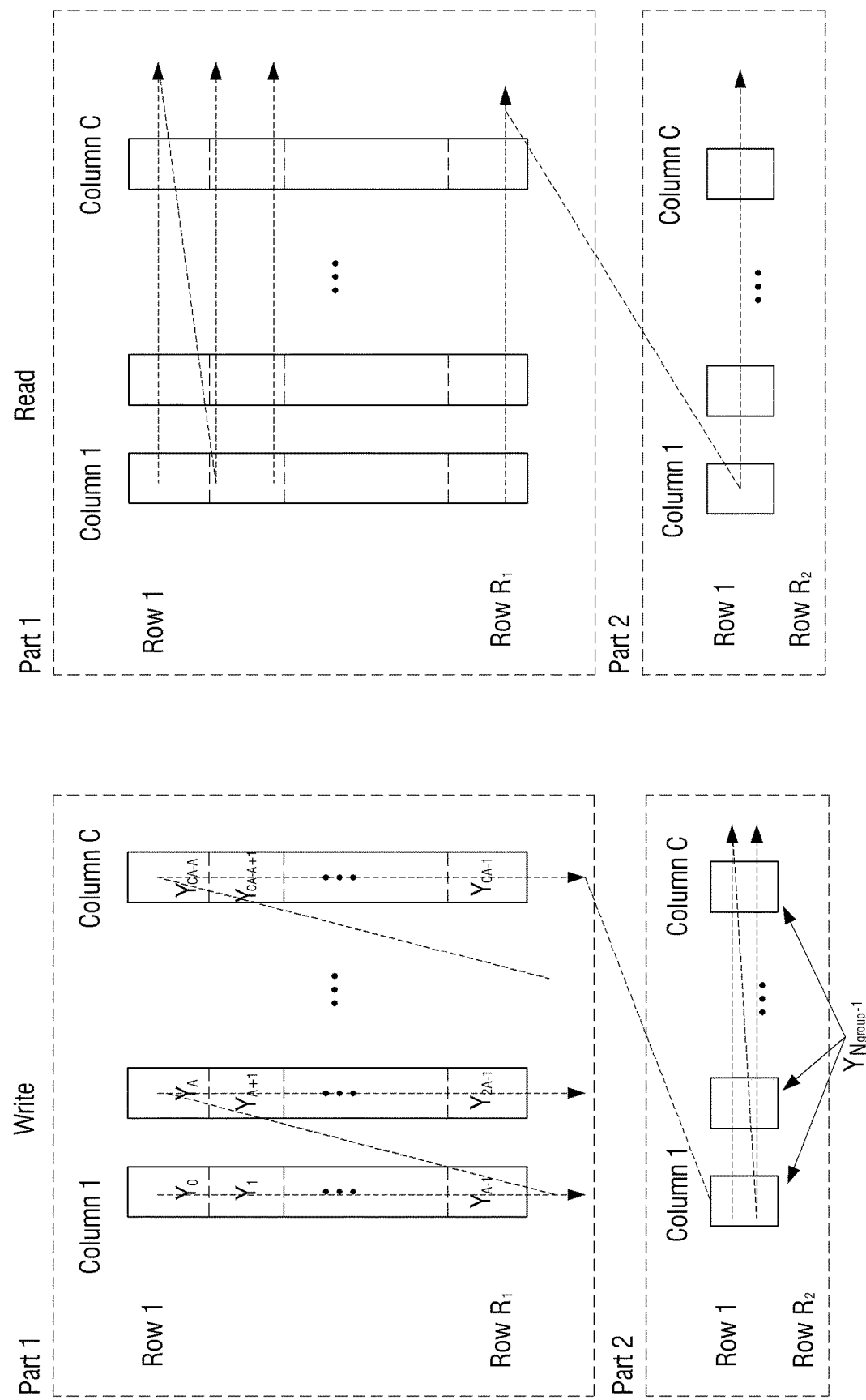

In this case, as shown in FIGS. 20 and 21, the block interleaver 14230 may divide each column into a first part including $R_1$ number of rows and a second part including $R_2$ number of rows. In this case, $R_1$ may correspond to the number of bits included in bit groups which can be written in each column in bit group wise, and $R_2$ may be $R_1$ subtracted from the number of rows of each column.

That is, in the above-described example, the number of bit groups which can be written in each column in bit group wise is A, and the first part of each column may be formed of as many rows as the number of bits included in A number of bit groups, that is, may be formed of as many rows as $A \times M$ number.

In this case, the block interleaver 14230 writes the bits included in the bit groups which can be written in each column in bit group wise, that is, A number of bit groups, in the first part of each column in the column direction.

That is, as shown in FIGS. 20 and 21, the block interleaver 14230 writes the bits included in each of bit group $Y_0$, bit group $Y_1, \ldots,$ group $Y_{A-1}$ in the $1^{st}$ to $R_1^{th}$ rows of the first part of the $1^{st}$ column, writes bits included in each of bit group $Y_A$, bit group $Y_{A+1}, \ldots,$ bit group $Y_{2A-1}$ in the $1^{st}$ to $R_1^{th}$ rows of the first part of the $2^{nd}$ column, $\ldots$, writes bits included in each of bit group $Y_{CA-A}$, bit group $Y_{CA-A+1}, \ldots,$ bit group $Y_{CA-1}$ in the $1^{st}$ to $R_1^{th}$ rows of the first part of the column C.

As described above, the block interleaver 14230 writes the bits included in the bit groups which can be written in each column in bit group wise in the first part of each column.

In other words, in the above exemplary embodiment, the bits included in each of bit group ($Y_0$), bit group ($Y_1$), . . . , bit group ($Y_{A-1}$) may not be divided and all of the bits may be written in the first column, the bits included in each of bit group ($Y_A$), bit group ($Y_{A+1}$), . . . , bit group ($Y_{2A-1}$) may not be divided and all of the bits may be written in the second column, . . . , and the bits included in each of bit group ($Y_{CA-A}$), bit group ($Y_{CA-A+1}$), . . . , group ($Y_{CA-1}$) may not be divided and all of the bits may be written in the C column. As such, all bit groups interleaved by the first part are written in the same column of the first part.

Thereafter, the block interleaver 14230 divides bits included in the other bit groups except the bit groups written in the first part of each column from among the plurality of bit groups, and writes the bits in the second part of each column in the column direction. In this case, the block interleaver 14230 divides the bits included in the other bit groups except the bit groups written in the first part of each column by the number of columns, so that the same number of bits are written in the second part of each column, and writes the divided bits in the second part of each column in the column direction.

In the above-described example, since $A \times C + 1 = N_{group}$, when the bit groups constituting the LDPC codeword are written in the first part serially, the last bit group $Y_{Ngroup-1}$ of the LDPC codeword is not written in the first part and remains. Accordingly, the block interleaver 14230 divides the bits included in the bit group $Y_{Ngroup-1}$ into C number of sub bit groups as shown in FIG. 20, and writes the divided bits (that is, the bits corresponding to the quotient when the bits included in the last group ($Y_{Ngroup-1}$) are divided by C) in the second part of each column serially.

The bits divided based on the number of columns may be referred to as sub bit groups. In this case, each of the sub bit groups may be written in each column of the second part. That is, the bits included in the bit groups may be divided and may form the sub bit groups.

That is, the block interleaver 14230 writes the bits in the $1^{st}$ to $R_2^{th}$ rows of the second part of the $1^{st}$ column, writes the bits in the $1^{st}$ to $R_2^{th}$ rows of the second part of the $2^{nd}$ column, . . . , and writes the bits in the $1^{st}$ to $R_2^{th}$ rows of the second part of the column C. In this case, the block interleaver 14230 may write the bits in the second part of each column in the column direction as shown in FIG. 20.

That is, in the second part, the bits constituting the bit group may not be written in the same column and may be written in the plurality of columns. In other words, in the above example, the last bit group ($Y_{Ngroup-1}$) is formed of M number of bits and thus, the bits included in the last bit group ($Y_{Ngroup-1}$) may be divided by M/C and written in each column. That is, the bits included in the last bit group ($Y_{Ngroup-1}$) are divided by M/C, forming M/C number of sub bit groups, and each of the sub bit groups may be written in each column of the second part.

Accordingly, in at least one bit group which is interleaved by the second part, the bits included in the at least one bit group are divided and written in at least two columns constituting the second part.

In the above-described example, the block interleaver 14230 writes the bits in the second part in the column direction. However, this is merely an example. That is, the block interleaver 14230 may write the bits in the plurality of columns of the second part in the row direction. In this case, the block interleaver 14230 may write the bits in the first part in the same method as described above.

Specifically, referring to FIG. 21, the block interleaver 14230 writes the bits from the $1^{st}$ row of the second part in the $1^{st}$ column to the $1^{st}$ row of the second part in the column C, writes the bits from the $2^{nd}$ row of the second part in the $1^{st}$ column to the $2^{nd}$ row of the second part in the column C, . . . , etc., and writes the bits from the $R_2^{th}$ row of the second part in the 1st column to the $R_2^{th}$ row of the second part in the column C.

On the other hand, the block interleaver 14230 reads the bits written in each row of each part serially in the row direction. That is, as shown in FIGS. 20 and 21, the block interleaver 14230 reads the bits written in each row of the first part of the plurality of columns serially in the row direction, and reads the bits written in each row of the second part of the plurality of columns serially in the row direction.

Accordingly, the block interleaver 14230 may interleave a part of the plurality of bit groups constituting the LDPC codeword in bit group wise, and divide and interleave some of the remaining bit groups. That is, the block interleaver 14230 may interleave by writing the LDPC codeword constituting a predetermined number of bit groups from among the plurality of bit groups in the plurality of columns of the first part in bit group wise, dividing the bits of the other bit groups and writing the bits in each of the columns of the second part, and reading the plurality of columns of the first and second parts in the row direction.

As described above, the block interleaver 14230 may interleave the plurality of bit groups in the methods described above with reference to FIGS. 19 to 21.

In particular, in the case of FIG. 20, the bits included in the bit group which does not belong to the first part are written in the second part in the column direction and read in the row direction. In view of this, the order of the bits included in the bit group which does not belong to the first part is rearranged. Since the bits included in the bit group which does not belong to the first part are interleaved as described above, bit error rate (BER)/frame error rate (FER) performance can be improved in comparison with a case in which such bits are not interleaved.

However, the bit group which does not belong to the first part may not be interleaved as shown in FIG. 20. That is, since the block interleaver 14230 writes and reads the bits included in the group which does not belong to the first part in and from the second part in the row direction, the order of the bits included in the group which does not belong to the first part is not changed and the bits are output serially. In this case, the bits included in the group which does not belong to the first part may be output serially and mapped onto a modulation symbol.

In FIGS. 20 and 21, the last single bit group of the plurality of bit groups is written in the second part. However, this is merely an example. The number of bit groups written in the second part may vary according to the total number of bit groups of the LDPC codeword, the number of columns and rows, the number of transmission antennas, etc.

The block interleaver 14230 may have a configuration as shown in tables 1 and 2 presented below:

TABLE 1

| | $N_{ldpc}$ = 64800 | | | | | |
|---|---|---|---|---|---|---|
| | QPSK | 16 QAM | 64 QAM | 256 QAM | 1024 QAM | 4096 QAM |
| C | 2 | 4 | 6 | 8 | 10 | 12 |
| $R_1$ | 32400 | 16200 | 10800 | 7920 | 6480 | 5400 |
| $R_2$ | 0 | 0 | 0 | 180 | 0 | 0 |

TABLE 2

| | | | | 256 | | |
|---|---|---|---|---|---|---|
| | QPSK | 16 QAM | 64 QAM | QAM | 1024 QAM | 4096 QAM |
| C | 2 | 4 | 6 | 8 | 10 | 12 |
| $R_1$ | 7920 | 3960 | 2520 | 1800 | 1440 | 1080 |
| $R_2$ | 180 | 90 | 180 | 225 | 180 | 270 |

$N_{ldpc} = 16200$

Herein, C (or $N_C$) is the number of columns of the block interleaver 14230, $R_1$ is the number of rows constituting the first part in each column, and $R_2$ is the number of rows constituting the second part in each column.

Referring to Tables 1 and 2, the number of columns has the same value as a modulation order according to a modulation method, and each of a plurality of columns is formed of rows corresponding to the number of bits constituting the LDPC codeword divided by the number of a plurality of columns.

For example, when the length $N_{ldpc}$ of the LDPC codeword is 64800 and the modulation method is 16-QAM, the block interleaver 14230 is formed of 4 columns as the modulation order is 4 in the case of 16-QAM, and each column is formed of rows as many as $R_1+R_2=16200$ (=64800/4). In another example, when the length $N_{ldpc}$ of the LDPC codeword is 64800 and the modulation method is 64-QAM, the block interleaver 14230 is formed of 6 columns as the modulation order is 6 in the case of 64-QAM, and each column is formed of rows as many as $R_1+R_2=10800(=64800/6)$.

Meanwhile, referring to Tables 1 and 2, when the number of bit groups constituting an LDPC codeword is an integer multiple of the number of columns, the block interleaver 14230 interleaves without dividing each column. Therefore, $R_1$ corresponds to the number of rows constituting each column, and $R_2$ is 0. In addition, when the number of bit groups constituting an LDPC codeword is not an integer multiple of the number of columns, the block interleaver 14230 interleaves the groups by dividing each column into the first part formed of $R_1$ number of rows, and the second part formed of $R_2$ number of rows.

When the number of columns of the block interleaver 14230 is equal to the number of bits constituting a modulation symbol, bits included in a same bit group are mapped onto a single bit of each modulation symbol as shown in Tables 1 and 2.

For example, when $N_{ldpc}=64800$ and the modulation method is 16-QAM, the block interleaver 14230 may be formed of four (4) columns each including 16200 rows. In this case, the bits included in each of the plurality of bit groups are written in the four (4) columns and the bits written in the same row in each column are output serially. In this case, since four (4) bits constitute a single modulation symbol in the modulation method of 16-QAM, bits included in the same bit group, that is, bits output from a single column, may be mapped onto a single bit of each modulation symbol. For example, bits included in a bit group written in the 1$^{st}$ column may be mapped onto the first bit of each modulation symbol.

In another example, when $N_{ldpc}=64800$ and the modulation method is 64-QAM, the block interleaver 14230 may be formed of six (6) columns each including 10800 rows. In this case, the bits included in each of the plurality of bit groups are written in the six (6) columns and the bits written in the same row in each column are output serially. In this case, since six (6) bits constitute a single modulation symbol in the modulation method of 64-QAM, bits included in the same bit group, that is, bits output from a single column, may be mapped onto a single bit of each modulation symbol. For example, bits included in a bit group written in the 1$^{st}$ column may be mapped onto the first bit of each modulation symbol.

Referring to Tables 1 and 2, the total number of rows of the block interleaver 14230, that is, $R_1+R_2$, is $N_{ldpc}/C$.

In addition, the number of rows of the first part, $R_1$, is an integer multiple of the number of bits included in each group, M (e.g., M=360), and may be expressed as $\lfloor N_{group}/C \rfloor \times M$, and the number of rows of the second part, $R_2$, may be $N_{ldpc}/C - R_1$. Herein, $\lfloor N_{group}/C \rfloor$ is the largest integer below $N_{group}/C$. Since $R_1$ is an integer multiple of the number of bits included in each group, M, bits may be written in $R_1$ in bit groups wise.

In addition, when the number of bit groups of the LDPC codeword is not a multiple of the number of columns, it can be seen from Tables 1 and 2 that the block interleaver 14230 interleaves by dividing each column into two parts.

Specifically, the length of the LDPC codeword divided by the number of columns is the total number of rows included in the each column. In this case, when the number of bit groups of the LDPC codeword is a multiple of the number of columns, each column is not divided into two parts. However, when the number of bit groups of the LDPC codeword is not a multiple of the number of columns, each column is divided into two parts.

For example, it is assumed that the number of columns of the block interleaver 14230 is identical to the number of bits constituting a modulation symbol, and an LDPC codeword is formed of 64800 bits as shown in Table 1. In this case, each bit group of the LDPC codeword is formed of 360 bits, and the LDPC codeword is formed of 64800/360(=180) bit groups.

When the modulation method is 16-QAM, the block interleaver 14230 may be formed of four (4) columns and each column may have 64800/4(=16200) rows.

In this case, since the number of bit groups of the LDPC codeword divided by the number of columns is 180/4(=45), bits can be written in each column in bit group wise without dividing each column into two parts. That is, bits included in 45 bit groups which is the quotient when the number of bit groups constituting the LDPC codeword is divided by the number of columns, that is, 45×360(=16200) bits can be written in each column.

However, when the modulation method is 256-QAM, the block interleaver 14230 may be formed of eight (8) columns and each column may have 64800/8(=8100) rows.

In this case, since the number of bit groups of the LDPC codeword divided by the number of columns is 180/8=22.5, the number of bit groups constituting the LDPC codeword is not an integer multiple of the number of columns. Accordingly, the block interleaver 14230 divides each of the eight (8) columns into two parts to perform interleaving in bit group wise.

In this case, since the bits should be written in the first part of each column in bit group wise, the number of bit groups which can be written in the first part of each column in bit group wise is 22, which is the quotient when the number of bit groups constituting the LDPC codeword is divided by the number of columns, and accordingly, the first part of each column has 22×360(=7920) rows. Accordingly, 7920 bits included in 22 bit groups may be written in the first part of each column.

The second part of each column has rows which are the rows of the first part subtracted from the total rows of each column. Accordingly, the second part of each column includes 8100−7920(=180) rows.

In this case, the bits included in the other bit groups which have not been written in the first part are divided and written in the second part of each column.

Specifically, since 22×8(=176) bit groups are written in the first part, the number of bit groups to be written in the second part is 180−176 (=4) (for example, bit group $Y_{176}$, bit group $Y_{177}$, bit group $Y_{178}$, and bit group $Y_{179}$ from among bit group $Y_0$, bit group $Y_1$, bit group $Y_2$, . . . , bit group $Y_{178}$, and bit group $Y_{179}$ constituting the LDPC codeword).

Accordingly, the block interleaver 14230 may write the four (4) bit groups which have not been written in the first part and remains from among the groups constituting the LDPC codeword in the second part of each column serially.

That is, the block interleaver 14230 may write 180 bits of the 360 bits included in the bit group $Y_{176}$ in the $1^{st}$ row to the $180^{th}$ row of the second part of the $1^{st}$ column in the column direction, and may write the other 180 bits in the $1^{st}$ row to the $180^{th}$ row of the second part of the $2^{nd}$ column in the column direction. In addition, the block interleaver 14230 may write 180 bits of the 360 bits included in the bit group $Y_{177}$ in the $1^{st}$ row to the $180^{th}$ row of the second part of the $3^{rd}$ column in the column direction, and may write the other 180 bits in the $1^{st}$ row to the $180^{th}$ row of the second part of the $4^{th}$ column in the column direction. In addition, the block interleaver 14230 may write 180 bits of the 360 bits included in the bit group $Y_{178}$ in the $1^{st}$ row to the $180^{th}$ row of the second part of the $5^{th}$ column in the column direction, and may write the other 180 bits in the $1^{st}$ row to the $180^{th}$ row of the second part of the $6^{th}$ column in the column direction. In addition, the block interleaver 14230 may write 180 bits of the 360 bits included in the bit group $Y_{179}$ in the $1^{st}$ row to the $180^{th}$ row of the second part of the $7^{th}$ column in the column direction, and may write the other 180 bits in the $1^{st}$ row to the $180^{th}$ row of the second part of the $8^{th}$ column in the column direction.

Accordingly, the bits included in the bit group which has not been written in the first part and remains are not written in the same column in the second part and may be divided and written in the plurality of columns.

Hereinafter, the block interleaver 14230 according to an exemplary embodiment will be explained in detail with reference to FIG. 22.

In a group-interleaved LDPC codeword ($v_0$, $v_1$, . . . , $v_{N_{ldpc}-1}$), $Y_j$ is continuously arranged like V={$Y_0$, $Y_1$, . . . $Y_{N_{group}-1}$}.

Figure 22:
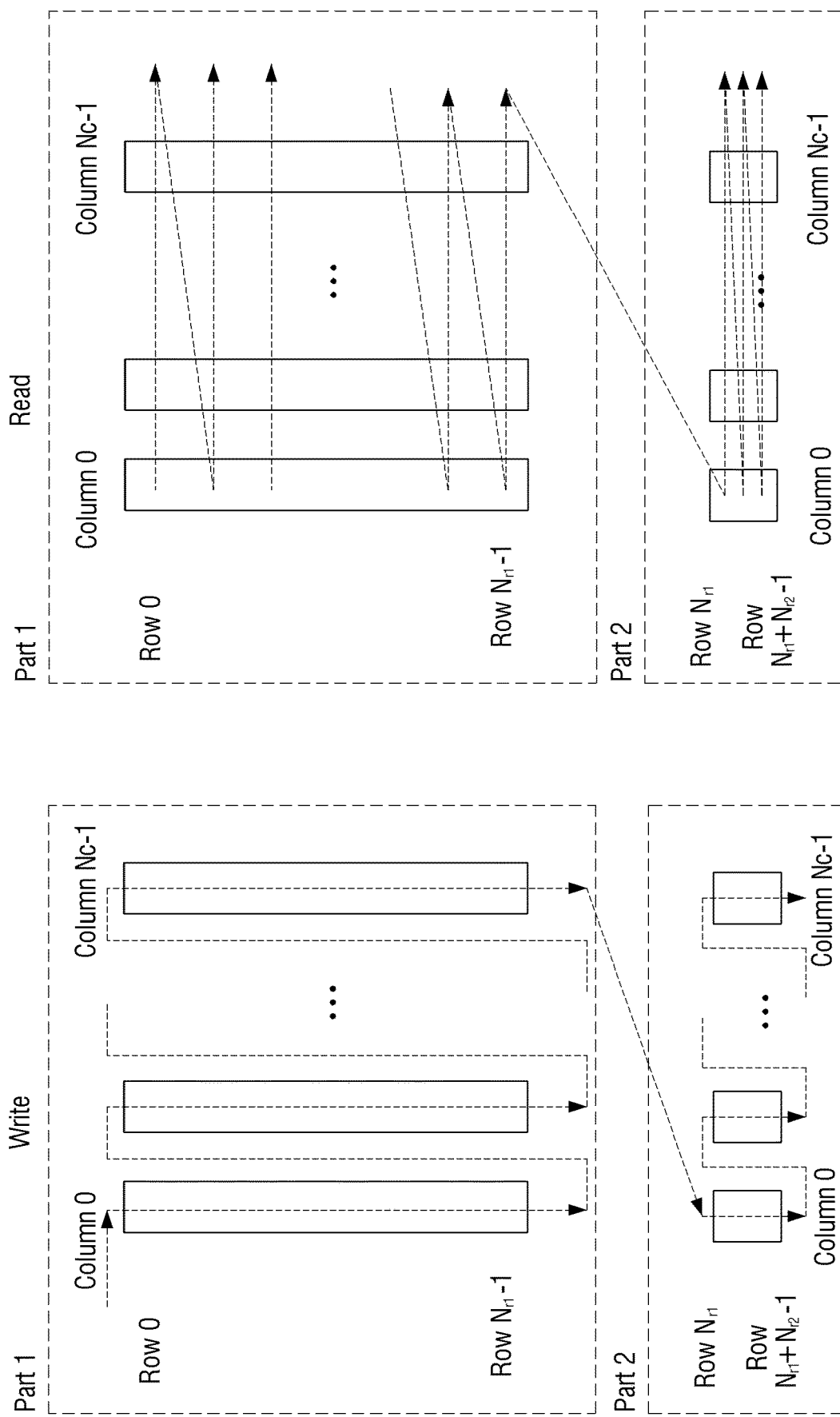

The LDPC codeword after group interleaving may be interleaved by the block interleaver 14230 as shown in FIG. 22. In this case, the block interleaver 14230 divide a plurality of columns into the first part (Part 1) and the second part (Part 2) based on the number of columns of the block interleaver 14230 and the number of bits of bit groups. In this case, in the first part, the bits constituting the bit groups may be written in the same column, and in the second part, the bits constituting the bit groups may be written in a plurality of columns (i.e. the bits constituting the bit groups may be written in at least two columns).

Specifically, input bits vi are written serially from the first part to the second part column wise, and then read out serially from the first part to the second part row wise. That is, the data bits $v_i$ are written serially into the block interleaver column-wise starting in the first aprt and continuing column-wise finishing in the second part, and then read out serially row-wise from the first part and then row-wise from the second part. Accordingly, the bit included in the same bit group in the first part may be mapped onto a single bit of each modulation symbol.

In this case, the number of columns and the number of rows of the first part and the second part of the block interleaver 14230 vary according to a modulation format and a length of the LDPC codeword as in Table 3 presented below. That is, the first part and the second part block interleaving configurations for each modulation format and code length are specified in Table 3 presented below. Herein, the number of columns of the block interleaver 14230 may be equal to the number of bits constituting a modulation symbol. In addition, a sum of the number of rows of the first part, $N_{r1}$ and the number of rows of the second part, $N_{r2}$, is equal to $N_{ldpc}/N_C$ (herein, $N_C$ is the number of columns). In addition, since $N_{r1}(=\lfloor N_{group}/N_C \rfloor \times 360)$ is a multiple of 360, a multiple of bit groups may be written in the first part.

TABLE 3

| Modulation | Rows in Part 1 $N_{r1}$ | | Rows in Part 2 $N_{r2}$ | | Columns $N_c$ |
|---|---|---|---|---|---|
| | $N_{ldpc}$ = 64800 | $N_{ldpc}$ = 16200 | $N_{ldpc}$ = 64800 | $N_{ldpc}$ = 16200 | |
| QPSK | 32400 | 7920 | 0 | 180 | 2 |
| 16-QAM | 16200 | 3960 | 0 | 90 | 4 |
| 64-QAM | 10800 | 2520 | 0 | 180 | 6 |
| 256-QAM | 7920 | 1800 | 180 | 225 | 8 |
| 1024-QAM | 6480 | 1440 | 0 | 180 | 10 |
| 4096-QAM | 5400 | 1080 | 0 | 270 | 12 |

Hereinafter, an operation of the block interleaver 14230 will be explained in detail.

Specifically, as shown in FIG. 22, the input bit $v_i$ ($0 \le i < N_C \times N_{r1}$) is written in $r_i$ row of $c_i$ column of the first part of the block interleaver 14230. Herein, $c_i$ and $r_i$ are $$c_i = \left\lfloor \frac{i}{N_{r1}} \right\rfloor$$

and $r_i$=(i mod $N_{r1}$), respectively.

In addition, the input bit $v_i$ ($N_C \times N_{r1} \le i < N_{ldpc}$) is written in $r_i$ row of $c_i$ column of the second part of the block interleaver 14230. Herein, $c_i$ and $r_i$ satisfy $$c_i = \left\lfloor \frac{(i - N_C \times N_{r1})}{N_{r2}} \right\rfloor$$

and $r_i=N_{r1}+\{(i-N_C \times N_{r1}) \bmod N_{r2}\}$, respectively.

An output bit $q_j$ ($0 \le j < N_{ldpc}$) is read from $c_j$ column of $r_j$ row. Herein, $r_j$ and $c_j$ satisfy $$r_j = \left\lfloor \frac{j}{N_C} \right\rfloor$$

and $c_j$=(j mod $N_C$), respectively.

For example, when the length $N_{ldpc}$ of an LDPC codeword is 64800 and the modulation method is 256-QAM, the order of bits output from the block interleaver 14230 may be ($q_0$, $q_1$, $q_2$, . . . , $q_{63357}$, $q_{63358}$, $q_{63359}$, $q^{63360}$, $q_{63361}$, . . . , $q_{64799}$)=($v_0$, $v_{7920}$, $v_{15840}$, . . . , $v_{47519}$, $v_{55439}$, $v_{63359}$, $v_{63360}$, $v_{63540}$, . . . , $v_{64799}$). Herein, the indexes of the right side of the foregoing equation may be specifically expressed for the eight (8) columns as 0, 7920, 15840, 23760, 31680, 39600, 47520, 55440, 1, 7921, 15841, 23761, 31681, 39601, 47521, 55441, . . . , 7919, 15839, 23759, 31679, 39599, 47519, 55439, 63359, 63360, 63540, 63720, 63900, 64080, 64260, 64440, 64620, . . . , 63539, 63719, 63899, 64079, 64259, 64439, 64619, 64799.

Hereinafter, a method of mapping bits onto constellation points will be described in greater detail, according to various exemplary embodiments A non-uniform constellation (NUC) according to an exemplary embodiment may be generated or obtained using any suitable method or algorithm including steps (or operations) for generating or obtaining such a non-uniform constellation. The non-uniform constellation according to the embodiment may be generated or obtained by any suitably arranged apparatus or system including means for generating or obtaining such a non-uniform constellation. The methods or algorithms described herein may be implemented in any suitably arranged apparatus or system including means for carrying out the method or algorithm steps.

Certain exemplary embodiments provide an algorithm for obtaining a non-uniform constellation. The non-uniform constellation obtained in the certain exemplary embodiments may provide a higher capacity than an equivalent uniform constellation (e.g. a uniform constellation of the same order). Certain exemplary embodiments may obtain an optimised non-uniform constellation using an algorithm with relatively low complexity and relatively high computational efficiency. For example, an algorithm in certain exemplary embodiments may obtain an optimised non-uniform constellation much faster than an algorithm using a brute force method that searches all (or a high proportion of) possible candidate constellations. Certain exemplary embodiments provide an algorithm for obtaining optimised non-uniform constellations suitable for very high-order constellation (e.g. having more than 1024 constellation points).

Various embodiments are described below in which non-uniform (NU) Quadrature Amplitude Modulation (QAM) constellations are obtained. However, the skilled person will appreciate that the inventive concept is not limited to QAM constellations, but may be applied to other types of constellation.

As mentioned above, a constellation may be characterised by a number of parameters, for example specifying spacings between constellation points, or specifying the position of each positive real level (complete constellations may be obtained from these parameters because the constellations are the same for real and imaginary axes and the same for positive and negative values). In order to obtain an optimum constellation, a brute force approach may be taken in which combinations of values for each of the parameters are searched with a certain step size up to a certain maximum value. Each combination of values for each parameter corresponds to a distinct constellation. The constellation having the best performance is selected.

However, in certain exemplary embodiments, the number of parameters may be reduced by imposing one or more certain geometric and/or symmetry constraints on the constellations. For example, one constraint may be that the constellations are symmetric among the four quadrants of the constellations. In addition, the constellations may be constrained in that the constellation points are arranged in a QAM type lattice in which, within each quadrant, (i) constellation points are arranged in horizontal and vertical lines, (ii) the number of horizontal lines is the same as the number of vertical lines, (iii) the same number of constellation points are arranged in each horizontal line, and (iv) the same number of constellation points are arranged in each vertical line. In another example, a constellation may be constrained to be a circular constellation (e.g. a constellation having circular symmetry). Furthermore, constellations having the same relative arrangement, differing only in size, may be regarded as equivalent. In this case, one of the parameters may be set to a fixed value. The skilled person will appreciate that the inventive concept is not limited to the above examples, and that one or more additional or alternative constraints may be used.

In certain exemplary embodiments, a non-uniform QAM (NU-QAM) constellation may have a constellation conforming to one or more geometric and/or symmetry constraints, for example one or more, or all, of the above constraints, or a rotation and/or scaling thereof. A non-uniform N-QAM constellation may be a non-uniform QAM constellation including N constellation points.

By applying the constraints described above, the number of parameters may be reduced, for example to 1, 3, 7, 15, 31 and 63 parameter(s) for constellations including 16, 64, 256, 1024, 4096 and 16384 constellation points, respectively. The number of parameters in a reduced set of parameters may be denoted by b. For example b=1 for 16-QAM (in which there are 16 positions that are symmetric on the real/imaginary and positive/negative axes). Thus there are only 2 points to define. Since the total power of the constellation is typically normalized to one, fixing one parameter will fix the other. Thus b=1 for a square 16QAM.

In certain exemplary embodiments, combinations of values for each of the b parameters are searched with a step size d up to a maximum value A. Thus, the number of search iterations is equal to $(A/d)^b$.

A first algorithm according to certain exemplary embodiments for obtaining an optimum non-uniform constellation for a given SNR will now be described. The algorithm uses an iterative scheme to gradually modify an initial constellation until the constellation converges. For example, the initial constellation may be a uniform constellation, the constellation may be modified by changing the values of the parameters between iterations, and convergence occurs when the values of all the parameters change by less than a threshold amount between iterations. An optimum constellation may be defined as the constellation having the best performance according to any suitable measure. For example, the measure may include a coded modulation (CM) capacity or BICM capacity. In the following example a non-uniform 64-QAM constellation is obtained, in which the (reduced) number of variable parameters, b, is equal to 3.

Figure 23:
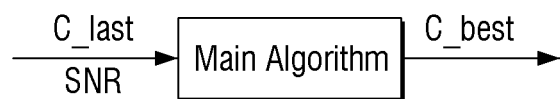
FIG. 23 is a schematic diagram of a first algorithm according to an exemplary embodiment.
Figure 24:
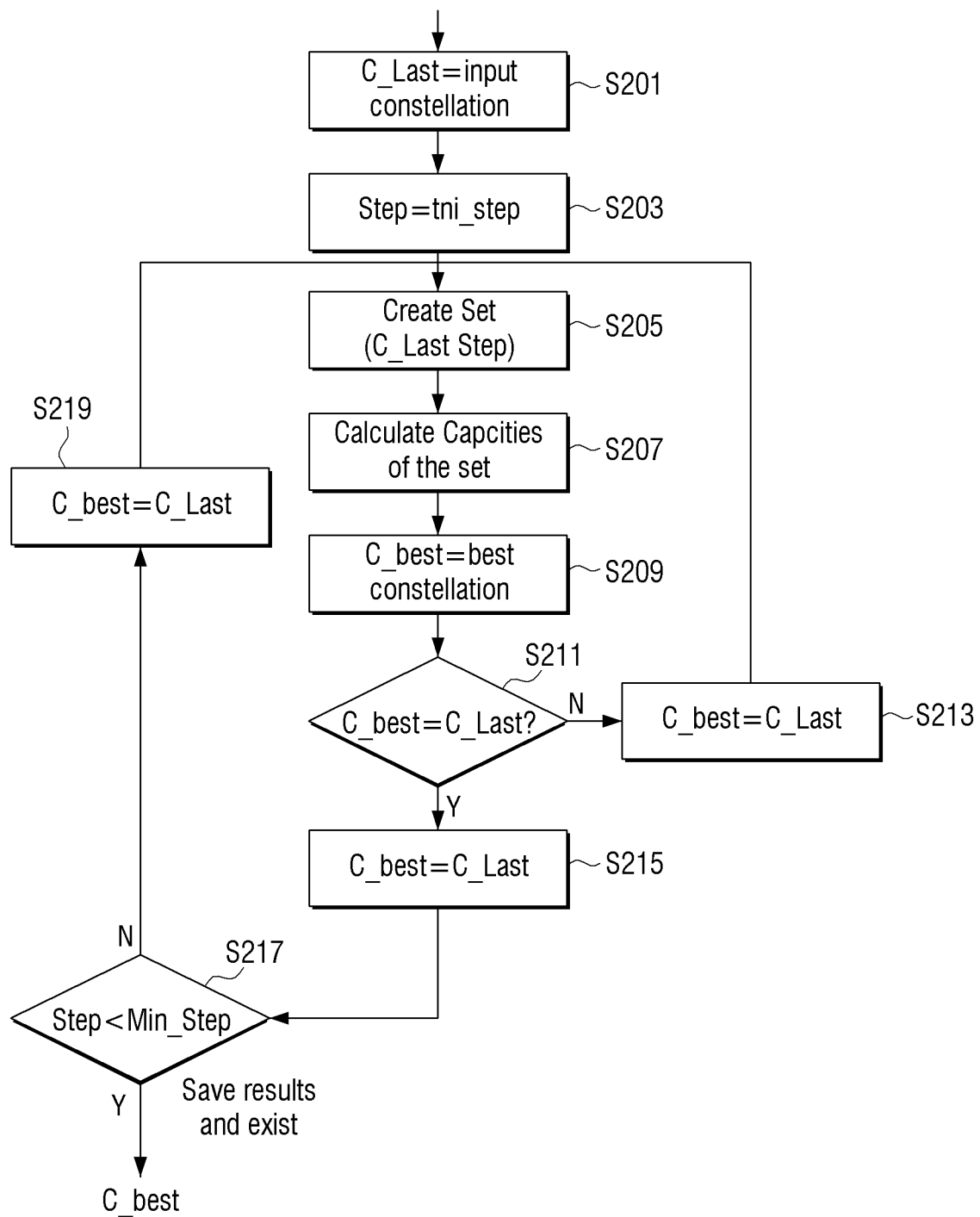
FIG. 24 is a flowchart illustrating the operations of the first algorithm, according to an exemplary embodiment.

FIG. 23 is a schematic diagram of a first algorithm, according to an exemplary embodiment, and FIG. 24 is a flowchart illustrating operations of the first algorithm, according to an exemplary embodiment. In the algorithm, the following variables are used. A parameter C_last denotes a particular constellation, corresponding to a particular set of values of the b parameters. A parameter C_last is initialised with a certain initial constellation, for example a uniform constellation. A parameter SNR denotes a signal-to-noise ratio. The SNR parameter is set to a desired value equal to an SNR for which an optimum constellation is desired. The parameter C_best denotes a constellation that maximises performance, for example maximises the CM capacity or BICM capacity, for a given SNR. The parameter d denotes a first step size used in the algorithm. The parameter d (or step) is initialised to a suitable value that may be determined theoretically and/or experimentally. A parameter Min_Step denotes a minimum allowed value for d, and is set to a fixed value.

In operation 201, C_last is initialised to an input constellation. In a next operation 203, step d is initialised to a value Ini_step. In operation 205, a set of candidate constellations is obtained. The set of candidate constellations includes the constellation C_last and one or more modified constellations, where each modified constellation is obtained by modifying one or more of the parameter values defining C_last using any suitable scheme. In the illustrated example, the set of candidate constellations are created based on C_last and step size d, denoted by function CreateSet (C_Last, d). For example, for each constellation point, three derived constellations are generated [C_last, C_last+d, C_last−d]. Specifically, a set of constellations is derived such that the values of the b parameters in C_last are each set to one of n new values varying around the current parameter value. For example, three new values (n=3) may be used, which include (i) the current parameter value, (ii) a value d greater than the current parameter value, and (iii) a value d less than the current parameter value. For example, if there are two constellation levels to be defined then the number of combinations to be tested are 3×3 (corresponding to three positions for each level). All combinations of the new parameter values are used to generate the set of constellation. Thus, the set of constellations includes a total of $n^b$ constellations. Although three new values for each parameter are used in the embodiment described above, any suitable number of new values may be used in another embodiment. The set of new values may include the old (or current) value, or may not include the old value.

In certain exemplary embodiments, three values of each level are chosen so that the total number of possibilities to be tested is $3^b$, where b is the number of levels (parameters) to be optimised. In the case of very high-order constellations, for example above 1K, $3^b$ may be very high. In this case, all the levels may be fixed except one, for which three possibilities are tested, C_last, C_last+d and C_last−d until convergence is achieved. The same operation may then be repeated for the other levels. The cost of this operation is multiplicative and not exponential (for example, if it is supposed that each level converges in one iteration then the cost will be 3×b instead $3^b$.)

In operation 207, the performance of each constellation in the set of derived (candidate) constellations is calculated or determined using any suitable performance measure (e.g. capacity). In operation 209, the candidate constellation having the best performance (e.g. the candidate constellation that maximises the capacity) is assigned to C_best. In operation 211, it is determined whether C_best differs from C_last by more than a threshold amount. For example, in the illustrated example, the threshold amount is equal to zero, so that it is determined whether C_best=C_last. That is, it is determined whether there is any difference between constellation C_best and constellation C_last (e.g. within a certain resolution). The difference may be any suitable measure of difference, for example including a difference based on geometry (e.g. differences in the locations of the constellation points of the constellations) and/or a performance measure (e.g. a difference in a certain performance measure between the constellations). If it is determined in operation 211 that C_best≠C_last, then in operation 213, C_last takes the value C_best (i.e. so that the value of C_last in the next iteration is equal to the value of C_best in the current iteration) and the method returns to operation 205 in which a set of candidate constellations are created based on C_last and step size d, CreateSet (C_Last, d). On the other hand, if it is determined in operation 211 that C_best=C_last, then, in operation 215, C_last takes the value C_best and the method moves to operation 217.

In operation 217, it is determined whether d<Min_Step. If it is determined in operation 217 that d≥Min_Step then the method moves to operation 219 in which the step size d is reduced. For example, d is divided by a certain factor (e.g. 2). Following operation 219, the method returns to operation 205 in which a set of candidate constellations are created based on C_last and step size d (i.e., reduced d), CreateSet (C_Last, d). On the other hand, If it is determined in operation 217 that d<Min_Step then the value of C_best is saved and the algorithm ends.

Figure 25:
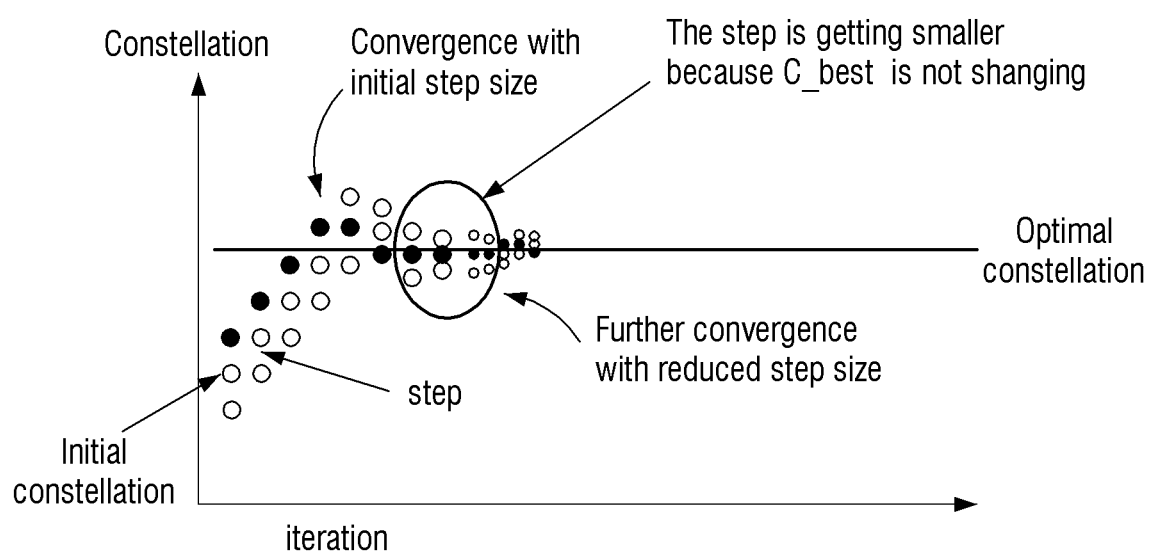
FIG. 25 illustrates the convergence of C_last with respect to one of the parameters as the first algorithm of FIGS. 23 and 24 is performed, according to an exemplary embodiment.

FIG. 25 illustrates the convergence of C_last with respect to one of the parameters as the first algorithm of FIGS. 23 and 24 is performed. Initially, the value of the parameter converges to a certain value. When the value of the parameter has converged within a certain resolution, the step size d is reduced and the value of the parameter converges further, until the step size d has reached the minimum step size.

In the example shown in FIG. 25, for each iteration, three new parameter values are tried, as represented by the vertical columns of circles. The best new parameter for each iteration is indicated in FIG. 25 as a filled circle. The best parameter value in one iteration is used as the new parameter value for the next iteration. Thus, in the example illustrated in FIG. 25, in which three new parameter values are tried (including the current parameter and parameters an amount d above and below the current parameter), the filled circle of one iteration corresponds to the middle of the three circles arranged in a column for the next iteration.

In certain exemplary embodiments, operations 217 and 219 of the algorithm illustrated in FIG. 24 may be omitted so that operations 205, 207, 209, 211, 213 and 215 are performed using the initial step size. In this case, when it is determined in operation 215 that C_best=C_last, the step size is not reduced, but rather the value of C_best is saved and the algorithm ends. By omitting operations 217 and 219, the algorithm may potentially complete more quickly. However, in this case the output constellation C_best may differ from the true optimum constellation more than the output constellation C_best obtained in the algorithm illustrated in FIG. 24 where the step size d is decreased. This may be seen in FIG. 25, where it can be seen that the best parameter value in the final iteration lies closer to the optimal value (indicated by the horizontal line) than the best parameter value at the stage of convergence with the initial step size.

The first algorithm described above determines an optimum constellation based on a certain performance measure (e.g. capacity). In the following, various algorithms for determining an optimum constellation for a transmission system defined by a set of one or more system parameter values, where the constellation is optimised for a certain desired value of a system parameter (e.g. a certain SNR value or certain Ricean factor). In these embodiments, a system parameter value is set to an initial value (e.g. a relatively high value) and an optimum constellation is generated using an algorithm described above (e.g. the algorithm illustrated in FIG. 24), wherein the performance measure is based on a defined transmission system having the set system parameter value. The system parameter value is then reset to a modified value (e.g. by reducing the value by a certain step size) and the algorithm is re-run. The other system parameter values may remain fixed. This process is repeated until the system parameter value reaches a certain desired value.

Figure 26:
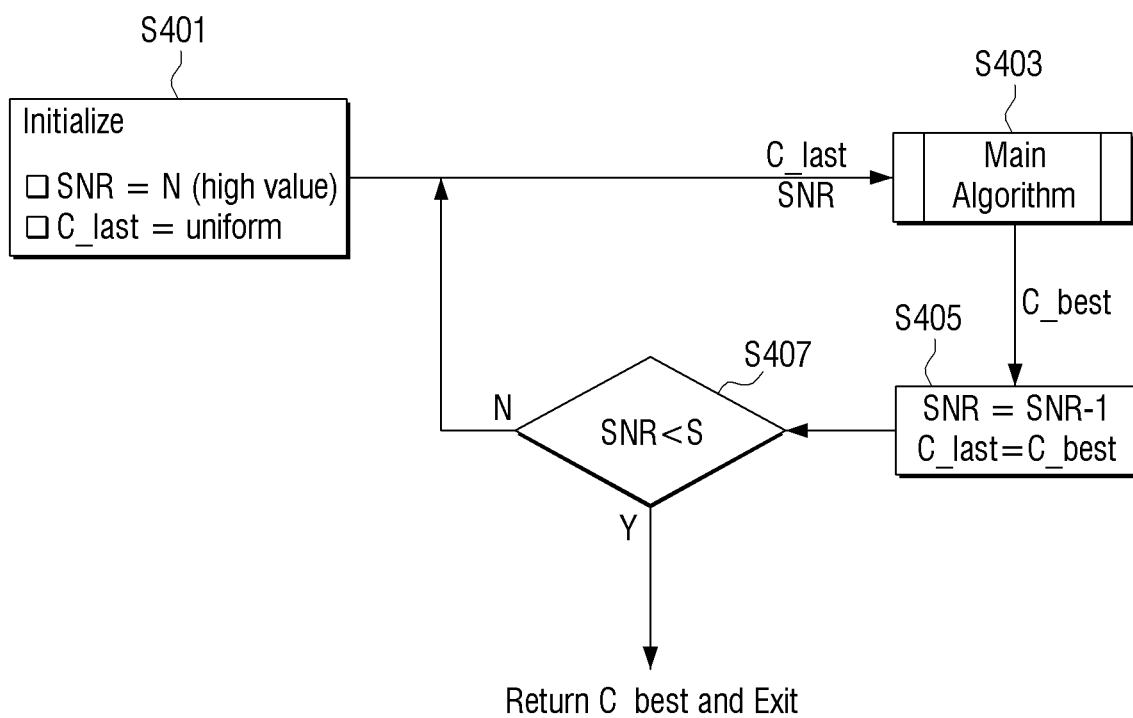
FIG. 26 illustrates a second algorithm according to an exemplary embodiment for determining an optimal constellation at a given SNR value S in an AWGN channel.

For example, FIG. 26 illustrates a second algorithm for determining an optimal constellation at a given SNR value S in an additive white Gaussian noise (AWGN) channel. In operation 401, the algorithm is initialised by setting an SNR parameter to a high value N, where N is large. For example, the initial SNR value may be set to an SNR value above which a non-uniform constellation provides no better performance than an equivalent uniform constellation. This value may be determined, for example, theoretically and/or experimentally. In operation 401, the parameter C_last is also initialised to a certain constellation, for example a uniform constellation.

In operation 403, the first algorithm described above is run using the initialised constellation C_last as the input constellation and using the initialised SNR ratio. By applying the first algorithm, the constellation C_last will converge to an optimal constellation C_best for a specific input value of SNR. An output of operation 403 is C_best obtained using the first algorithm. In operation 405 the SNR value is reduced by a certain amount, for example one unit or step size. In operation 405, C_last takes the value of C_best (i.e. so that the value of C_last in the next iteration is equal to the value of C_best in the current iteration). In operation 407 it is determined whether SNR<S. If it is determined in operation 407 that SNR≥S, then the method returns to operation 403, in which the first algorithm is run with new values of C_last and SNR. On the other hand, if it is determined in operation 407 that SNR<S, then the value of C_best is saved and the algorithm ends. By applying the second algorithm, the resulting constellation C_best is the optimal constellation for the desired SNR value S.

Figure 27:
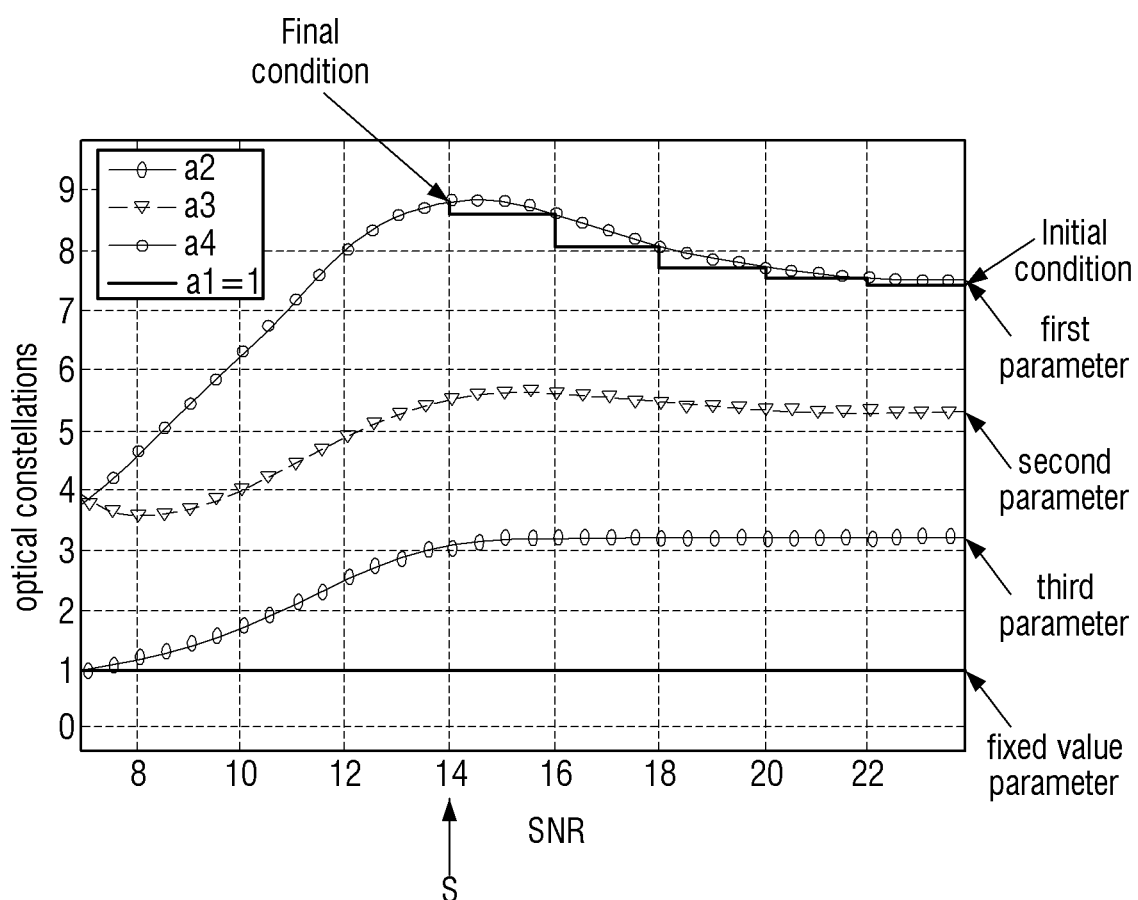
FIG. 27 illustrates the convergence of the constellation C_best as the second algorithm of FIG. 4 is performed, according to an exemplary embodiment.

FIG. 27 illustrates convergence of the constellation C_best according to the second algorithm of FIG. 26 is performed. Each of the three curves represents variation in the value of a respective one of the three variable parameters. The solid constant line represents the fixed value of a fixed parameter. As shown in FIG. 27, at the start of the second algorithm, starting from the right-hand side of FIG. 27, the SNR value is high and the constellation is a uniform constellation, as defined by the values of the parameters on the right-hand side of FIG. 27, labelled "Initial condition". At each iteration, an optimal constellation is obtained for the specific SNR value (indicated in FIG. 27 by the markers). The SNR is then reduced and the optimal constellation is obtained for the new SNR (this process being indicated for one of the parameters by the stepped line in FIG. 27). As shown in FIG. 27, the values of the parameters corresponding to the optimal constellation vary smoothly with varying SNR values. The iterations are repeated until the SNR value reaches the desired SNR value S.

By running the second algorithm illustrated in FIG. 26, an optimal constellation is derived from each of a set of SNR values. These constellations may be stored in association with the corresponding SNR values, for example in a look-up table.

Figure 28:
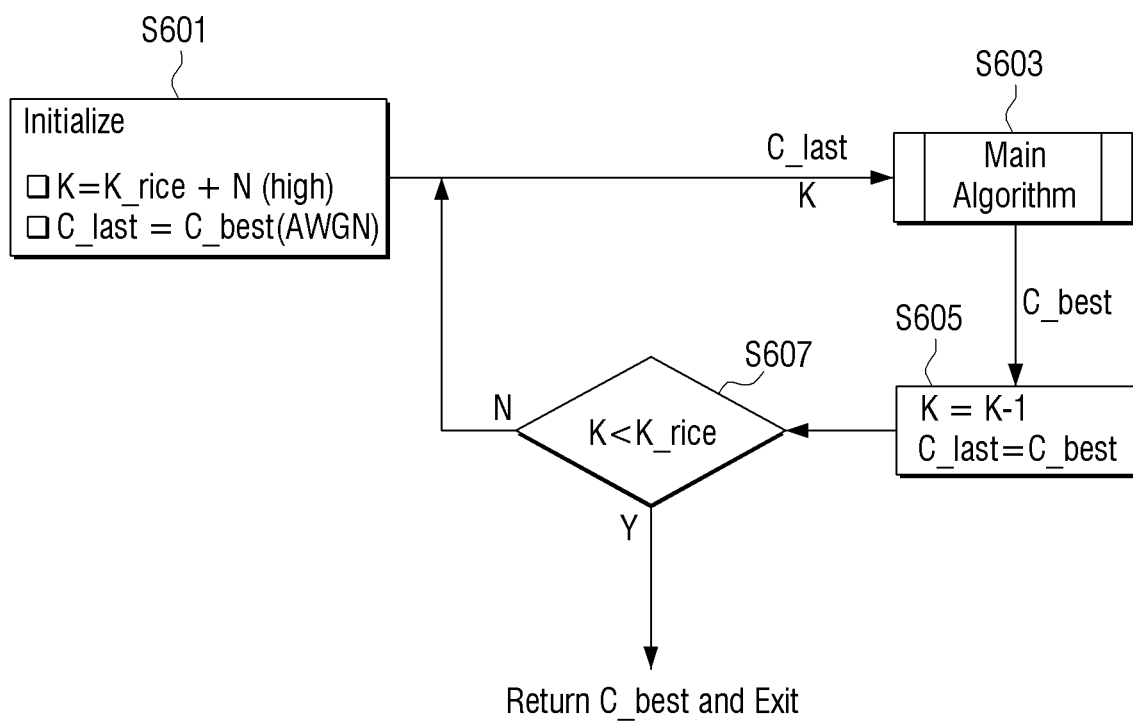
FIG. 28 illustrates a third algorithm according to an exemplary embodiment for determining the optimal constellation at a given SNR value S in a Rician fading channel for a desired Rician factor K_rice.

FIG. 28 illustrates a third algorithm for determining an optimal constellation at a given SNR value S in a Rician fading channel for a desired Rician factor K_rice. The Rician channel is given by:

$$\sqrt{\frac{K}{K+1}} + \sqrt{\frac{1}{K+1}} h \quad \text{[Equation 1]}$$

In Equation 1, K is the Rician factor and h is Rayleigh distributed (centred and normalised). Initially, the third algorithm applies the second algorithm described above to obtain the optimal constellation C_best at an SNR value S for an AWGN channel, C_best (AWGN). In operation 601, parameter C_last is initialised to C_best (AWGN). In operation 601, the Rician factor K is initialised to a high value, which may be determined theoretically and/or experimentally. For example, K may be initialised to a value K_rice+N, where N is large.

In operation 603, the first algorithm described above is run using the initialised constellation C_last as the input constellation and using the initialised Rician factor K to obtain an optimal constellation C_best. In operation 605, the Rician factor K is reduced by a certain amount, for example by one unit. In operation 605, C_last takes the value of C_best (i.e. so that the value of C_last in the next iteration is equal to the value of C_best in the current iteration). In operation 607 it is determined whether K<K_rice. If it is determined in operation 607 that K≥K_rice, then the method returns to operation 603, in which the first algorithm is run with new values of C_last and K. On the other hand, if it is determined in operation 607 that K<K_rice, then the value of C_best is saved and the algorithm ends. By applying the third algorithm, the resulting constellation C_best is the optimal constellation for the desired Rician factor K_rice.

Figure 29:
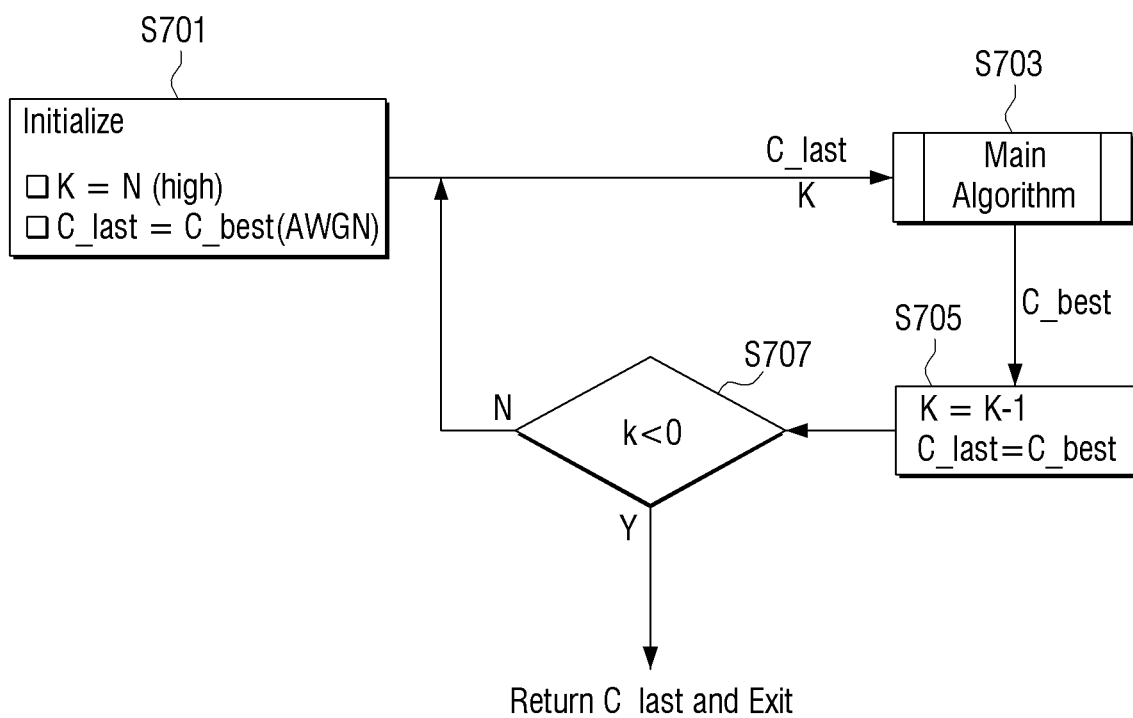
FIG. 29 illustrates a fourth algorithm according to an exemplary embodiment for determining the optimal constellation at a given SNR value S in a Rayleigh fading channel.

FIG. 29 illustrates a fourth algorithm for determining an optimal constellation at a given SNR value S in a Rayleigh fading channel. A Rayleigh fading channel is a special case of Rician fading with the Rician factor K=0. Accordingly, the fourth algorithm is the same as the third algorithm described above, except that K_rice is set to zero.

Table 4 below compares the number of capacity calculation function calls for obtaining optimal constellations for various constellation sizes (16-QAM, 64-QAM and 256-QAM) using an exhaustive search, a restricted exhaustive search and an algorithm according to the present embodiment. The values in Table 4 are based on a step size d of 0.0125 and maximum value for the parameters of 10. Table 4 also indicates a factor difference between using a restricted exhaustive search and a search using an algorithm according to the present embodiment. As can be seen, the algorithm according to the present embodiment is significantly more efficient, for example by a factor of $1.15 \times 10^{10}$ for 256-QAM.

TABLE 4

| | Exhaustive search | Restricted exhaustive search | Algorithm according to the present invention | Gain versus restricted |
| --- | --- | --- | --- | --- |
| 16QAM | 800 | 800 | 21 | 38 |
| 64QAM | 5.1e9 | 1.9e8 | 1701 | 117577 |
| 256QAM | 2.1e21 | 2.5e15 | 216513 | 1.15e10 |

In Table 4, the difference between the exhaustive search and the restrictive exhaustive search is as following. It is assumed in the following that there are 4 levels (parameters) between 0 and 10. In the exhaustive search, each of the 4 parameters is searched over the whole range [0-10] with a certain granularity. In the case of the restricted exhaustive search, the range in which each level will fall is fixed. For example level 1 (first parameter) will be in the range [0-2.5], level 2 in the range [2.5-5], level 3 in the range [5-7.5], level 4 in the range [7.5-10]. In this manner, the number of possibilities is reduced.

Figure 30:
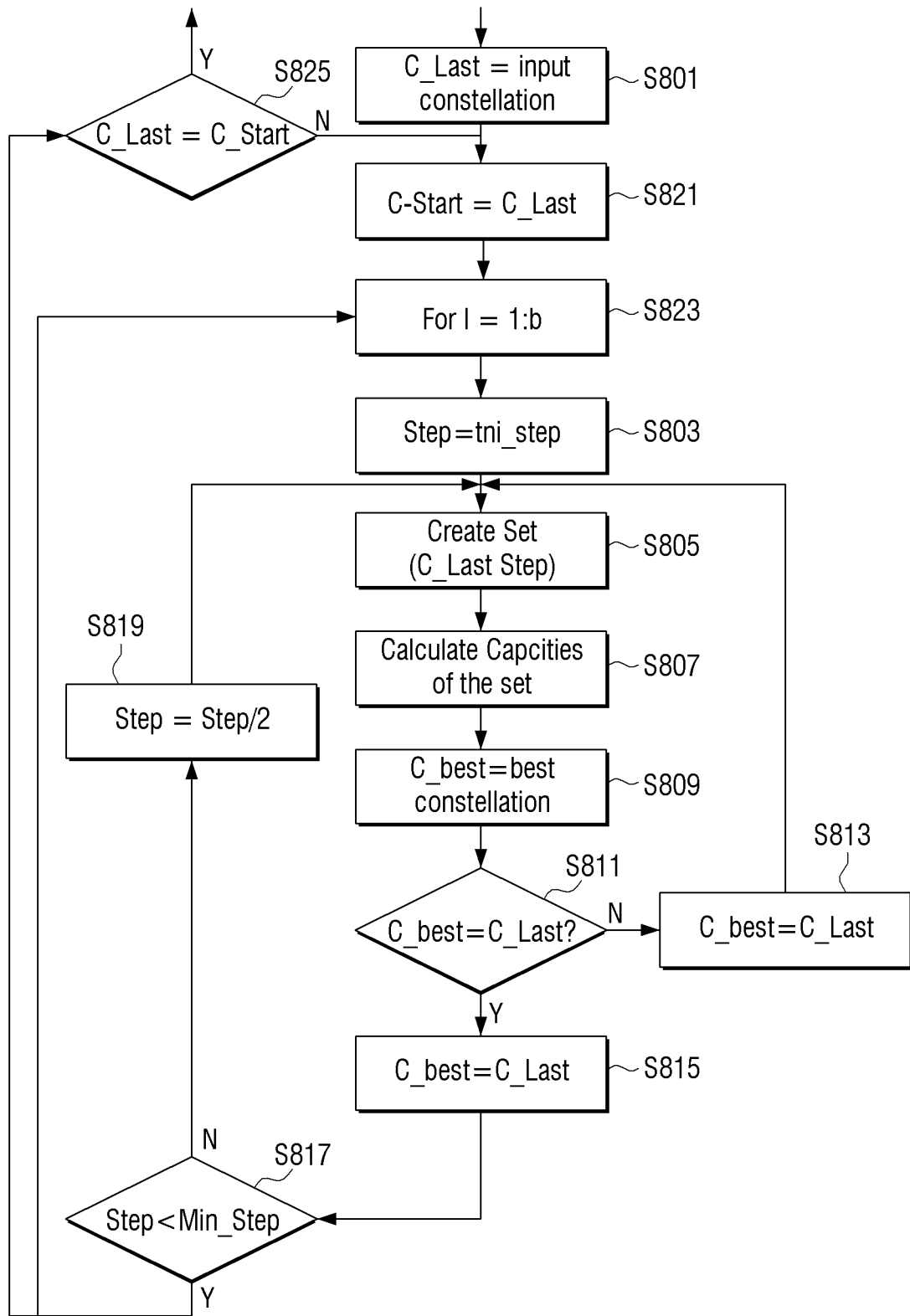
FIG. 30 illustrates a fifth algorithm according to an exemplary embodiment for determining an optimal constellation.

FIG. 30 illustrates a fifth algorithm for determining an optimal constellation. This algorithm corresponds closely to the algorithm illustrated in FIG. 24, but is modified to increase overall efficiency. This algorithm includes an inner loop for operations (operations 803-819) corresponding to operations 203-219 of FIG. 24. However, operation 805 for creating a set of candidate constellations is modified from the corresponding operation 205 of FIG. 24. Specifically, in the algorithm of FIG. 30, rather than modifying each of the b parameters and trying all combinations of the new parameters as in the algorithm of FIG. 24, only one parameter is modified at a time. For example, within one iteration of the inner loop 803-819, only one parameter (parameter i) is modified to produce a set of candidate constellation. The capacities of these constellations are calculated and the best constellation is selected, as in FIG. 24.

In the algorithm of FIG. 30, the value of i is varied from 1 to b using an outer loop (operations 821-825). The algorithm of FIG. 30 is initialised in operation 801, corresponding to operation 201 of FIG. 24. It can be seen that, by using the algorithm of FIG. 30, rather than the algorithm of FIG. 24, the total number of candidate constellation tried (i.e. the total number of capacity calculations) is significantly reduced. However, in simulations, the optimal constellation obtained using the algorithm of FIG. 30 is very close to the optimal constellation obtained using the algorithm of FIG. 24, which in turn is very close to the true optimal constellation obtained using an exhaustive search. The improvement in computational efficiency using the algorithms according to the above embodiments, when compared to an exhaustive search, increases as the constellation order increases.

As with the algorithm illustrated in FIG. 24, in certain exemplary embodiments, operations 817 and 819 of the algorithm illustrated in FIG. 30 may be omitted.

According to the above embodiments, optimal constellations may be obtained for particular parameters, for example SNR, Rician factor etc. These optimum constellations are obtained independently of any particular system implementation, for example independent of a particular coding scheme. In the following, various embodiments are described for obtaining an optimal constellation for a specific transmission system.

A transmission system may include a number of processes which may affect the optimal constellation, for example FEC encoding, bit interleaving, demultiplexing bits to cells, mapping cells to constellations, cell interleaving, constellation rotation, in-phase and quadrature phase (I/Q component interleaving, inter-frame convolution and inter-frame block interleaving, and multiple-inputs-single-output (MISO) precoding. A QAM mapper is used in the Bit Interleaved Coded Modulation (BICM) chain to map bits to symbols. The QAM mapper may use a uniform constellation to map bits to cells (for example as done in DVB-T2). However, an increase in capacity may be achieved by using a fixed non-uniform constellation. A non-fixed non-uniform constellation (e.g. QAM) may be used to further increase capacity. The BICM capacity depends on the bit to cell mapping used. Optimisations are desirable in the LDPC design, the QAM mapping and the mapping of bits to cells.

In certain exemplary embodiments, different constellations are generated using a certain step size. A bit error rate (BER), a block error rate and/or a packet error rate corresponding to the constellations are obtained, and the best constellation is selected based on one or more of the aforementioned error rates.

Figure 31:
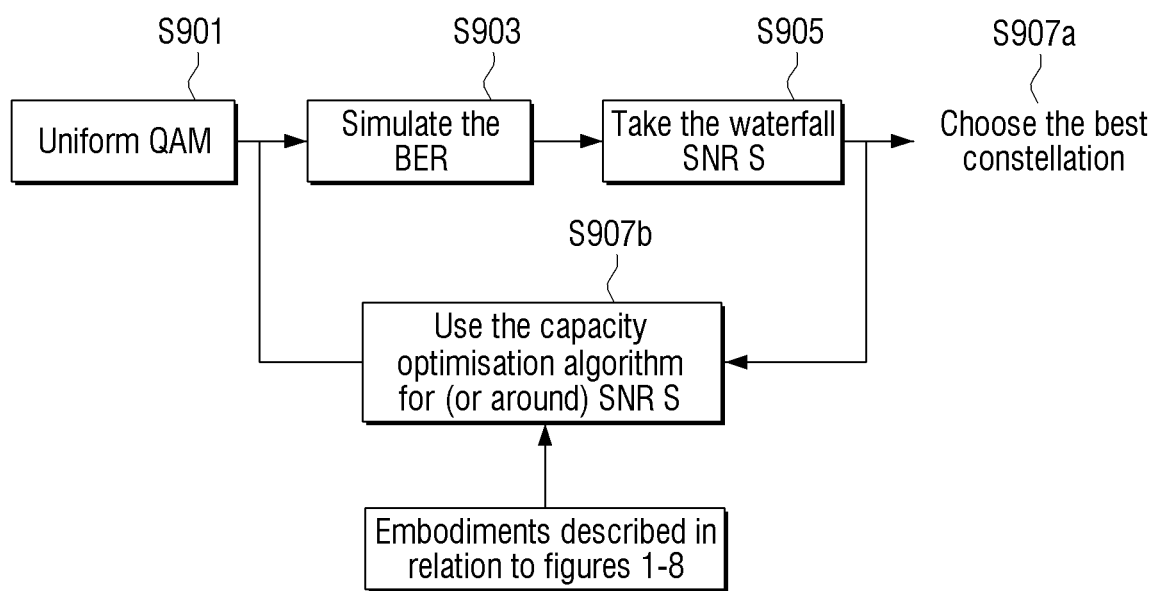
FIG. 31 illustrates a process for obtaining an optimal constellation for a specific system, according to an exemplary embodiment.
Figure 32:
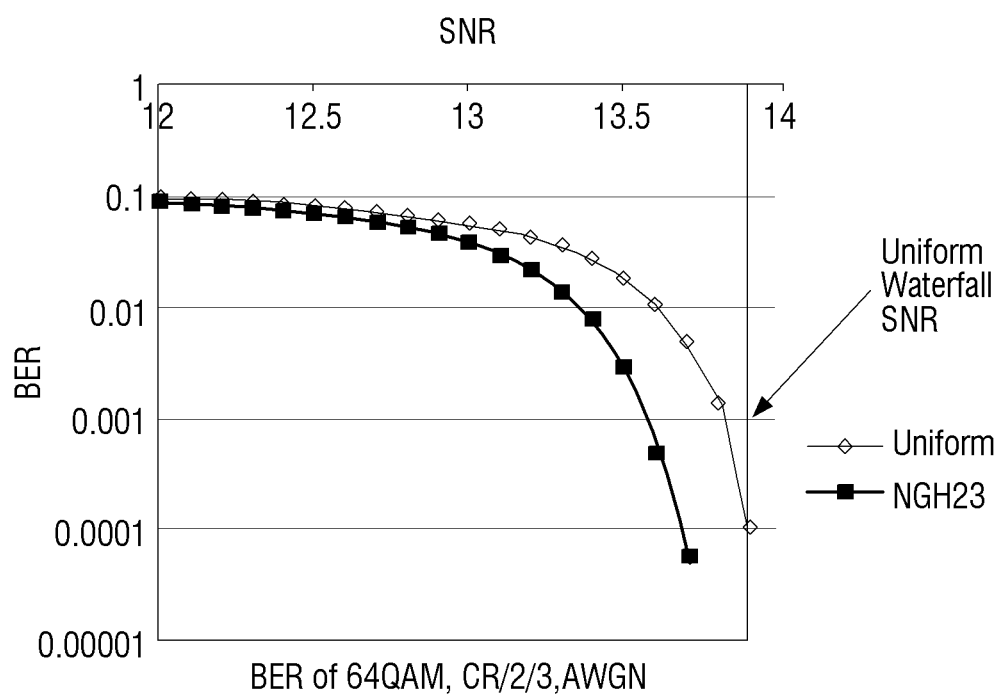
FIG. 32 illustrates an exemplary BER versus SNR plot for 64-QAM using a Low-Density Parity-Check, LDPC, coding rate (CR) of 2/3 from DVB-T2 in an AWGN channel, according to an exemplary embodiment.

In certain exemplary embodiments, the process illustrated in FIG. 31 may be carried out to obtain an optimal constellation for a specific system. In operation 901, a uniform constellation (e.g. uniform QAM) is selected. In operation 903, BER values for the selected uniform constellation are obtained over a range of SNR values (e.g. using simulation or by obtaining the BER values theoretically or experimentally). These values may be obtained based on a specific system, for example using a particular coding scheme (e.g. LDPC coding with a certain parity check matrix) with a certain coding rate and a certain bit interleaver and cell interleaver. FIG. 32 illustrates an exemplary plot for 64-QAM using an LDPC coding rate of 2/3 from DVB-T2 in an AWGN channel.

In operation 905, an SNR at which the BER falls below a threshold value (e.g. 0.001) is determined. The threshold value may be selected such that the resulting SNR falls within a "waterfall zone" of the BER curve (i.e. the zone at which the BER falls relatively rapidly with increasing SNR). The determined SNR value may be denoted S and referred to as a "waterfall" SNR.

Next, an optimal constellation may be obtained for the SNR value S determined in operation 905.

For example, in some exemplary embodiments, in operation 907a, an optimal constellation may be selected from optimal constellations obtained when performing the algorithms described above in relation to FIGS. 23-30 (and stored in a look-up table). Specifically, an optimal constellation previously determined for the SNR value S may be retrieved from the look-up table.

Alternatively, an iterative process may be performed to obtain an optimal (non-uniform) constellation. Specifically, after operation 905, the process moves to operation 907b in which the algorithms described above in relation to FIGS. 23-30 are used to obtain an optimal constellation for the SNR value S (or for a value close to S). After operation 907b, the process returns to operation 903, in which BER values are obtained over a range of SNR values. In this iteration, the BER values are obtained for the optimal constellation obtained in operation 907b (rather than for the initial uniform constellation as in the first iteration). In a similar manner as previously described, the SNR value at which the BER falls below a threshold value (using the new set of BER values for the optimal constellation) is determined in operation 905, and a new optimal constellation for the newly determined SNR value is obtain in operation 907b. The previously described operations 903, 905, 907 may be repeated a certain number of time (for example a predetermined number of times). Alternatively, the algorithm may terminate when the waterfall SNR stops decreasing between iterations, and instead starts increasing.

Figure 33:
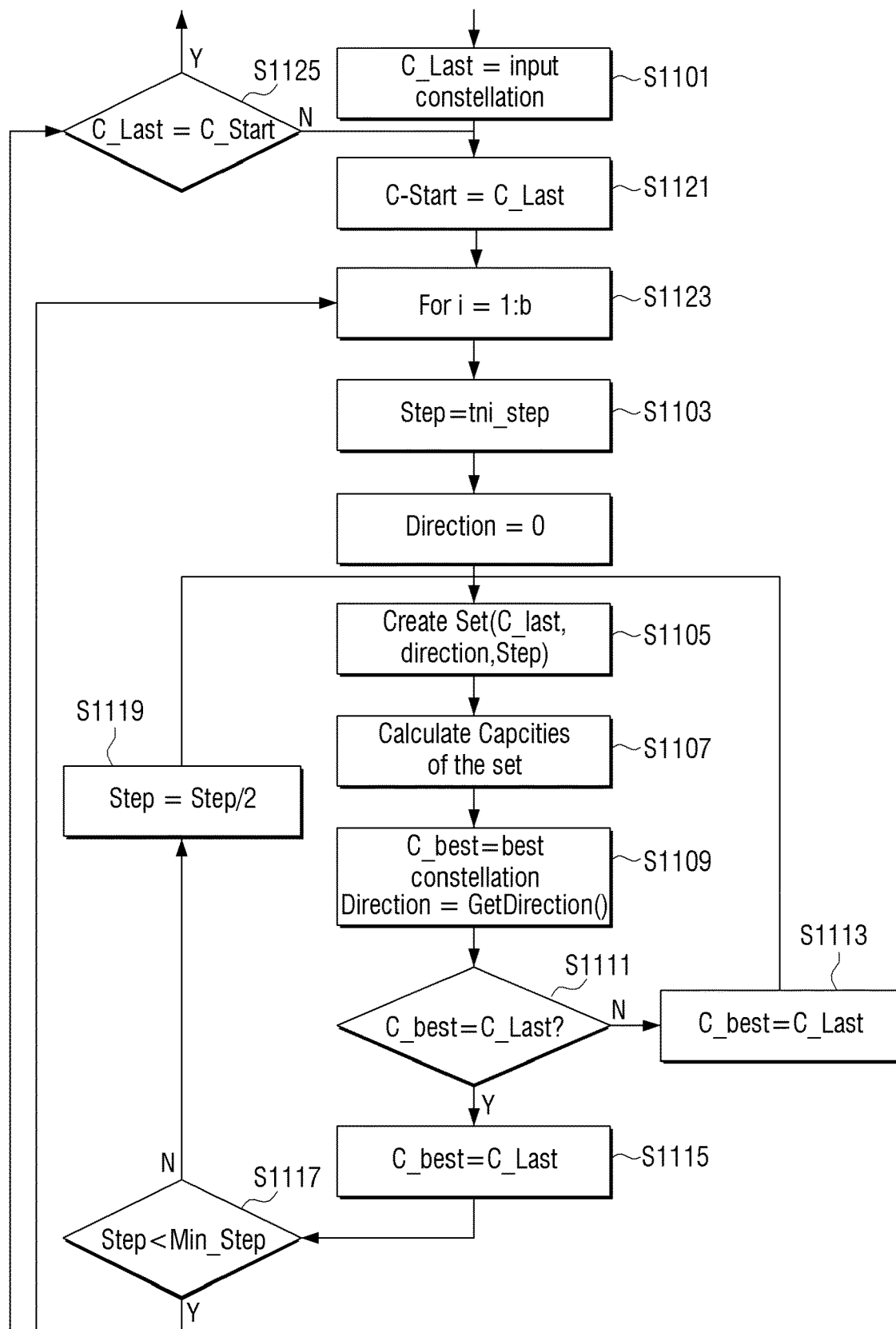
FIG. 33 illustrates a sixth algorithm according to an exemplary embodiment for determining an optimal constellation.

FIGS. 33 and 34 illustrate a sixth algorithm for determining an optimal constellation. This algorithm corresponds closely to the algorithm illustrated in FIG. 30, but is modified to improve performance. In particular, this algorithm introduces a concept of a direction of convergence of a parameter value. For example, within the inner loop of the algorithm, the direction is initialised to 0. When creating a set of candidate constellations, the candidate set depends on the direction parameter. When the best constellation is selected in operation 1109, the direction of convergence of the value of parameter i is obtained. For example, if the parameter value is converging upwards, then the direction parameter may be set to +1, if the parameter is converging downwards, then the direction parameter may be set to −1, and if the parameter does not change, then the direction parameter may be set to 0. As illustrated in FIG. 34, the number of candidate constellations may be reduced when the parameter value is converging upwards or downwards.

As described above, an optimum constellation may be obtained for a particular system implementation, and/or for certain system parameter values. For example, an optimum constellation (e.g. a constellation that optimises the BICM capacity) may be obtained for a certain propagation channel type (e.g. AWGN, Rayleigh or Typical Urban, TU6, channel) and for a certain SNR. However, in some cases, data may be transmitted in different scenarios. For example, data may be transmitted through different types of channels and may be received with different SNRs. Furthermore, it may be desirable or required that a data transmission system uses the same constellation, regardless of the scenario (e.g. channel type or SNR), for example in order to reduce system complexity. In some cases, a transmission system may use a certain constellation for many different scenarios (e.g. channel types and SNRs).

FIGS. 35-38B illustrate an algorithm for obtaining a constellation that is optimised (e.g. achieves the best capacity) with respect to two or more different scenarios (e.g. different channel types and/or SNR values). The algorithm includes a number of different parts. First, the waterfall SNR for each channel type (e.g. propagation channel type) is obtained using an algorithm similar to the algorithm illustrated in FIG. 31. A weighted performance measure function (e.g. weighted capacity) for an input constellation is defined, based on different scenarios (e.g. different channel types and SNR values). Then, an algorithm similar to the algorithms illustrated in FIG. 24, 30 or 33 is applied to determine an optimum constellation, where the performance measure is used based on the weighted performance measure.

Figure 35:
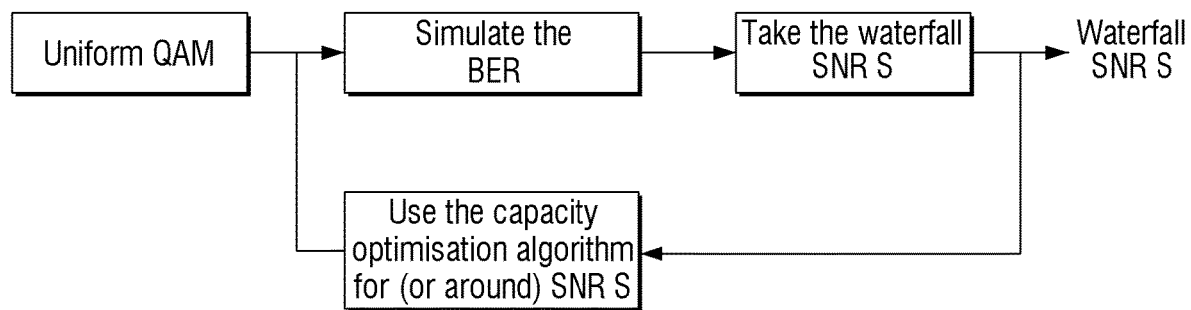
FIG. 35 illustrates a process for obtaining the waterfall SNR for a certain channel type according to an exemplary embodiment.

FIG. 35 illustrates a process for obtaining the waterfall SNR for each channel type. Each channel type is treated separately in order to obtain its waterfall SNR. In particular, the process illustrated in FIG. 35 is repeated for each channel type to obtain a respective waterfall SNR for that channel type. The process illustrated in FIG. 35 operates in substantially the same manner as the algorithm illustrated in FIG. 31, and therefore a detailed description will be omitted for conciseness. However, rather than outputting an optimal constellation, as in the algorithm illustrated in FIG. 31, the process illustrated in FIG. 35 instead outputs the waterfall SNR determined in the final iteration of the process. The process illustrated in FIG. 35 (including BER simulation and capacity optimisation operations) is performed based on a certain channel type, and the output waterfall SNR is determined as the waterfall SNR associated with that channel type.

Figure 36:
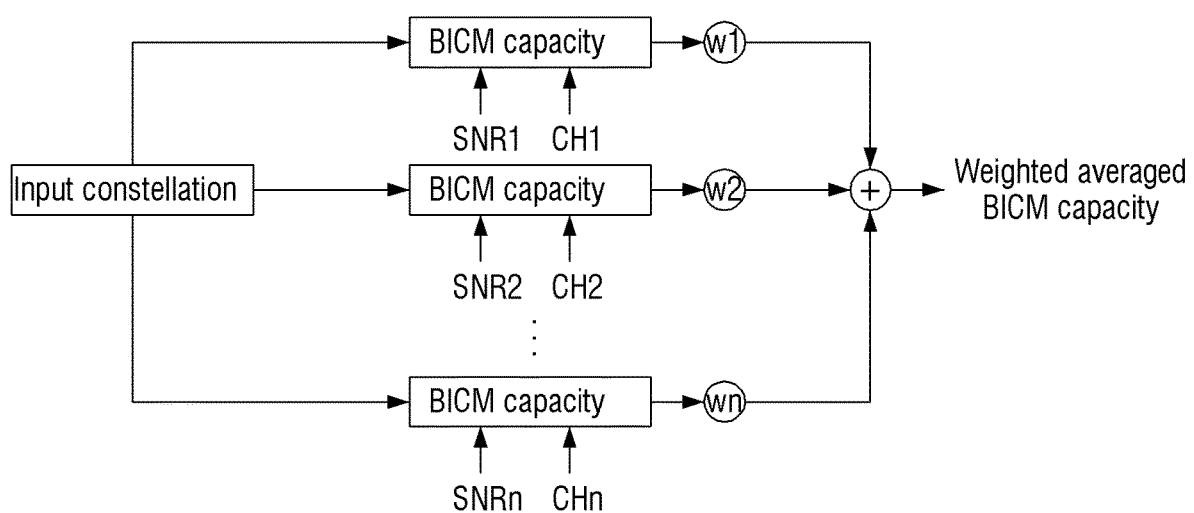
FIG. 36 schematically illustrates a process for obtaining a weighted performance measure function for an input constellation based on different transmission scenarios according to an exemplary embodiment.

FIG. 36 schematically illustrates a process for obtaining a weighted performance measure function for an input constellation based on different transmission scenarios. In this example, the weighted performance measure is a weighted capacity, and the different scenarios include different channel types and associated waterfall SNR values. As illustrated in FIG. 36, a candidate constellation is provided as an input. For each channel type and associated waterfall SNR, the BICM capacity for the input constellation based on the channel type and waterfall SNR is obtained. Each obtained BICM capacity is then multiplied by a respective weight and the weighted BICM capacities are added together to obtain an output weighted average BICM capacity. The weights may be selected according to any suitable criteria. For example, a relatively common or important channel type may be associated with a relatively large weight.

Figure 37:
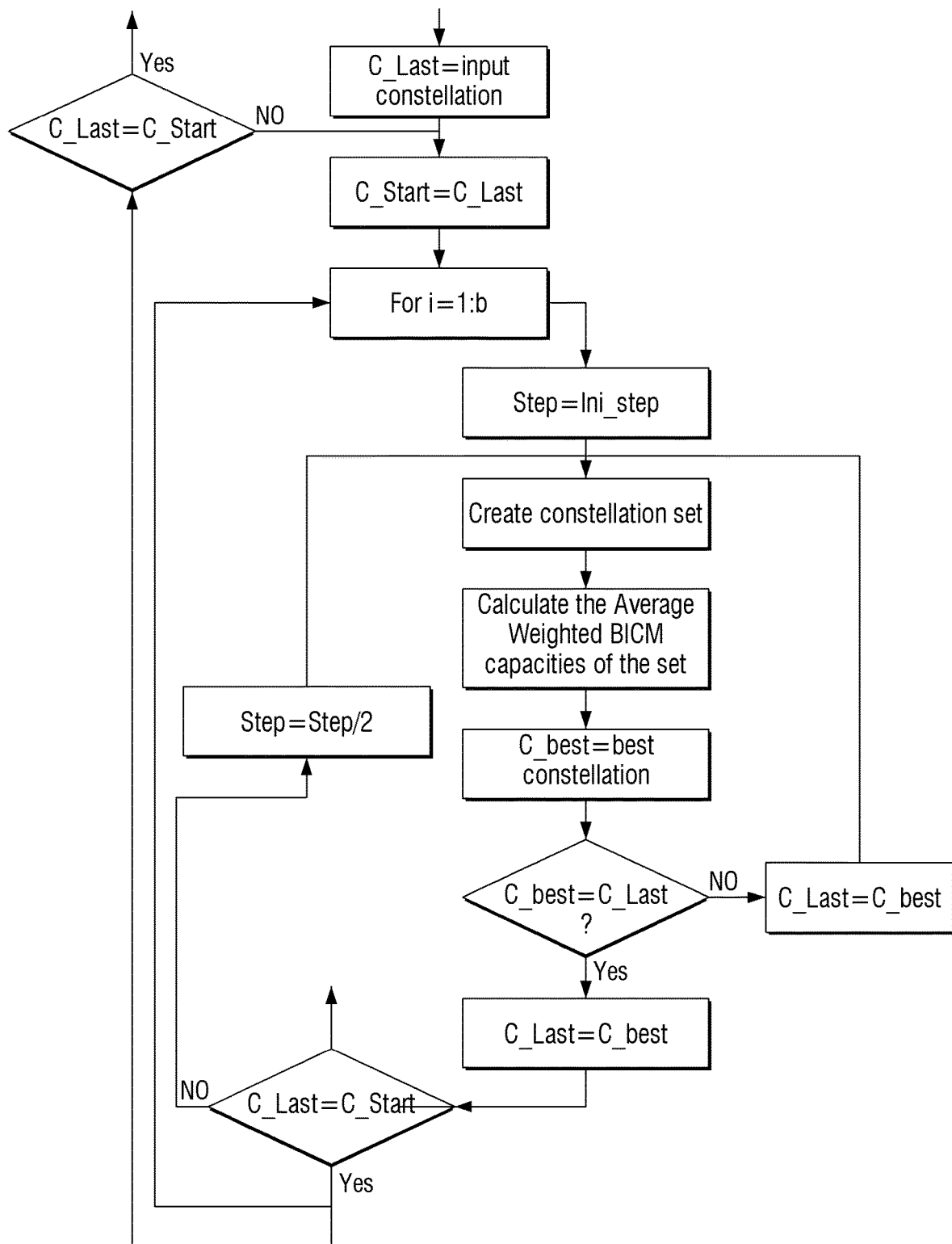
FIG. 37 illustrates a process for obtaining an optimum constellation according to an exemplary embodiment.

FIG. 37 illustrates a process for obtaining an optimum constellation. The process illustrated in FIG. 37 operates in substantially the same manner as the algorithm illustrated in FIG. 24, 30 or 33, and therefore a detailed description will be omitted for conciseness. However, when determining the performance of a candidate constellation in the process illustrated in FIG. 37, the performance is determined based on the weighted performance measure described above in relation to FIG. 36.

In the process illustrated in FIG. 37, in some situation, a certain constellation may achieve the best performance with respect to the weighted performance measure, even though the performance of that constellation with respect to the BICM capacity based on an individual channel and SNR may be relatively low. In certain exemplary embodiments, to ensure that a constellation obtained using the algorithm is able to achieve at least a certain level of performance for one or more, or all, transmission scenarios, an additional criterion may be applied when testing each candidate constellation to obtain the constellation C_best. Specifically, any candidate constellation that does not achieve at least a threshold performance with respect to one or more certain individual scenarios, or all scenarios, is ignored and cannot be selected as C_best, even if that constellation achieves the best performance with respect to the weighted performance measure.

Figure 38A:
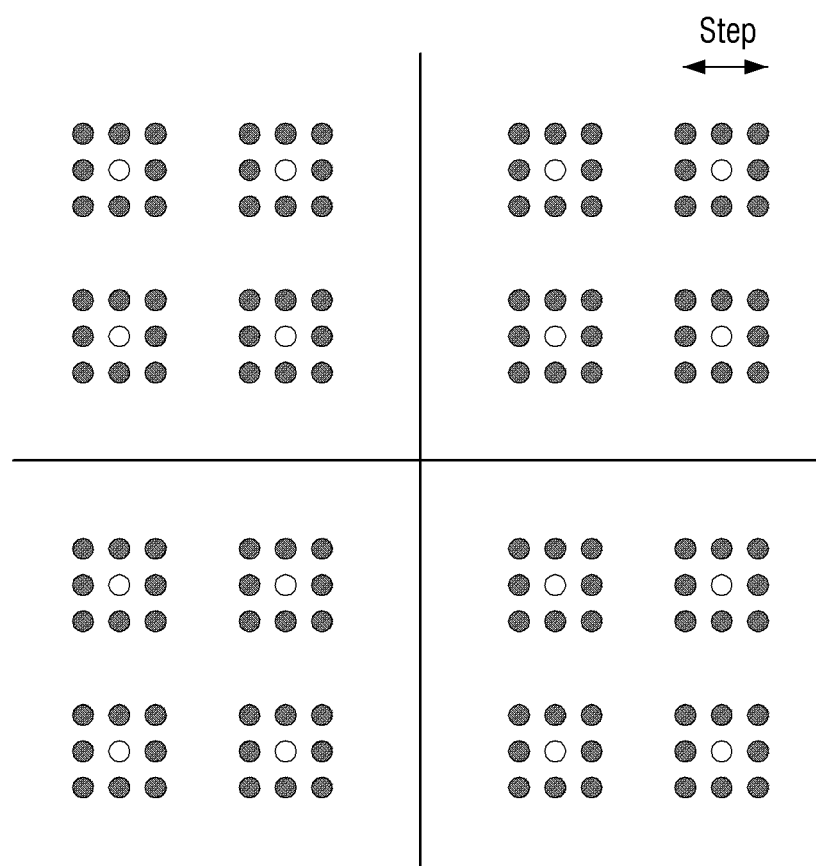
FIGS. 38A and 38B illustrate alternative schemes for generating a candidate constellation from a previous constellation according to exemplary embodiments.
Figure 38B:
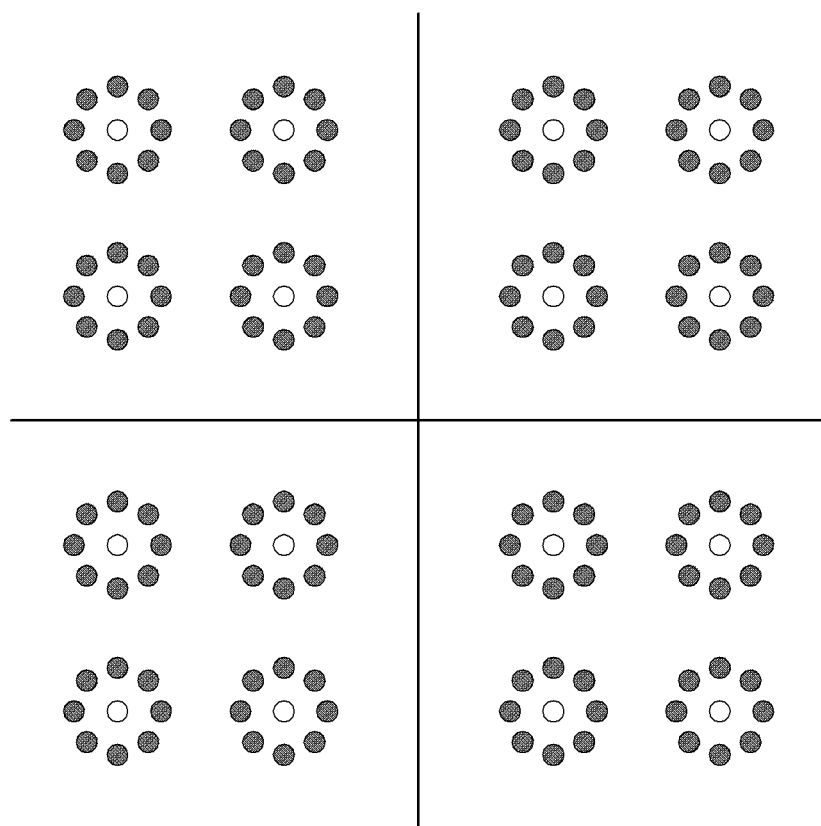

In the process illustrated in FIG. 37, a set of candidate constellations may be derived using any suitable method, for example the method described above in relation to FIG. 31 based on a step size d. FIGS. 38A and 38B illustrate alternative schemes for generating a candidate constellation from a previous constellation, C_last, that may be used in certain exemplary embodiments. In FIGS. 38A and 38B, the open circles represent the constellation points of a previous constellation, C_last. For each constellation point of the previous constellation, a respective set of N modified constellation points are defined, as indicated in FIGS. 38A and 38B as filled circles. Each set of modified constellation points forms a pattern of constellation points located relatively close to the respective constellation point of the previous constellation.

For example, as illustrated in FIG. 38A, each set of modified constellation points may form a square or rectangular lattice of N=8 constellation points surrounding a respective constellation point of the previous constellation. The lattice spacing is equal to d. Alternatively, as illustrated in FIG. 38B, each set of modified constellation points may form a ring of N=8 constellation points surrounding a respective constellation point of the previous constellation. The radius of the ring is equal to d.

A candidate constellation may be obtained by selecting, for each constellation point in the previous constellation, either the constellation point of the previous constellation itself or one of the constellation points of a respective set of modified constellation points.

In the examples described above, a weighted performance measure is defined based on different transmission scenarios. For example, in the case illustrated in FIG. 36, each transmission scenario includes a different channel type and an associated waterfall SNR value. Accordingly, a constellation optimised for a range of channel types and associated SNR values may be obtained. In an alternative embodiment, an optimal constellation may be obtained for different transmission scenarios, in the case where each transmission scenario includes the same channel type, but involves different SNR values (e.g. a set of SNR values S1, S1+d, S1+2d, S1+3d, . . . , S2, where d is a step size). That is, an optimal constellation may be obtained for a fixed channel type that is intended to be used over a range of SNR values.

In this case, the algorithm described above in relation to FIGS. 35-38B may be used, except that when determining the weighted performance measure as illustrated in FIG. 36, instead of determining individual BICM capacities based on respective channel types and associated waterfall SNR values, the individual BICM capacities are determined based on the fixed channel type and respective SNR values S1, S1+d, S1+2d, S1+3d, . . . , S2.

In the algorithms described above, a technique may be applied to reduce the overall complexity. In particular, when a set of candidate constellations is generated and the performance of the candidate constellations are tested, those candidate constellations that have been previously tested (i.e. in one or more previous iteration) are not re-tested. That is, in a current iteration, only those candidate constellations that have not been tested in previous iterations are tested.

For example, as described above, a first set of candidate constellations, A, is generated in an iteration, and the best performing candidate constellation, a (a∈A), is selected from this set. In a next iteration, a second set of candidate constellations, B, is generated based on the previously selected constellation a (a∈B). In this next iteration, the best performing candidate constellation b (b∈B) from set B needs to be determined.

Typically, there will be at least some overlap between the two sets of candidate constellations A and B, such that one or more candidate constellations belong to both sets A and B (i.e. A∩B≠∅), including constellation a. Since it is known that constellation a has the best performance of all the constellations in set A, then it is also known that constellation a has the best performance of all the constellations belonging to the overlap between sets A and B (i.e. A∩B).

Accordingly, when testing the constellations in set B to determine the best performing constellation, b, it is not necessary to re-test those constellations belonging to the overlap between sets A and B (i.e. it is not necessary to re-test those constellations in the set A∩B). Instead, rather than testing all constellations in set B, only those constellations belonging to the smaller set of constellations B*, including constellations belonging to set B but excluding any constellations that also belong to set A (i.e. B*=B−A) are tested. Then, the best performing constellation from the set formed from the union of B* and the previous best performing constellation, a (i.e. the best performing constellation from the set B*∪{a}) is selected as the best performing constellation, b, of set B.

Figure 39:
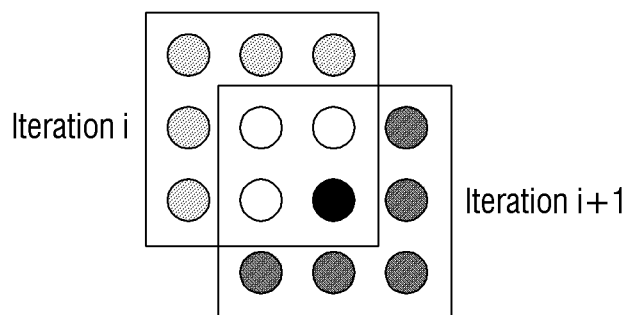
FIG. 39 illustrates a technique for reducing complexity according to an exemplary embodiment.

An example of the above principle in relation to the example shown in FIG. 38A is illustrated in FIG. 39. In the example of FIG. 39, at iteration i, it was found that the constellation point indicated as a black circle is the best performing constellation. At iteration i+1, there is no need to test the common subset (including the white circles and the black circle), because it was already tested before and gave an inferior performance. That is, at iteration i+1, only the dark grey circles need to be tested. Accordingly, in the illustrated example, a reduction in complexity of 44% (=4/9) is achieved.

FIG. 40 illustrates an apparatus for implementing an algorithm according to one or more of the embodiments described above. The apparatus is configured for generating a non-uniform constellation. The apparatus includes a block for performing a first process. The block for performing the first process includes: a block for obtaining a first constellation defined by one or more parameter values; and a block for generating a second constellation based on the first constellation using a second process. The block for generating the second constellation based on the first constellation using the second process includes: a block for obtaining a set of candidate constellations, wherein the set of candidate constellations includes the first constellation and one or more modified constellations, wherein each modified constellation is obtained by modifying the parameter values defining the first constellation; a block for determining performance of each candidate constellation according to a predetermined performance measure; and a block for selecting the candidate constellation having the best performance as the second constellation. The block for performing the first process further includes a block for determining a difference between the first constellation and the second constellation; and a block for, if the second constellation differs from the first constellation by more than a threshold amount, causing the block for performing the first process to repeat the first process using the second constellation generated in a current iteration of the first process as the first constellation in a next iteration.

The skilled person will appreciate that the functions of any two or more blocks illustrated in FIG. 40 may be performed by a single block, and that the functions of any block illustrated in FIG. 40 may be performed by two or more blocks. A block may be implemented in any suitable form, for example hardware, software, firmware, or any suitable combination of hardware, software and firmware.

A constellation obtained by a method according to the above exemplary embodiments may be used in a digital broadcasting system to transmit data from a transmitter side to a receiver side. In certain exemplary embodiments, the system includes a transmitter arranged to obtain data (e.g. a data stream), perform any required encoding and/or other processing of the data, modulate a signal using the data according to a modulation scheme corresponding to the constellation, and transmit the modulated signal. The system further includes a receiver configured to receive a modulated signal, demodulate the signal according to a demodulation scheme corresponding to the constellation (or a similar or corresponding constellation), and perform any necessary decoding and/or other processing to recover the original data. Certain exemplary embodiments may include a transmitter side apparatus only, a receiver side apparatus only, or a system including both a transmitter side apparatus and a receiver side apparatus.

In case of non-uniform constellations, it is possible to design constellations by relaxing only one constraint, i.e. by keeping a constellations square but changing a distance between constellation points. This form of non-uniform constellations (NUCs) can be referred to as one-dimensional (1D) NUCs. 1D NUCs can be described by the levels at which the constellations occur in the real positive part. The other points can be deduced by using the symmetry of the four quadrants as well as the real and imaginary symmetry. 1D-NUCs are simple to decode because of independence of the real and imaginary part. Two (2) pulse amplitude modulator (PAM) demappers can be used to decode 1D-NUCs.

It is possible to design a different type of NUC by relaxing both constraints: the square shape and the uniform distance between constellation points. Optimal constellations will have a tendency to look like a circular constellation. This type of NUC can be referred to as 2D-NUC. The 2D-NUC has a higher capacity than the 1D-NUC and a better BER/FER performance. However, performance of 2D-NUC comes at the expense of a more complex receiver demapper. Since the real and imaginary axes are not symmetrical, a 2D demapper is needed in order to decode a 2D-NUC constellation. In the case of 2D-NUC, a complete set of points need to be specified. It is possible to specify only the points belonging to the first quadrant and deduce the other points by supposing that the constellation is symmetrical.

Optimizing 1D and 2D NUCs depend on an SNR at which a capacity needs to be optimized. In the case of a BICM chain, an SNR can be selected to be a waterfall SNR of a BER/FER curve. The BER/FER waterfall can be defined as an SNR at which a BER curve falls below a certain level, for example 10e-6. The waterfall SNR depends on a coding rate of an LDPC encoder/decoder. As the code rate increases, the waterfall SNR increases. For this reason, a different NUC is associated with each LDPC encoder coding rate. The waterfall SNR also increases with a QAM constellation size (M). This is because the a receiver needs a higher SNR to decode a higher QAM constellation. Thus, a constellations size and a coding rate define the waterfall SNR. The waterfall SNR is used to optimize the constellations. Here, the coding rates include: 2/15, 3/15 and 4/15. The NUC sizes are: 16QAM, 64QAM, 256QAM and 1 K QAM. For the first three QAM sizes only 2D constellations are proposed. For 1K QAM both 1D and 2D constellations are proposed.

Hereinafter, an example of constellation points of a constellation obtained by applying the algorithms described above by coding rates will be described.

In the following exemplary embodiment, a restriction is added to the process of determining capacity according to SNR with respect to the existing NUC designing method.

When SNR is given, it is general to calculate the maximum transmission capacity which can be transmitted with error-free. In other words, when calculating capacity by setting SNR with respect to BER/FER waterfall, the SNR indicates an area where a bit error or a frame error occurs, but actual capacity indicates transmission capacity under error-free circumstances, and thus, there may be a contradiction.

Therefore, in the present disclosure, when calculating capacity with respect to the SNR, a correction factor is added.

For example, when SNR1 is decided with respect to CH1 in FIG. 23, if the capacity value under error-free state is C1, corrected C1 value, that is C1' is defined as shown below.

$$C1'=C1\times(1-H(P_b))$$ [Equation 2]

In this case, the reason why the value $(1-H(P_b))$ which is equal to or smaller than 1 is multiplied to the existing capacity value as indicated in Equation 2 is as shown below.

With respect to a case where a bit error occurs as much as the probability $P_b$ in a transmission channel, if it is assumed that a bit error as much as $P_b$ has been occurred before transmitting source information, and error does not occur while source information is being transmitted, there is no difference in terms of a bit error in the final transmitting/receiving end. As described above, when the probability of error occurrence regarding a channel is considered a loss of source information, there is an effect as if lossy compression is applied as much as $H(P_b)$ compared to given data, by the rate distortion theory of Shannon. That is, in conclusion, it can be considered that data amount which can be transmitted through firstly given channel, that is capacity, will be reduced compared to the channel $(1-H(P_b))$ without an error or loss.

When the same value is applied to all the channels which consider $P_b$ of FIG. 36, the same factor $(1-H(P_b))$ is multiplied, and thus, the same factor $(1-H(P_b))$ is multiplied to the value of weighted capacity. Accordingly, there is no difference in the constellation points of the optimized NUC. However, target BER may be different for each channel, and therefore, the order of size of weighted capacity can be different. Accordingly, the constellation points of optimized NUC can be different. For example, an AWGN channel is applied to a fixed device in general, and thus, very low BER is required. Therefore, when calculating capacity, BER=1e-8 may be considered. As Rayleigh channel is largely considered for a mobile channel which experiences fading, BER higher than that of AWGN channel is required. Thus, BER=1e-6 can be considered. As described above, if different BER requirements are set for respective channels, values of factor for final capacity become different, and therefore, this value may be different from the NUC constellation points which are obtained in consideration of capacity only without reflecting BER.

To be specific, Table 5 indicates values of constellation points of a normalized 2D NU 16-QAM constellation (2D 16NUC) which is obtained by applying the algorithms described above using respective coding rates 2/15, 3/15 and 4/15 for a single SNR value.

TABLE 5

| w/Shape | Coding Rate | | |
|---|---|---|---|
| | 2/15 | 3/15 | 4/15 |
| w0 | 0.707316 + 0.707473i | 0.709789 + 0.710216i | 1.10696 + 0.580648i |
| w1 | 0.707333 + 0.707367i | 0.705044 + 0.710131i | 0.581442 + 1.10703i |
| w2 | 0.706049 + 0.707738i | 0.709276 + 0.70389i | 0.552546 + 0.362564i |
| w3 | 0.706475 + 0.707102i | 0.704489 + 0.703976i | 0.362944 + 0.55265i |
| w4 | −0.707316 + 0.707473i | −0.709789 + 0.710216i | −1.10696 + 0.580648i |
| w5 | −0.707333 + 0.707367i | −0.705044 + 0.710131i | −0.581442 + 1.10703i |
| w6 | −0.706049 + 0.707738i | −0.709276 + 0.70389i | −0.552546 + 0.362564i |
| w7 | −0.706475 + 0.707102i | −0.704489 + 0.703976i | −0.362944 + 0.55265i |
| w8 | 0.707316 − 0.707473i | 0.709789 − 0.710216i | 1.10696 − 0.580648i |
| w9 | 0.707333 − 0.707367i | 0.705044 − 0.710131i | 0.581442 − 1.10703i |
| w10 | 0.706049 − 0.707738i | 0.709276 − 0.70389i | 0.552546 − 0.362564i |
| w11 | 0.706475 − 0.707102i | 0.704489 − 0.703976i | 0.362944 − 0.55265i |
| w12 | −0.707316 − 0.707473i | −0.709789 − 0.710216i | −1.10696 − 0.580648i |
| w13 | −0.707333 − 0.707367i | −0.705044 − 0.710131i | −0.581442 − 1.10703i |
| w14 | −0.706049 − 0.707738i | −0.709276 − 0.70389i | −0.552546 − 0.362564i |
| w15 | −0.706475 − 0.707102i | −0.704489 − 0.703976i | −0.362944 − 0.55265i |

Here, $P_b$ indicates a BER value which determines a waterfall area, and function H(x) indicates binary entropy function, $H(x)=-x\times\log_2(x)-(1-x)\times\log_2(1-x)$.

Figure 41:
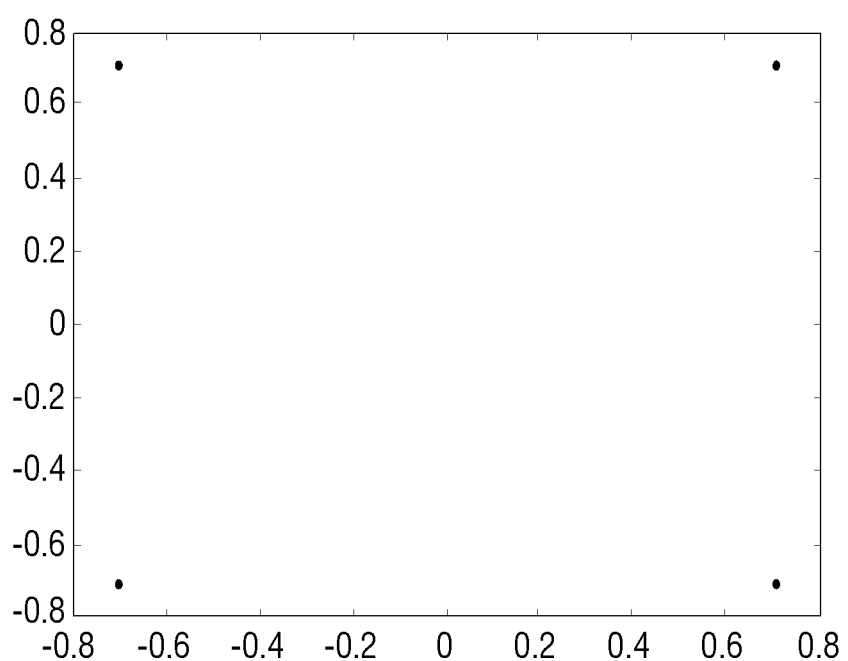
FIGS. 41 to 56 illustrate non uniform constellations according to various exemplary embodiments.
Figure 42:
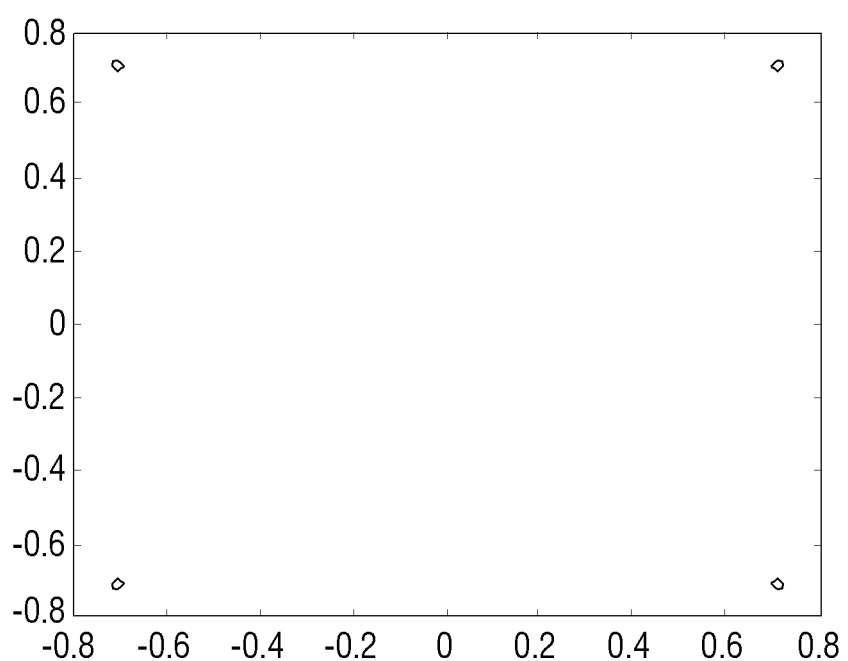
Figure 43:
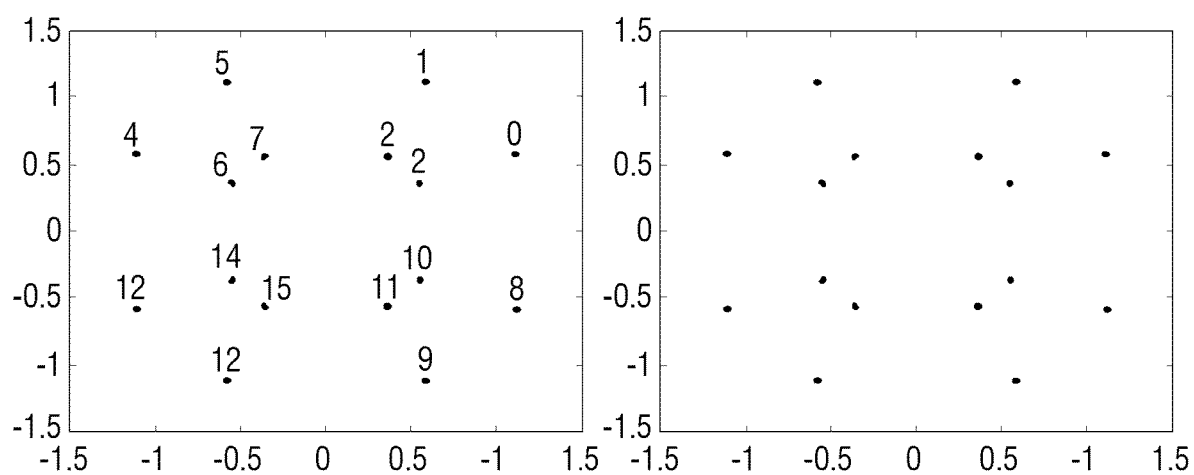

In this case, the constellation points of the 2D NU 16-QAM constellation for respective coding rates of 2/15 3/15, and 4/15 are indicated in FIGS. 41-43.

Table 6 indicates values of constellation points of a normalized 2D NU 64-QAM constellation (2D 64NUC) which is obtained by applying the algorithms described above using respective coding rates 2/15, 3/15 and 4/15 for a single SNR value.

Figure 44:
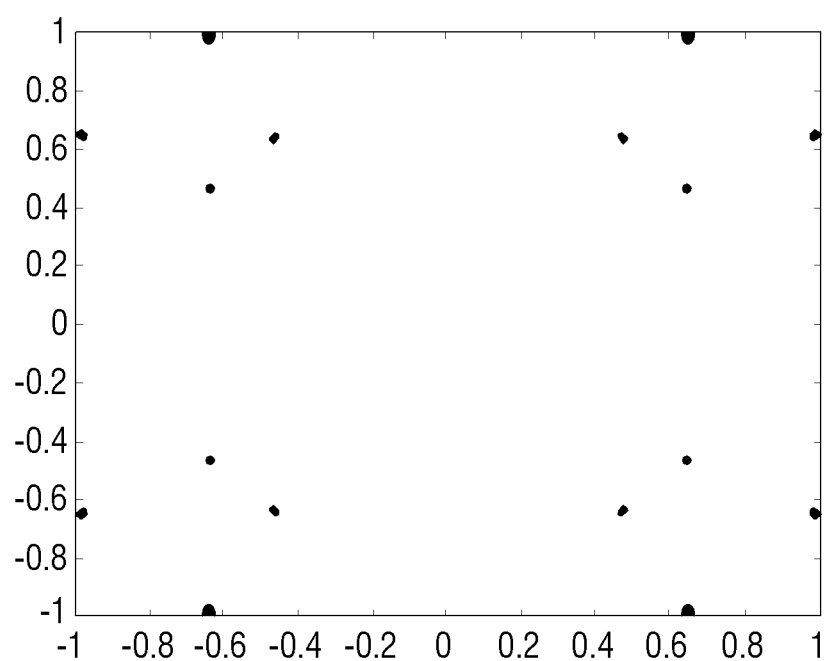
Figure 45:
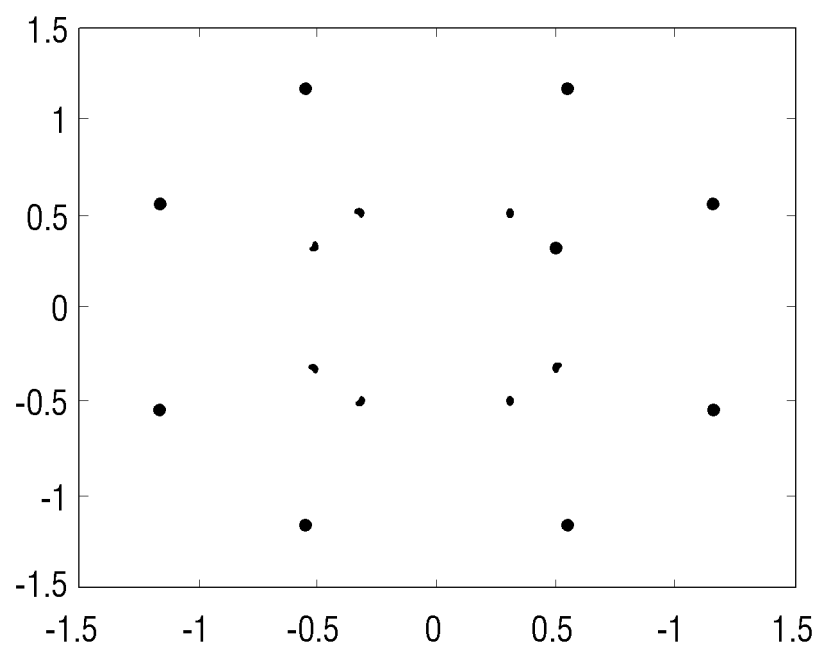
Figure 46:
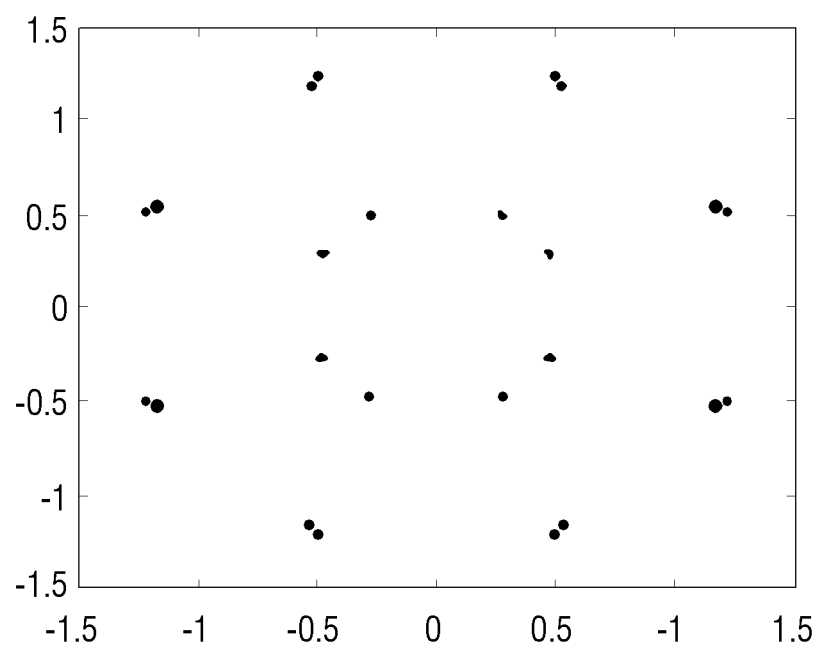

In this case, the constellation points of the 2D NU 64-QAM constellation for respective coding rates of 2/15, 3/15 and 4/15 are indicated in FIGS. 44-46.

Table 7 indicates values of constellation points of a normalized 2D NU 256-QAM constellation (2D 256NUC)

TABLE 6

| w/Shape | Coding Rate | | |
|---|---|---|---|
| | 2/15 | 3/15 | 4/15 |
| w0  | 0.647424 + 0.983083i  | 0.547191 + 1.15913i  | 0.500831 + 1.21361i |
| w1  | 0.643837 + 0.982885i  | 0.54734 + 1.15734i   | 0.499379 + 1.21941i |
| w2  | 0.647063 + 0.97668i   | 0.546743 + 1.15987i  | 0.531316 + 1.17151i |
| w3  | 0.644354 + 0.976223i  | 0.547937 + 1.15853i  | 0.529865 + 1.17877i |
| w4  | 0.983862 + 0.647524i  | 1.15778 + 0.547787i  | 1.2107 + 0.503734i |
| w5  | 0.977782 + 0.647422i  | 1.15763 + 0.547489i  | 1.22087 + 0.500831i |
| w6  | 0.983498 + 0.643369i  | 1.15913 + 0.547489i  | 1.17151 + 0.529865i |
| w7  | 0.977678 + 0.643265i  | 1.15913 + 0.547489i  | 1.18022 + 0.526961i |
| w8  | 0.465916 + 0.639338i  | 0.316261 + 0.507211i | 0.274368 + 0.476152i |
| w9  | 0.464253 + 0.63861i   | 0.316261 + 0.507211i | 0.272917 + 0.476152i |
| w10 | 0.466124 + 0.635284i  | 0.316261 + 0.507211i | 0.277272 + 0.479056i |
| w11 | 0.463941 + 0.634972i  | 0.316261 + 0.507211i | 0.277272 + 0.479056i |
| w12 | 0.637769 + 0.46706i   | 0.508702 + 0.316261i | 0.476152 + 0.272917i |
| w13 | 0.635171 + 0.467267i  | 0.508702 + 0.316261i | 0.476152 + 0.272917i |
| w14 | 0.638497 + 0.465604i  | 0.508702 + 0.316261i | 0.479056 + 0.277272i |
| w15 | 0.635275 + 0.465293i  | 0.508702 + 0.316261i | 0.479056 + 0.27582i |
| w16 | −0.647424 + 0.983083i | −0.547191 + 1.15913i | −0.500831 + 1.21361i |
| w17 | −0.643837 + 0.982885i | −0.54734 + 1.15734i  | −0.499379 + 1.21941i |
| w18 | −0.647063 + 0.97668i  | −0.546743 + 1.15987i | −0.531316 + 1.17151i |
| w19 | −0.644354 + 0.976223i | −0.547937 + 1.15853i | −0.529865 + 1.17877i |
| w20 | −0.983862 + 0.647524i | −1.15778 + 0.547787i | −1.2107 + 0.503734i |
| w21 | −0.977782 + 0.647422i | −1.15763 + 0.547489i | −1.22087 + 0.500831i |
| w22 | −0.983498 + 0.643369i | −1.15913 + 0.547489i | −1.17151 + 0.529865i |
| w23 | −0.977678 + 0.643265i | −1.15913 + 0.547489i | −1.18022 + 0.526961i |
| w24 | −0.465916 + 0.639338i | −0.316261 + 0.507211i | −0.274368 + 0.476152i |
| w25 | −0.464253 + 0.63861i  | −0.316261 + 0.507211i | −0.272917 + 0.476152i |
| w26 | −0.466124 + 0.635284i | −0.316261 + 0.507211i | −0.277272 + 0.479056i |
| w27 | −0.463941 + 0.634972i | −0.316261 + 0.507211i | −0.277272 + 0.479056i |
| w28 | −0.637769 + 0.46706i  | −0.508702 + 0.316261i | −0.476152 + 0.272917i |
| w29 | −0.635171 + 0.467267i | −0.508702 + 0.316261i | −0.476152 + 0.272917i |
| w30 | −0.638497 + 0.465604i | −0.508702 + 0.316261i | −0.479056 + 0.277272i |
| w31 | −0.635275 + 0.465293i | −0.508702 + 0.316261i | −0.479056 + 0.27582i |
| w32 | 0.647424 − 0.983083i  | 0.547191 − 1.15913i  | 0.500831 − 1.21361i |
| w33 | 0.643837 − 0.982885i  | 0.54734 − 1.15734i   | 0.499379 − 1.21941i |
| w34 | 0.647063 − 0.97668i   | 0.546743 − 1.15987i  | 0.531316 − 1.17151i |
| w35 | 0.644354 − 0.976223i  | 0.547937 − 1.15853i  | 0.529865 − 1.17877i |
| w36 | 0.983862 − 0.647524i  | 1.15778 − 0.547787i  | 1.2107 − 0.503734i |
| w37 | 0.977782 − 0.647422i  | 1.15763 − 0.547489i  | 1.22087 − 0.500831i |
| w38 | 0.983498 − 0.643369i  | 1.15913 − 0.547489i  | 1.17151 − 0.529865i |
| w39 | 0.977678 − 0.643265i  | 1.15913 − 0.547489i  | 1.18022 − 0.526961i |
| w40 | 0.465916 − 0.639338i  | 0.316261 − 0.507211i | 0.274368 − 0.476152i |
| w41 | 0.464253 − 0.63861i   | 0.316261 − 0.507211i | 0.272917 − 0.476152i |
| w42 | 0.466124 − 0.635284i  | 0.316261 − 0.507211i | 0.277272 − 0.479056i |
| w43 | 0.463941 − 0.634972i  | 0.316261 − 0.507211i | 0.277272 − 0.479056i |
| w44 | 0.637769 − 0.46706i   | 0.508702 − 0.316261i | 0.476152 − 0.272917i |
| w45 | 0.635171 − 0.467267i  | 0.508702 − 0.316261i | 0.476152 − 0.272917i |
| w46 | 0.638497 − 0.465604i  | 0.508702 − 0.316261i | 0.479056 − 0.277272i |
| w47 | 0.635275 − 0.465293i  | 0.508702 − 0.316261i | 0.479056 − 0.27582i |
| w48 | −0.647424 − 0.983083i | −0.547191 − 1.15913i | −0.500831 − 1.21361i |
| w49 | −0.643837 − 0.982885i | −0.54734 − 1.15734i  | −0.499379 − 1.21941i |
| w50 | −0.647063 − 0.97668i  | −0.546743 − 1.15987i | −0.531316 − 1.17151i |
| w51 | −0.644354 − 0.976223i | −0.547937 − 1.15853i | −0.529865 − 1.17877i |
| w52 | −0.983862 − 0.647524i | −1.15778 − 0.547787i | −1.2107 − 0.503734i |
| w53 | −0.977782 − 0.647422i | −1.15763 − 0.547489i | −1.22087 − 0.500831i |
| w54 | −0.983498 − 0.643369i | −1.15913 − 0.547489i | −1.17151 − 0.529865i |
| w55 | −0.977678 − 0.643265i | −1.15913 − 0.547489i | −1.18022 − 0.526961i |
| w56 | −0.465916 − 0.639338i | −0.316261 − 0.507211i | −0.274368 − 0.476152i |
| w57 | −0.464253 − 0.63861i  | −0.316261 − 0.507211i | −0.272917 − 0.476152i |
| w58 | −0.466124 − 0.635284i | −0.316261 − 0.507211i | −0.277272 − 0.479056i |
| w59 | −0.463941 − 0.634972i | −0.316261 − 0.507211i | −0.277272 − 0.479056i |
| w60 | −0.637769 − 0.46706i  | −0.508702 − 0.316261i | −0.476152 − 0.272917i |
| w61 | −0.635171 − 0.467267i | −0.508702 − 0.316261i | −0.476152 − 0.272917i |
| w62 | −0.638497 − 0.465604i | −0.508702 − 0.316261i | −0.479056 − 0.277272i |
| w63 | −0.635275 − 0.465293i | −0.508702 − 0.316261i | −0.479056 − 0.27582i | which is obtained by applying the algorithms described above using respective coding rates 2/15, 3/15 and 4/15 for a single SNR value.

TABLE 7

| w/Shape | Coding Rate | | |
|---|---|---|---|
| | 2/15 | 3/15 | 4/15 |
| w0 | 0.555322 + 1.12624i | 0.522922 + 1.18101i | 0.297463 + 1.05643i |
| w1 | 0.56728 + 1.13359i | 0.538432 + 1.16254i | 0.586177 + 0.96165i |
| w2 | 0.559308 + 1.12037i | 0.514797 + 1.1943i | 0.290901 + 1.06955i |
| w3 | 0.563576 + 1.13205i | 0.528831 + 1.1751i | 0.579615 + 0.968941i |
| w4 | 0.552505 + 1.12494i | 0.498548 + 1.22015i | 0.295276 + 1.33567i |
| w5 | 0.563704 + 1.13202i | 0.511105 + 1.19725i | 0.74876 + 1.23651i |
| w6 | 0.559846 + 1.11805i | 0.488947 + 1.23566i | 0.300379 + 1.51137i |
| w7 | 0.565901 + 1.1274i | 0.504457 + 1.21129i | 0.815106 + 1.3816i |
| w8 | 0.557904 + 1.1381i | 0.522183 + 1.18174i | 0.300379 + 1.05351i |
| w9 | 0.561681 + 1.14706i | 0.536955 + 1.16402i | 0.584718 + 0.963109i |
| w10 | 0.559343 + 1.13456i | 0.51332 + 1.19504i | 0.293088 + 1.06591i |
| w11 | 0.567186 + 1.14299i | 0.530308 + 1.1751i | 0.582531 + 0.966754i |
| w12 | 0.553299 + 1.13551i | 0.497071 + 1.22163i | 0.295276 + 1.3189i |
| w13 | 0.563201 + 1.14214i | 0.512582 + 1.19947i | 0.746573 + 1.21683i |
| w14 | 0.556748 + 1.13251i | 0.488208 + 1.23714i | 0.296005 + 1.46544i |
| w15 | 0.564101 + 1.13628i | 0.504457 + 1.21277i | 0.829688 + 1.35389i |
| w16 | 1.13089 + 0.559658i | 1.17953 + 0.525138i | 1.06372 + 0.296005i |
| w17 | 1.14052 + 0.565983i | 1.16254 + 0.538432i | 0.96165 + 0.581073i |
| w18 | 1.13482 + 0.558817i | 1.19135 + 0.51332i | 1.0732 + 0.293088i |
| w19 | 1.14905 + 0.563844i | 1.17436 + 0.529569i | 0.968212 + 0.581802i |
| w20 | 1.12445 + 0.561493i | 1.22089 + 0.499287i | 1.36191 + 0.29965i |
| w21 | 1.13332 + 0.562675i | 1.20021 + 0.514797i | 1.22485 + 0.754593i |
| w22 | 1.12837 + 0.557788i | 1.23418 + 0.488208i | 1.54272 + 0.310586i |
| w23 | 1.14364 + 0.563576i | 1.21424 + 0.505196i | 1.39691 + 0.852289i |
| w24 | 1.11959 + 0.562018i | 1.18027 + 0.522922i | 1.06153 + 0.294546i |
| w25 | 1.13468 + 0.566507i | 1.16402 + 0.53991i | 0.963109 + 0.581802i |
| w26 | 1.13792 + 0.56113i | 1.19208 + 0.51332i | 1.07101 + 0.292359i |
| w27 | 1.14396 + 0.563832i | 1.17584 + 0.530308i | 0.967483 + 0.582531i |
| w28 | 1.12214 + 0.559424i | 1.22089 + 0.497071i | 1.32546 + 0.297463i |
| w29 | 1.13182 + 0.568564i | 1.20243 + 0.514797i | 1.19787 + 0.749489i |
| w30 | 1.13018 + 0.56189i | 1.23492 + 0.488947i | 1.45596 + 0.304024i |
| w31 | 1.13855 + 0.566158i | 1.21498 + 0.504457i | 1.32692 + 0.841353i |
| w32 | 0.33943 + 0.53805i | 0.274017 + 0.477129i | 0.249344 + 0.558472i |
| w33 | 0.339746 + 0.53604i | 0.276233 + 0.480084i | 0.296005 + 0.534412i |
| w34 | 0.33867 + 0.532417i | 0.273278 + 0.475652i | 0.244969 + 0.541703i |
| w35 | 0.340014 + 0.533493i | 0.274756 + 0.477868i | 0.287256 + 0.519102i |
| w36 | 0.337373 + 0.530582i | 0.270324 + 0.474175i | 0.20487 + 0.392243i |
| w37 | 0.340506 + 0.534252i | 0.27254 + 0.476391i | 0.217264 + 0.380577i |
| w38 | 0.337911 + 0.532417i | 0.269585 + 0.472698i | 0.199038 + 0.375474i |
| w39 | 0.340014 + 0.531704i | 0.271801 + 0.474914i | 0.210703 + 0.364538i |
| w40 | 0.339652 + 0.536975i | 0.274017 + 0.477868i | 0.249344 + 0.55993i |
| w41 | 0.339968 + 0.53832i | 0.275494 + 0.479345i | 0.297463 + 0.535141i |
| w42 | 0.338133 + 0.534696i | 0.27254 + 0.475652i | 0.244969 + 0.54389i |
| w43 | 0.338179 + 0.534743i | 0.274756 + 0.477868i | 0.288714 + 0.521289i |
| w44 | 0.337864 + 0.534158i | 0.271063 + 0.473436i | 0.205599 + 0.393701i |
| w45 | 0.338939 + 0.533177i | 0.27254 + 0.476391i | 0.218723 + 0.382035i |
| w46 | 0.34019 + 0.534696i | 0.269585 + 0.471959i | 0.199767 + 0.376203i |
| w47 | 0.338449 + 0.533983i | 0.271063 + 0.474175i | 0.212161 + 0.366725i |
| w48 | 0.534965 + 0.33943i | 0.477129 + 0.274017i | 0.560659 + 0.248615i |
| w49 | 0.536309 + 0.339746i | 0.478607 + 0.276233i | 0.538058 + 0.296005i |
| w50 | 0.534205 + 0.338939i | 0.476391 + 0.27254i | 0.54389 + 0.24424i |
| w51 | 0.538366 + 0.337957i | 0.477129 + 0.274756i | 0.522018 + 0.286527i |
| w52 | 0.532907 + 0.336344i | 0.473436 + 0.270324i | 0.390784 + 0.20487i |
| w53 | 0.532955 + 0.338717i | 0.475652 + 0.27254i | 0.381306 + 0.217264i |
| w54 | 0.53112 + 0.338939i | 0.473436 + 0.269585i | 0.374016 + 0.199767i |
| w55 | 0.533223 + 0.337957i | 0.474175 + 0.271063i | 0.365267 + 0.209974i |
| w56 | 0.531342 + 0.339652i | 0.477129 + 0.274017i | 0.564304 + 0.248615i |
| w57 | 0.532417 + 0.339968i | 0.477868 + 0.276233i | 0.540974 + 0.296734i |
| w58 | 0.533936 + 0.34019i | 0.476391 + 0.27254i | 0.547536 + 0.243511i |
| w59 | 0.53604 + 0.340506i | 0.477129 + 0.274756i | 0.525663 + 0.287985i |
| w60 | 0.528525 + 0.339652i | 0.474175 + 0.270324i | 0.393701 + 0.20487i |
| w61 | 0.531658 + 0.337911i | 0.474914 + 0.27254i | 0.384952 + 0.218723i |
| w62 | 0.531879 + 0.338133i | 0.473436 + 0.269585i | 0.376203 + 0.199767i |
| w63 | 0.532686 + 0.339477i | 0.474914 + 0.271063i | 0.368912 + 0.211432i |
| w64 | −0.555322 + 1.12624i | −0.522922 + 1.18101i | −0.297463 + 1.05643i |
| w65 | −0.56728 + 1.13359i | −0.538432 + 1.16254i | −0.586177 + 0.96165i |
| w66 | −0.559308 + 1.12037i | −0.514797 + 1.1943i | −0.290901 + 1.06955i |
| w67 | −0.563576 + 1.13205i | −0.528831 + 1.1751i | −0.579615 + 0.968941i |
| w68 | −0.552505 + 1.12494i | −0.498548 + 1.22015i | −0.295276 + 1.33567i |
| w69 | −0.563704 + 1.13202i | −0.511105 + 1.19725i | −0.74876 + 1.23651i |
| w70 | −0.559846 + 1.11805i | −0.488947 + 1.23566i | −0.300379 + 1.51137i |

TABLE 7-continued

| | Coding Rate | | |
|---|---|---|---|
| w/Shape | 2/15 | 3/15 | 4/15 |
| w71 | −0.565901 + 1.1274i | −0.504457 + 1.21129i | −0.815106 + 1.3816i |
| w72 | −0.557904 + 1.1381i | −0.522183 + 1.18174i | −0.300379 + 1.05351i |
| w73 | −0.561681 + 1.14706i | −0.536955 + 1.16402i | −0.584718 + 0.963109i |
| w74 | −0.559343 + 1.13456i | −0.51332 + 1.19504i | −0.293088 + 1.06591i |
| w75 | −0.567186 + 1.14299i | −0.530308 + 1.1751i | −0.582531 + 0.966754i |
| w76 | −0.553299 + 1.13551i | −0.497071 + 1.22163i | −0.295276 + 1.3189i |
| w77 | −0.563201 + 1.14214i | −0.512582 + 1.19947i | −0.746573 + 1.21683i |
| w78 | −0.556748 + 1.13251i | −0.488208 + 1.23714i | −0.296005 + 1.46544i |
| w79 | −0.564101 + 1.13628i | −0.504457 + 1.21277i | −0.829688 + 1.35389i |
| w80 | −1.13089 + 0.559658i | −1.17953 + 0.525138i | −1.06372 + 0.296005i |
| w81 | −1.14052 + 0.565983i | −1.16254 + 0.538432i | −0.96165 + 0.581073i |
| w82 | −1.13482 + 0.558817i | −1.19135 + 0.51332i | −1.0732 + 0.293088i |
| w83 | −1.14905 + 0.563844i | −1.17436 + 0.529569i | −0.968212 + 0.581802i |
| w84 | −1.12445 + 0.561493i | −1.22089 + 0.499287i | −1.36191 + 0.29965i |
| w85 | −1.13332 + 0.562675i | −1.20021 + 0.514797i | −1.22485 + 0.754593i |
| w86 | −1.12837 + 0.557788i | −1.23418 + 0.488208i | −1.54272 + 0.310586i |
| w87 | −1.14364 + 0.563576i | −1.21424 + 0.505196i | −1.39691 + 0.852289i |
| w88 | −1.11959 + 0.562018i | −1.18027 + 0.522922i | −1.06153 + 0.294546i |
| w89 | −1.13468 + 0.566507i | −1.16402 + 0.53991i | −0.963109 + 0.581802i |
| w90 | −1.13792 + 0.56113i | −1.19208 + 0.51332i | −1.07101 + 0.292359i |
| w91 | −1.14396 + 0.563832i | −1.17584 + 0.530308i | −0.967483 + 0.582531i |
| w92 | −1.12214 + 0.559424i | −1.22089 + 0.497071i | −1.32546 + 0.297463i |
| w93 | −1.13182 + 0.568564i | −1.20243 + 0.514797i | −1.19787 + 0.749489i |
| w94 | −1.13018 + 0.56189i | −1.23492 + 0.488947i | −1.45596 + 0.304024i |
| w95 | −1.13855 + 0.566158i | −1.21498 + 0.504457i | −1.32692 + 0.841353i |
| w96 | −0.33943 + 0.53805i | −0.274017 + 0.477129i | −0.249344 + 0.558472i |
| w97 | −0.339746 + 0.53604i | −0.276233 + 0.480084i | −0.296005 + 0.534412i |
| w98 | −0.33867 + 0.532417i | −0.273278 + 0.475652i | −0.244969 + 0.541703i |
| w99 | −0.340014 + 0.533493i | −0.274756 + 0.477868i | −0.287256 + 0.519102i |
| w100 | −0.337373 + 0.530582i | −0.270324 + 0.474175i | −0.20487 + 0.392243i |
| w101 | −0.340506 + 0.534252i | −0.27254 + 0.476391i | −0.217264 + 0.380577i |
| w102 | −0.337911 + 0.532417i | −0.269585 + 0.472698i | −0.199038 + 0.375474i |
| w103 | −0.340014 + 0.531704i | −0.271801 + 0.474914i | −0.210703 + 0.364538i |
| w104 | −0.339652 + 0.536975i | −0.274017 + 0.477868i | −0.249344 + 0.55993i |
| w105 | −0.339968 + 0.53832i | −0.275494 + 0.479345i | −0.297463 + 0.535141i |
| w106 | −0.338133 + 0.534696i | −0.27254 + 0.475652i | −0.244969 + 0.54389i |
| w107 | −0.338179 + 0.534743i | −0.274756 + 0.477868i | −0.288714 + 0.521289i |
| w108 | −0.337864 + 0.534158i | −0.271063 + 0.473436i | −0.205599 + 0.393701i |
| w109 | −0.338939 + 0.533177i | −0.27254 + 0.476391i | −0.218723 + 0.382035i |
| w110 | −0.34019 + 0.534696i | −0.269585 + 0.471959i | −0.199767 + 0.376203i |
| w111 | −0.338449 + 0.533983i | −0.271063 + 0.474175i | −0.212161 + 0.366725i |
| w112 | −0.534965 + 0.33943i | −0.477129 + 0.274017i | −0.560659 + 0.248615i |
| w113 | −0.536309 + 0.339746i | −0.478607 + 0.276233i | −0.538058 + 0.296005i |
| w114 | −0.534205 + 0.338939i | −0.476391 + 0.27254i | −0.54389 + 0.24424i |
| w115 | −0.538366 + 0.337957i | −0.477129 + 0.274756i | −0.522018 + 0.286527i |
| w116 | −0.532907 + 0.336344i | −0.473436 + 0.270324i | −0.390784 + 0.20487i |
| w117 | −0.532955 + 0.338717i | −0.475652 + 0.27254i | −0.381306 + 0.217264i |
| w118 | −0.53112 + 0.338939i | −0.473436 + 0.269585i | −0.374016 + 0.199767i |
| w119 | −0.533223 + 0.337957i | −0.474175 + 0.271063i | −0.365267 + 0.209974i |
| w120 | −0.531342 + 0.339652i | −0.477129 + 0.274017i | −0.564304 + 0.248615i |
| w121 | −0.532417 + 0.339968i | −0.477868 + 0.276233i | −0.540974 + 0.296734i |
| w122 | −0.533936 + 0.34019i | −0.476391 + 0.27254i | −0.547536 + 0.243511i |
| w123 | −0.53604 + 0.340506i | −0.477129 + 0.274756i | −0.525663 + 0.287985i |
| w124 | −0.528525 + 0.339652i | −0.474175 + 0.270324i | −0.393701 + 0.20487i |
| w125 | −0.531658 + 0.337911i | −0.474914 + 0.27254i | −0.384952 + 0.218723i |
| w126 | −0.531879 + 0.338133i | −0.473436 + 0.269585i | −0.376203 + 0.199767i |
| w127 | −0.532686 + 0.339477i | −0.474914 + 0.271063i | −0.368912 + 0.211432i |
| w128 | 0.555322 − 1.12624i | 0.522922 − 1.18101i | 0.297463 − 1.05643i |
| w129 | 0.56728 − 1.13359i | 0.538432 − 1.16254i | 0.586177 − 0.96165i |
| w130 | 0.559308 − 1.12037i | 0.514797 − 1.1943i | 0.290901 − 1.06955i |
| w131 | 0.563576 − 1.13205i | 0.528831 − 1.1751i | 0.579615 − 0.968941i |
| w132 | 0.552505 − 1.12494i | 0.498548 − 1.22015i | 0.295276 − 1.33567i |
| w133 | 0.563704 − 1.13202i | 0.511105 − 1.19725i | 0.74876 − 1.23651i |
| w134 | 0.559846 − 1.11805i | 0.488947 − 1.23566i | 0.300379 − 1.51137i |
| w135 | 0.565901 − 1.1274i | 0.504457 − 1.21129i | 0.815106 − 1.3816i |
| w136 | 0.557904 − 1.1381i | 0.522183 − 1.18174i | 0.300379 − 1.05351i |
| w137 | 0.561681 − 1.14706i | 0.536955 − 1.16402i | 0.584718 − 0.963109i |
| w138 | 0.559343 − 1.13456i | 0.51332 − 1.19504i | 0.293088 − 1.06591i |
| w139 | 0.567186 − 1.14299i | 0.530308 − 1.1751i | 0.582531 − 0.966754i |
| w140 | 0.553299 − 1.13551i | 0.497071 − 1.22163i | 0.295276 − 1.3189i |
| w141 | 0.563201 − 1.14214i | 0.512582 − 1.19947i | 0.746573 − 1.21683i |
| w142 | 0.556748 − 1.13251i | 0.488208 − 1.23714i | 0.296005 − 1.46544i |
| w143 | 0.564101 − 1.13628i | 0.504457 − 1.21277i | 0.829688 − 1.35389i |
| w144 | 1.13089 − 0.559658i | 1.17953 − 0.525138i | 1.06372 − 0.296005i |
| w145 | 1.14052 − 0.565983i | 1.16254 − 0.538432i | 0.96165 − 0.581073i |
| w146 | 1.13482 − 0.558817i | 1.19135 − 0.51332i | 1.0732 − 0.293088i |

TABLE 7-continued

| | Coding Rate | | |
|---|---|---|---|
| w/Shape | 2/15 | 3/15 | 4/15 |
| w147 | 1.14905 − 0.563844i | 1.17436 − 0.529569i | 0.968212 − 0.581802i |
| w148 | 1.12445 − 0.561493i | 1.22089 − 0.499287i | 1.36191 − 0.29965i |
| w149 | 1.13332 − 0.562675i | 1.20021 − 0.514797i | 1.22485 − 0.754593i |
| w150 | 1.12837 − 0.557788i | 1.23418 − 0.488208i | 1.54272 − 0.310586i |
| w151 | 1.14364 − 0.563576i | 1.21424 − 0.505196i | 1.39691 − 0.852289i |
| w152 | 1.11959 − 0.562018i | 1.18027 − 0.522922i | 1.06153 − 0.294546i |
| w153 | 1.13468 − 0.566507i | 1.16402 − 0.53991i | 0.963109 − 0.581802i |
| w154 | 1.13792 − 0.56113i | 1.19208 − 0.51332i | 1.07101 − 0.292359i |
| w155 | 1.14396 − 0.563832i | 1.17584 − 0.530308i | 0.967483 − 0.582531i |
| w156 | 1.12214 − 0.559424i | 1.22089 − 0.497071i | 1.32546 − 0.297463i |
| w157 | 1.13182 − 0.568564i | 1.20243 − 0.514797i | 1.19787 − 0.749489i |
| w158 | 1.13018 − 0.56189i | 1.23492 − 0.488947i | 1.45596 − 0.304024i |
| w159 | 1.13855 − 0.566158i | 1.21498 − 0.504457i | 1.32692 − 0.841353i |
| w160 | 0.33943 − 0.53805i | 0.274017 − 0.477129i | 0.249344 − 0.558472i |
| w161 | 0.339746 − 0.53604i | 0.276233 − 0.480084i | 0.296005 − 0.534412i |
| w162 | 0.33867 − 0.532417i | 0.273278 − 0.475652i | 0.244969 − 0.541703i |
| w163 | 0.340014 − 0.533493i | 0.274756 − 0.477868i | 0.287256 − 0.519102i |
| w164 | 0.337373 − 0.530582i | 0.270324 − 0.474175i | 0.20487 − 0.392243i |
| w165 | 0.340506 − 0.534252i | 0.27254 − 0.476391i | 0.217264 − 0.380577i |
| w166 | 0.337911 − 0.532417i | 0.269585 − 0.472698i | 0.199038 − 0.375474i |
| w167 | 0.340014 − 0.531704i | 0.271801 − 0.474914i | 0.210703 − 0.364538i |
| w168 | 0.339652 − 0.536975i | 0.274017 − 0.477868i | 0.249344 − 0.55993i |
| w169 | 0.339968 − 0.53832i | 0.275494 − 0.479345i | 0.297463 − 0.535141i |
| w170 | 0.338133 − 0.534696i | 0.27254 − 0.475652i | 0.244969 − 0.54389i |
| w171 | 0.338179 − 0.534743i | 0.274756 − 0.477868i | 0.288714 − 0.521289i |
| w172 | 0.337864 − 0.534158i | 0.271063 − 0.473436i | 0.205599 − 0.393701i |
| w173 | 0.338939 − 0.533177i | 0.27254 − 0.476391i | 0.218723 − 0.382035i |
| w174 | 0.34019 − 0.534696i | 0.269585 − 0.471959i | 0.199767 − 0.376203i |
| w175 | 0.338449 − 0.533983i | 0.271063 − 0.474175i | 0.212161 − 0.366725i |
| w176 | 0.534965 − 0.33943i | 0.477129 − 0.274017i | 0.560659 − 0.248615i |
| w177 | 0.536309 − 0.339746i | 0.478607 − 0.276233i | 0.538058 − 0.296005i |
| w178 | 0.534205 − 0.338939i | 0.476391 − 0.27254i | 0.54389 − 0.24424i |
| w179 | 0.538366 − 0.337957i | 0.477129 − 0.274756i | 0.522018 − 0.286527i |
| w180 | 0.532907 − 0.336344i | 0.473436 − 0.270324i | 0.390784 − 0.20487i |
| w181 | 0.532955 − 0.338717i | 0.475652 − 0.27254i | 0.381306 − 0.217264i |
| w182 | 0.53112 − 0.338939i | 0.473436 − 0.269585i | 0.374016 − 0.199767i |
| w183 | 0.533223 − 0.337957i | 0.474175 − 0.271063i | 0.365267 − 0.209974i |
| w184 | 0.531342 − 0.339652i | 0.477129 − 0.274017i | 0.564304 − 0.248615i |
| w185 | 0.532417 − 0.339968i | 0.477868 − 0.276233i | 0.540974 − 0.296734i |
| w186 | 0.533936 − 0.34019i | 0.476391 − 0.27254i | 0.547536 − 0.243511i |
| w187 | 0.53604 − 0.340506i | 0.477129 − 0.274756i | 0.525663 − 0.287985i |
| w188 | 0.528525 − 0.339652i | 0.474175 − 0.270324i | 0.393701 − 0.20487i |
| w189 | 0.531658 − 0.337911i | 0.474914 − 0.27254i | 0.384952 − 0.218723i |
| w190 | 0.531879 − 0.338133i | 0.473436 − 0.269585i | 0.376203 − 0.199767i |
| w191 | 0.532686 − 0.339477i | 0.474914 − 0.271063i | 0.368912 − 0.211432i |
| w192 | −0.555322 − 1.12624i | −0.522922 − 1.18101i | −0.297463 − 1.05643i |
| w193 | −0.56728 − 1.13359i | −0.538432 − 1.16254i | −0.586177 − 0.96165i |
| w194 | −0.559308 − 1.12037i | −0.514797 − 1.1943i | −0.290901 − 1.06955i |
| w195 | −0.563576 − 1.13205i | −0.528831 − 1.1751i | −0.579615 − 0.968941i |
| w196 | −0.552505 − 1.12494i | −0.498548 − 1.22015i | −0.295276 − 1.33567i |
| w197 | −0.563704 − 1.13202i | −0.511105 − 1.19725i | −0.74876 − 1.23651i |
| w198 | −0.559846 − 1.11805i | −0.488947 − 1.23566i | −0.300379 − 1.51137i |
| w199 | −0.565901 − 1.1274i | −0.504457 − 1.21129i | −0.815106 − 1.3816i |
| w200 | −0.557904 − 1.1381i | −0.522183 − 1.18174i | −0.300379 − 1.05351i |
| w201 | −0.561681 − 1.14706i | −0.536955 − 1.16402i | −0.584718 − 0.963109i |
| w202 | −0.559343 − 1.13456i | −0.51332 − 1.19504i | −0.293088 − 1.06591i |
| w203 | −0.567186 − 1.14299i | −0.530308 − 1.1751i | −0.582531 − 0.966754i |
| w204 | −0.553299 − 1.13551i | −0.497071 − 1.22163i | −0.295276 − 1.3189i |
| w205 | −0.563201 − 1.14214i | −0.512582 − 1.19947i | −0.746573 − 1.21683i |
| w206 | −0.556748 − 1.13251i | −0.488208 − 1.23714i | −0.296005 − 1.46544i |
| w207 | −0.564101 − 1.13628i | −0.504457 − 1.21277i | −0.829688 − 1.35389i |
| w208 | −1.13089 − 0.559658i | −1.17953 − 0.525138i | −1.06372 − 0.296005i |
| w209 | −1.14052 − 0.565983i | −1.16254 − 0.538432i | −0.96165 − 0.581073i |
| w210 | −1.13482 − 0.558817i | −1.19135 − 0.51332i | −1.0732 − 0.293088i |
| w211 | −1.14905 − 0.563844i | −1.17436 − 0.529569i | −0.968212 − 0.581802i |
| w212 | −1.12445 − 0.561493i | −1.22089 − 0.499287i | −1.36191 − 0.29965i |
| w213 | −1.13332 − 0.562675i | −1.20021 − 0.514797i | −1.22485 − 0.754593i |
| w214 | −1.12837 − 0.557788i | −1.23418 − 0.488208i | −1.54272 − 0.310586i |
| w215 | −1.14364 − 0.563576i | −1.21424 − 0.505196i | −1.39691 − 0.852289i |
| w216 | −1.11959 − 0.562018i | −1.18027 − 0.522922i | −1.06153 − 0.294546i |
| w217 | −1.13468 − 0.566507i | −1.16402 − 0.53991i | −0.963109 − 0.581802i |
| w218 | −1.13792 − 0.56113i | −1.19208 − 0.51332i | −1.07101 − 0.292359i |
| w219 | −1.14396 − 0.563832i | −1.17584 − 0.530308i | −0.967483 − 0.582531i |
| w220 | −1.12214 − 0.559424i | −1.22089 − 0.497071i | −1.32546 − 0.297463i |
| w221 | −1.13182 − 0.568564i | −1.20243 − 0.514797i | −1.19787 − 0.749489i |
| w222 | −1.13018 − 0.56189i | −1.23492 − 0.488947i | −1.45596 − 0.304024i |

TABLE 7-continued

| w/Shape | Coding Rate | | |
|---|---|---|---|
| | 2/15 | 3/15 | 4/15 |
| w223 | −1.13855 − 0.566158i | −1.21498 − 0.504457i | −1.32692 − 0.841353i |
| w224 | −0.33943 − 0.53805i | −0.274017 − 0.477129i | −0.249344 − 0.558472i |
| w225 | −0.339746 − 0.53604i | −0.276233 − 0.480084i | −0.296005 − 0.534412i |
| w226 | −0.33867 − 0.532417i | −0.273278 − 0.475652i | −0.244969 − 0.541703i |
| w227 | −0.340014 − 0.533493i | −0.274756 − 0.477868i | −0.287256 − 0.519102i |
| w228 | −0.337373 − 0.530582i | −0.270324 − 0.474175i | −0.20487 − 0.392243i |
| w229 | −0.340506 − 0.534252i | −0.27254 − 0.476391i | −0.217264 − 0.380577i |
| w230 | −0.337911 − 0.532417i | −0.269585 − 0.472698i | −0.199038 − 0.375474i |
| w231 | −0.340014 − 0.531704i | −0.271801 − 0.474914i | −0.210703 − 0.364538i |
| w232 | −0.339652 − 0.536975i | −0.274017 − 0.477868i | −0.249344 − 0.55993i |
| w233 | −0.339968 − 0.53832i | −0.275494 − 0.479345i | −0.297463 − 0.535141i |
| w234 | −0.338133 − 0.534696i | −0.27254 − 0.475652i | −0.244969 − 0.54389i |
| w235 | −0.338179 − 0.534743i | −0.274756 − 0.477868i | −0.288714 − 0.521289i |
| w236 | −0.337864 − 0.534158i | −0.271063 − 0.473436i | −0.205599 − 0.393701i |
| w237 | −0.338939 − 0.533177i | −0.27254 − 0.476391i | −0.218723 − 0.382035i |
| w238 | −0.34019 − 0.534696i | −0.269585 − 0.471959i | −0.199767 − 0.376203i |
| w239 | −0.338449 − 0.533983i | −0.271063 − 0.474175i | −0.212161 − 0.366725i |
| w240 | −0.534965 − 0.33943i | −0.477129 − 0.274017i | −0.560659 − 0.248615i |
| w241 | −0.536309 − 0.339746i | −0.478607 − 0.276233i | −0.538058 − 0.296005i |
| w242 | −0.534205 − 0.338939i | −0.476391 − 0.27254i | −0.54389 − 0.24424i |
| w243 | −0.538366 − 0.337957i | −0.477129 − 0.274756i | −0.522018 − 0.286527i |
| w244 | −0.532907 − 0.336344i | −0.473436 − 0.270324i | −0.390784 − 0.20487i |
| w245 | −0.532955 − 0.338717i | −0.475652 − 0.27254i | −0.381306 − 0.217264i |
| w246 | −0.53112 − 0.338939i | −0.473436 − 0.269585i | −0.374016 − 0.199767i |
| w247 | −0.533223 − 0.337957i | −0.474175 − 0.271063i | −0.365267 − 0.209974i |
| w248 | −0.531342 − 0.339652i | −0.477129 − 0.274017i | −0.564304 − 0.248615i |
| w249 | −0.532417 − 0.339968i | −0.477868 − 0.276233i | −0.540974 − 0.296734i |
| w250 | −0.533936 − 0.34019i | −0.476391 − 0.27254i | −0.547536 − 0.243511i |
| w251 | −0.53604 − 0.340506i | −0.477129 − 0.274756i | −0.525663 − 0.287985i |
| w252 | −0.528525 − 0.339652i | −0.474175 − 0.270324i | −0.393701 − 0.20487i |
| w253 | −0.531658 − 0.337911i | −0.474914 − 0.27254i | −0.384952 − 0.218723i |
| w254 | −0.531879 − 0.338133i | −0.473436 − 0.269585i | −0.376203 − 0.199767i |
| w255 | −0.532686 − 0.339477i | −0.474914 − 0.271063i | −0.368912 − 0.211432i |

Figure 47:
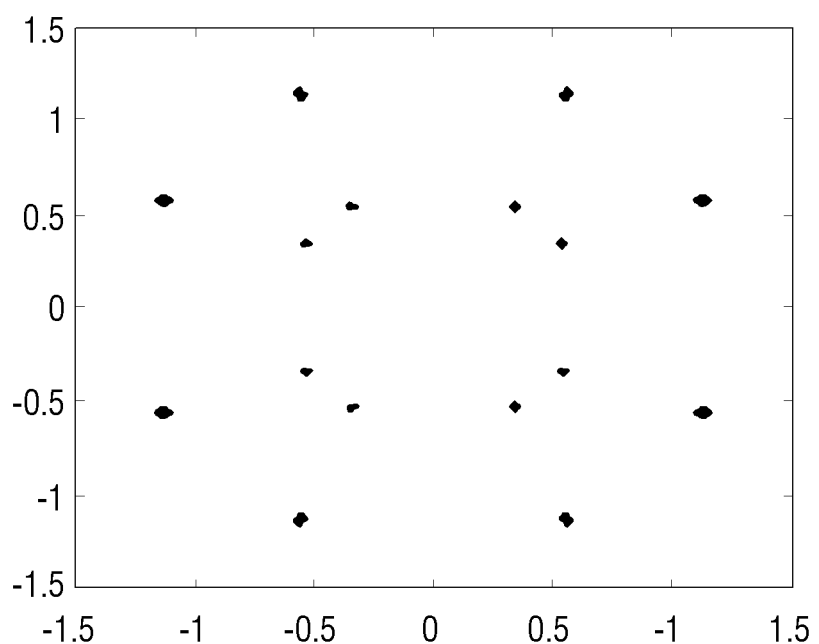
Figure 48:
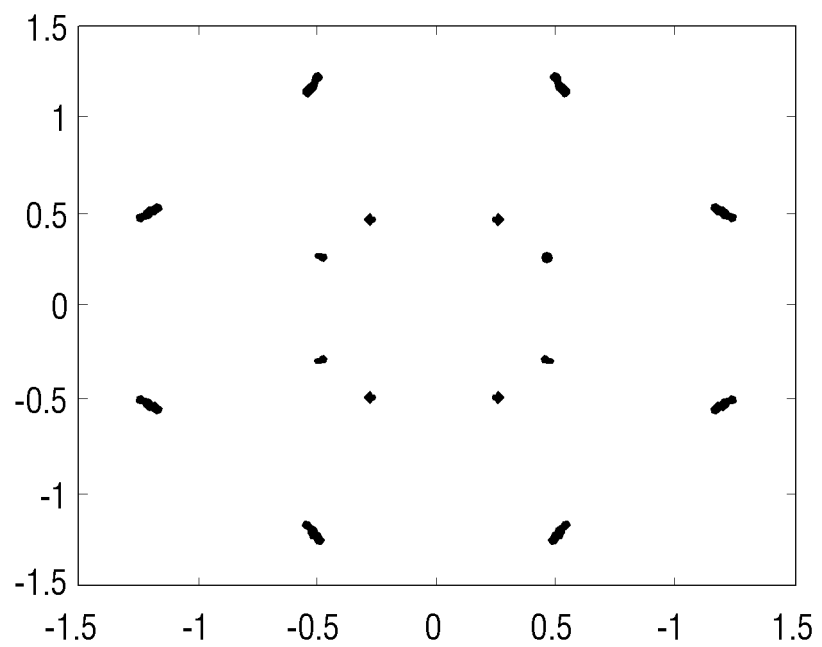
Figure 49:
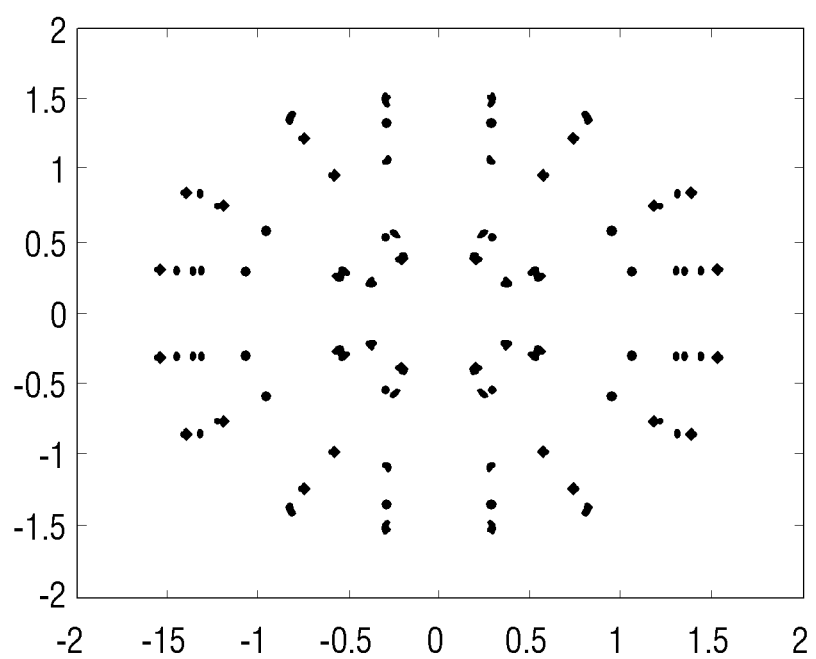

In this case, the constellation points of the 2D NU 256-QAM constellation for the respective coding rates of 2/15, 3/15, and 4/15 are illustrated in FIGS. 47-49.

Meanwhile, according to Tables 5-7, when values of constellation points are determined in one quadrant, values of constellation points in other quadrants may be deduced by symmetry. For example, for each constellation point A in the top-right quadrant, corresponding constellation points may be present in three different quadrants (bottom-right, bottom-left and top-left) respectively, and they can be indicated as A*, −A*, and −A. Here, * indicates complex conjugation.

Table 8 indicates values of constellation points of a normalized 1D NU 1024-QAM constellation (1D 1024NUC) which is obtained by applying the algorithms described above using respective coding rates 2/15, 3/15 and 4/15 for a single SNR value.

TABLE 8

| Level | Coding Rate | | |
|---|---|---|---|
| | 2/15 | 3/15 | 4/15 |
| 1 | 1 | 1 | 1 |
| 2 | 1.000988842 | 1.073113208 | 1.008229665 |
| 3 | 1.001438042 | 1.153930818 | 1.075789474 |
| 4 | 1.001284289 | 1.073899371 | 1.065263158 |
| 5 | 1.002909247 | 1.153459119 | 1.588516746 |
| 6 | 1.00312028 | 1.238050314 | 1.608803828 |
| 7 | 1.00152547 | 1.153930818 | 1.502200957 |
| 8 | 1.0015315 | 1.073742138 | 1.483062201 |
| 9 | 2.824341802 | 3.982232704 | 3.724784689 |
| 10 | 2.839150319 | 3.504402516 | 3.826411483 |
| 11 | 2.868001604 | 3.278616352 | 3.897799043 |
| 12 | 2.855026063 | 3.504559748 | 3.807272727 |

TABLE 8-continued

| Level | Coding Rate | | |
|---|---|---|---|
| | 2/15 | 3/15 | 4/15 |
| 13 | 2.848080048 | 3.972484277 | 5.023923445 |
| 14 | 2.861384198 | 3.499371069 | 5.023349282 |
| 15 | 2.831923931 | 3.970754717 | 5.88937799 |
| 16 | 2.818221832 | 6.002830189 | 7.67138756 |

Figure 50:
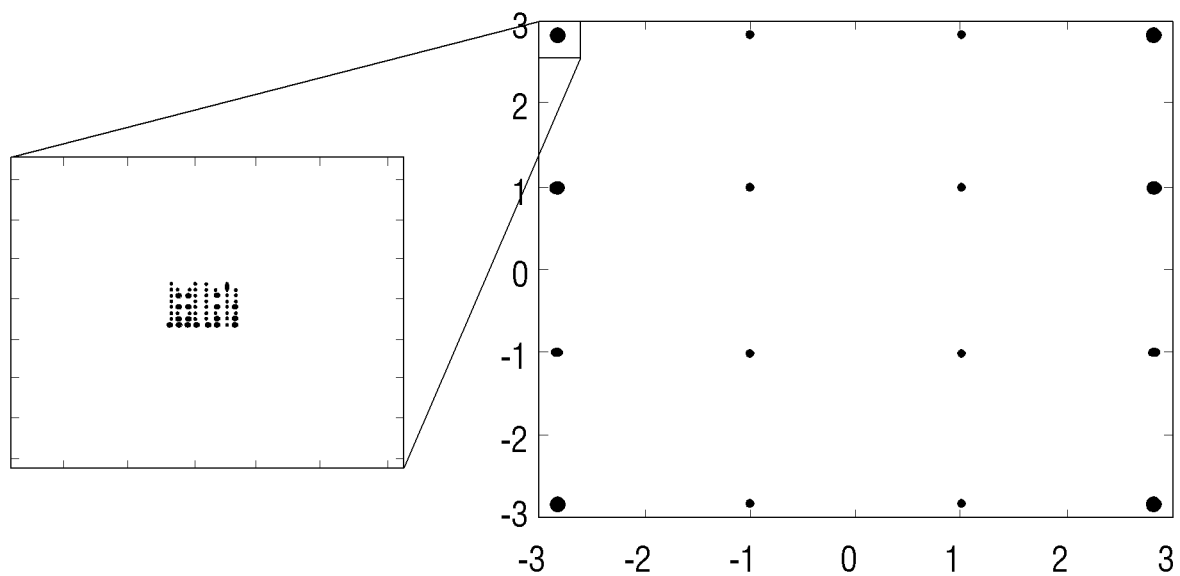
Figure 51:
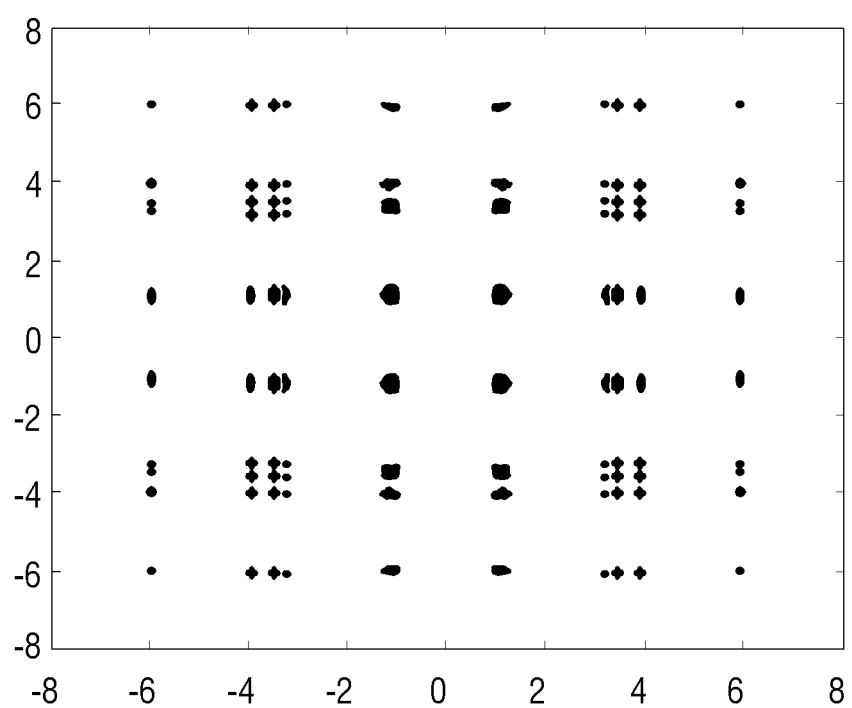
Figure 52:
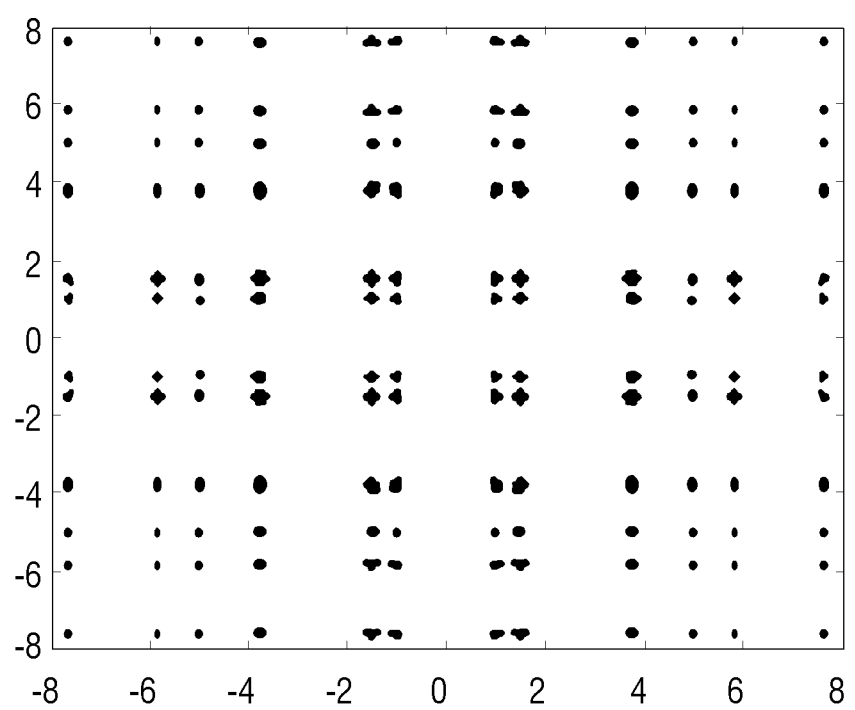
Figure 53:
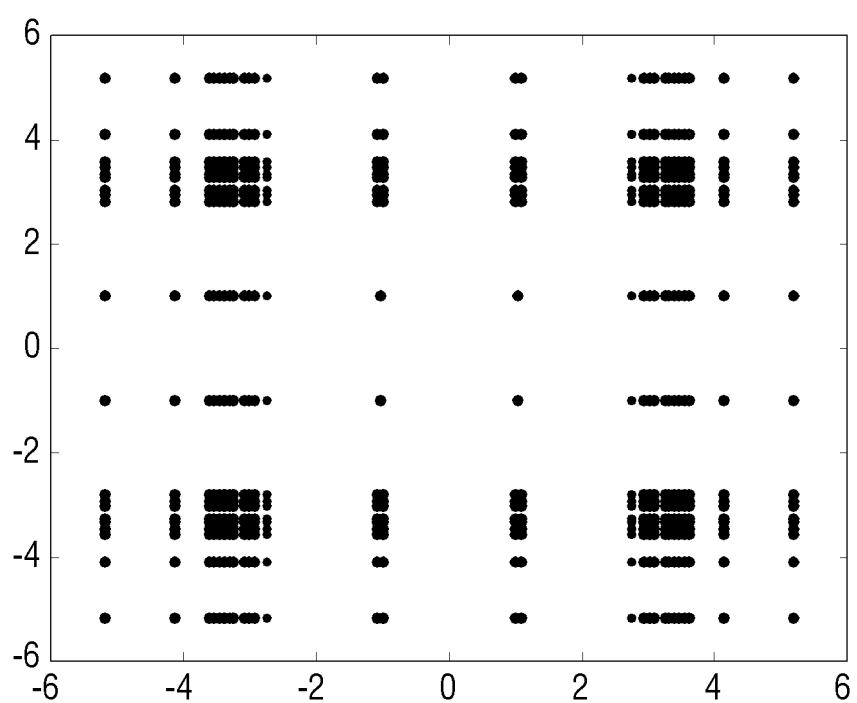
Figure 54:
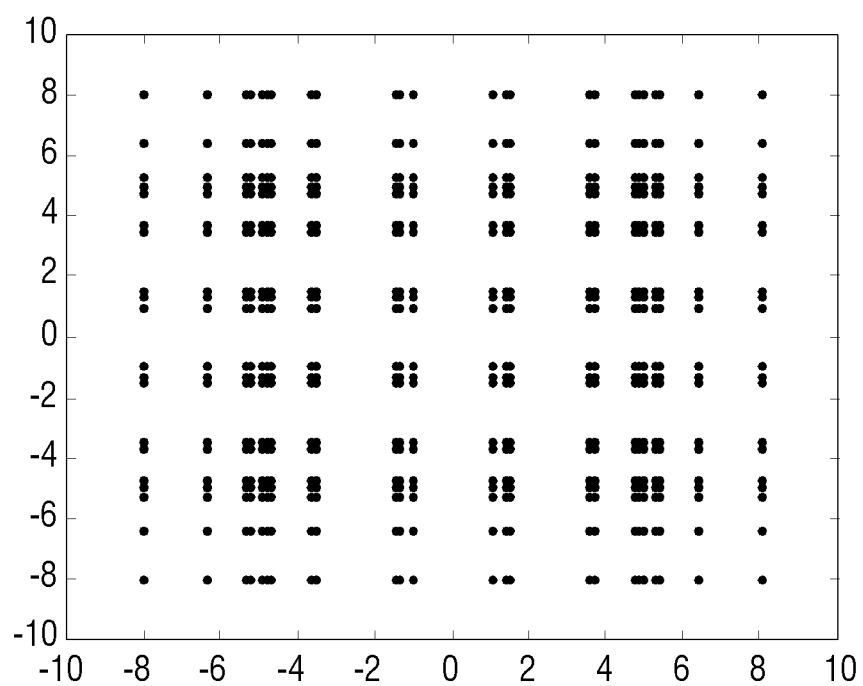
Figure 55:
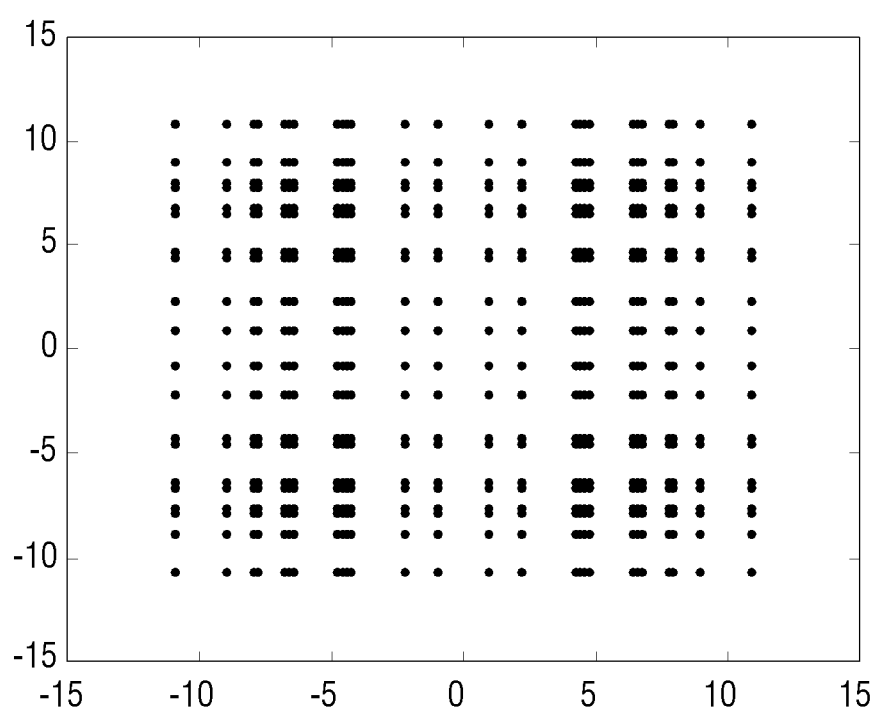
Figure 56:
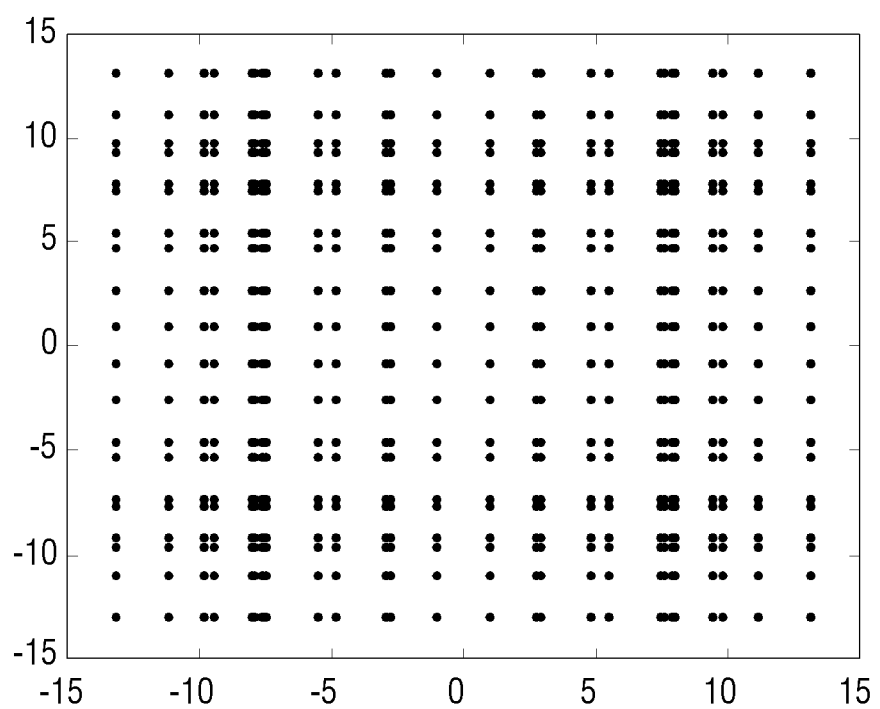

In this case, the constellation points of the 1D NU 1K QAM constellation for the respective coding rates 2/15, 3/15 and 4/15 may be illustrated in FIGS. 50-52.

For example, FIG. 50 illustrates an exemplary 1D NU 1024-QAM constellation obtained by applying the algorithms described above using the coding rate of 2/15.

According to FIG. 50, a complete set of constellation points are indicated in a constellation diagram on the right-hand side of the drawing. Values of the constellation points of the top-right quadrant are indicated on the top-left side of the drawing.

In the case of the 1D NU 1K QAM constellation, rather than giving the values of the constellation points explicitly, a set of levels of the constellation points are given instead, from which actual values of the constellation points may be deduced. To be specific, given a set of m levels A=[$A_1$, $A_2$, ..., $A_m$], a set of $m^2$ constellation point values C+Di may be deduced. Herein, C and D each may include a value selected from a level set A. A complete set of constellation points in the top-right quadrant may be obtained by considering all possible pairs of values C and D. According to FIG. 50, values of constellation points in the remaining three quadrants may be similarly deduced by symmetry. As an example, according to Table 8, when the coding rate is 2/15, A={1, 1.000988842, . . . , 2.818221832}, and a group of C+Di corresponding to a constellation point set of the first quadrant has 256 elements such as {1+i, 1+1.000988842×i, 1.000988842+i, . . . , 2.818221832+2.818221832×i}, the complete set of 1D NU 1024-QAM constellation points may be obtained by indicating an arbitrary element a in the group, as a*, −a* and −a. Here, * indicates complex conjugation.

Table 9 indicates values of constellation points of a normalized 1D NU 4096-QAM constellation (1D 4096NUC) which is obtained by applying the algorithms described above using respective coding rates 2/15, 3/15, 4/15 and 5/15 for a single SNR value.

TABLE 9

| | Coding Rate | | | |
|---|---|---|---|---|
| Level | 2/15 | 3/15 | 4/15 | 5/15 |
| 1 | 1 | 1 | 1 | 1 |
| 2 | 1.020833333 | 1 | 0.973180077 | 1 |
| 3 | 1.041666667 | 1.057142857 | 0.965517241 | 1 |
| 4 | 1.020833333 | 1.057142857 | 0.980842912 | 1 |
| 5 | 1.041666667 | 1.057142857 | 0.988505747 | 1 |
| 6 | 1.0625 | 1.057142857 | 0.957854406 | 1 |
| 7 | 1.041666667 | 1.028571429 | 0.988505747 | 1 |
| 8 | 1.020833333 | 1 | 1 | 1 |
| 9 | 1.041666667 | 1.371428571 | 2.233716475 | 2.863636364 |
| 10 | 1.0625 | 1.428571429 | 2.233716475 | 2.863636364 |
| 11 | 1.0625 | 1.485714286 | 2.210727969 | 2.772727273 |
| 12 | 1.0625 | 1.457142857 | 2.229885057 | 2.772727273 |
| 13 | 1.041666667 | 1.457142857 | 2.245210728 | 2.772727273 |
| 14 | 1.0625 | 1.485714286 | 2.22605364 | 2.772727273 |
| 15 | 1.041666667 | 1.371428571 | 2.214559387 | 2.863636364 |
| 16 | 1.020833333 | 1.371428571 | 2.237547893 | 2.863636364 |
| 17 | 3.4375 | 3.542857143 | 4.275862069 | 4.863636364 |
| 18 | 3.041666667 | 3.628571429 | 4.356321839 | 4.863636364 |
| 19 | 2.791666667 | 3.657142857 | 4.708812261 | 5.545454545 |
| 20 | 3 | 3.6 | 4.62835249 | 5.590909091 |
| 21 | 2.916666667 | 3.628571429 | 4.624521073 | 5.545454545 |
| 22 | 2.75 | 3.685714286 | 4.724137931 | 5.545454545 |
| 23 | 2.958333333 | 3.657142857 | 4.360153257 | 4.863636364 |
| 24 | 3.25 | 3.6 | 4.287356322 | 4.863636364 |
| 25 | 4.125 | 6.4 | 8.98467433 | 11.18181818 |
| 26 | 3.354166667 | 5.314285714 | 7.911877395 | 9.772727273 |
| 27 | 2.979166667 | 4.8 | 6.708812261 | 8 |
| 28 | 3.291666667 | 4.971428571 | 6.536398467 | 7.545454545 |
| 29 | 3.520833333 | 4.857142857 | 6.425287356 | 7.5 |
| 30 | 3.083333333 | 4.714285714 | 6.609195402 | 7.909090909 |
| 31 | 3.604166667 | 5.228571429 | 7.747126437 | 9.454545455 |
| 32 | 5.1875 | 8.057142857 | 10.8697318 | 13.18181818 |

In this case, the constellation points of the 1D NU 4096-QAM constellation for the respective coding rates 2/15, 3/15, 4/15 and 5/15 may be illustrated in FIGS. 53-56.

In the case of the 1D NU 4K QAM constellation, rather than giving the values of the constellation points explicitly, a set of levels of the constellation points are given instead, from which actual values of the constellation points may be deduced. To be specific, given a set of m levels A=[$A_1$, $A_2$, . . . , $A_m$], and a set of $m^2$ constellation point values C+Di may be deduced. Herein, C and D each may include a value selected from a level set A. A complete set of constellation points in the top-right quadrant may be obtained by considering all possible pairs of values C and D. That is, values of constellation points in the remaining three quadrants may be similarly deduced by symmetry. As an example, according to Table 9, when the coding rate is 2/15, A= {1, 1.020833333, . . . , 5.1875}, and a group of C+Di corresponding to a constellation point set of the first quadrant has 256 elements such as {1+i, 1+1.020833333×i, 1.020833333+i, . . . , 5.1875+5.1875×i}, the complete set of 1D NU 4096-QAM constellation points may be obtained by indicating an arbitrary element a in the group, as a*, −a* and −a. Here, * indicates complex conjugation.

As described above, in the 1D-NUC of Tables 8 and 9, the constellation can be described by the levels at which the constellations occur in the real positive part. The constellation points can be deduced by using the real/imaginary symmetry but also the symmetry of the four quadrants.

Meanwhile, the inventive concept is not limited to the constellations defined in Tables 5-9.

For example, when rounding-off are applied for the values of constellation points defined in Tables 5-9, the values can be indicated as in Tables 10-14. In this case, the constellation defined in Tables 10-14 can be an exemplary embodiment.

Tables 10-14 illustrate the set of constellation points for one quadrant only, but it is obvious to obtain a complete set of constellation points by indicating the constellation point a in the one quadrant, as a*, −a*, and −a. Here, * indicates complex conjugation.

To be specific, Table 10 indicates the values of constellation points of 2D NU 16-QAM constellation (2D 16NUC) which is obtained by applying rounding-off of the values of constellation points defined in Table 5.

TABLE 10

| w/Shape | NUC_16_2/15 | NUC_16_3/15 | NUC_16_4/15 |
|---|---|---|---|
| w0 | 0.7073 + 0.7075i | 0.7098 + 0.7102i | 1.1070 + 0.5806i |
| w1 | 0.7073 + 0.7074i | 0.7050 + 0.7101i | 0.5814 + 1.1070i |
| w2 | 0.7060 + 0.7077i | 0.7093 + 0.7039i | 0.5525 + 0.3626i |
| w3 | 0.7065 + 0.7071i | 0.7045 + 0.7040i | 0.3629 + 0.5527i |

In this case, the values of constellation points of other quadrants can be determined by symmetry.

Table 11 indicates values of constellation points of a 2D NU 64-QAM constellation (2D 64NUC) which is obtained by applying rounding-off of the values of constellation points defined in Table 6.

TABLE 11

| w/Shape | NUC_64_2/15 | NUC_64_3/15 | NUC_64_4/15 |
|---|---|---|---|
| w0 | 0.6474 + 0.9831i | 0.5472 + 1.1591i | 0.5008 + 1.2136i |
| w1 | 0.6438 + 0.9829i | 0.5473 + 1.1573i | 0.4994 + 1.2194i |
| w2 | 0.6471 + 0.9767i | 0.5467 + 1.1599i | 0.5313 + 1.1715i |
| w3 | 0.6444 + 0.9762i | 0.5479 + 1.1585i | 0.5299 + 1.1788i |
| w4 | 0.9839 + 0.6475i | 1.1578 + 0.5478i | 1.2107 + 0.5037i |
| w5 | 0.9778 + 0.6474i | 1.1576 + 0.5475i | 1.2209 + 0.5008i |
| w6 | 0.9835 + 0.6434i | 1.1591 + 0.5475i | 1.1715 + 0.5299i |
| w7 | 0.9777 + 0.6433i | 1.1591 + 0.5475i | 1.1802 + 0.5270i |
| w8 | 0.4659 + 0.6393i | 0.3163 + 0.5072i | 0.2744 + 0.4762i |
| w9 | 0.4643 + 0.6386i | 0.3163 + 0.5072i | 0.2729 + 0.4762i |
| w10 | 0.4661 + 0.6353i | 0.3163 + 0.5072i | 0.2773 + 0.4791i |
| w11 | 0.4639 + 0.6350i | 0.3163 + 0.5072i | 0.2773 + 0.4791i |
| w12 | 0.6378 + 0.4671i | 0.5087 + 0.3163i | 0.4762 + 0.2729i |
| w13 | 0.6352 + 0.4673i | 0.5087 + 0.3163i | 0.4762 + 0.2729i |
| w14 | 0.6385 + 0.4656i | 0.5087 + 0.3163i | 0.4791 + 0.2773i |
| w15 | 0.6353 + 0.4653i | 0.5087 + 0.3163i | 0.4791 + 0.2758i |

In this case, the values of constellation points of other quadrants can be determined by symmetry.

Table 12 indicates values of constellation points of a 2D NU 256-QAM constellation (2D 256NUC) which is obtained by applying rounding-off of the values of constellation points defined in Table 7.

TABLE 12

| w/Shape | NUC_256_2/15 | NUC_256_3/15 | NUC_256_4/15 |
|---|---|---|---|
| w0 | 0.5553 + 1.1262i | 0.5229 + 1.1810i | 0.2975 + 1.0564i |
| w1 | 0.5673 + 1.1336i | 0.5384 + 1.1625i | 0.5862 + 0.9617i |
| w2 | 0.5593 + 1.1204i | 0.5148 + 1.1943i | 0.2909 + 1.0696i |
| w3 | 0.5636 + 1.1321i | 0.5288 + 1.1751i | 0.5796 + 0.9689i |
| w4 | 0.5525 + 1.1249i | 0.4985 + 1.2202i | 0.2953 + 1.3357i |
| w5 | 0.5637 + 1.1320i | 0.5111 + 1.1973i | 0.7488 + 1.2365i |
| w6 | 0.5598 + 1.1181i | 0.4889 + 1.2357i | 0.3004 + 1.5114i |
| w7 | 0.5659 + 1.1274i | 0.5045 + 1.2113i | 0.8151 + 1.3816i |
| w8 | 0.5579 + 1.1381i | 0.5222 + 1.1817i | 0.3004 + 1.0535i |
| w9 | 0.5617 + 1.1471i | 0.5370 + 1.1640i | 0.5847 + 0.9631i |
| w10 | 0.5593 + 1.1346i | 0.5133 + 1.1950i | 0.2931 + 1.0659i |
| w11 | 0.5672 + 1.1430i | 0.5303 + 1.1751i | 0.5825 + 0.9668i |
| w12 | 0.5533 + 1.1355i | 0.4971 + 1.2216i | 0.2953 + 1.3189i |
| w13 | 0.5632 + 1.1421i | 0.5126 + 1.1995i | 0.7466 + 1.2168i |
| w14 | 0.5567 + 1.1325i | 0.4882 + 1.2371i | 0.2960 + 1.4654i |
| w15 | 0.5641 + 1.1363i | 0.5045 + 1.2128i | 0.8297 + 1.3539i |
| w16 | 1.1309 + 0.5597i | 1.1795 + 0.5251i | 1.0637 + 0.2960i |
| w17 | 1.1405 + 0.5660i | 1.1625 + 0.5384i | 0.9617 + 0.5811i |
| w18 | 1.1348 + 0.5588i | 1.1914 + 0.5133i | 1.0732 + 0.2931i |
| w19 | 1.1491 + 0.5638i | 1.1744 + 0.5296i | 0.9682 + 0.5818i |
| w20 | 1.1245 + 0.5615i | 1.2209 + 0.4993i | 1.3619 + 0.2997i |
| w21 | 1.1333 + 0.5627i | 1.2002 + 0.5148i | 1.2249 + 0.7546i |
| w22 | 1.1284 + 0.5578i | 1.2342 + 0.4882i | 1.5427 + 0.3106i |
| w23 | 1.1436 + 0.5636i | 1.2142 + 0.5052i | 1.3969 + 0.8523i |
| w24 | 1.1196 + 0.5620i | 1.1803 + 0.5229i | 1.0615 + 0.2945i |
| w25 | 1.1347 + 0.5665i | 1.1640 + 0.5399i | 0.9631 + 0.5818i |
| w26 | 1.1379 + 0.5611i | 1.1921 + 0.5133i | 1.0710 + 0.2924i |
| w27 | 1.1440 + 0.5638i | 1.1758 + 0.5303i | 0.9675 + 0.5825i |
| w28 | 1.1221 + 0.5594i | 1.2209 + 0.4971i | 1.3255 + 0.2975i |
| w29 | 1.1318 + 0.5686i | 1.2024 + 0.5148i | 1.1979 + 0.7495i |
| w30 | 1.1302 + 0.5619i | 1.2349 + 0.4889i | 1.4560 + 0.3040i |
| w31 | 1.1386 + 0.5662i | 1.2150 + 0.5045i | 1.3269 + 0.8414i |
| w32 | 0.3394 + 0.5381i | 0.2740 + 0.4771i | 0.2493 + 0.5585i |
| w33 | 0.3397 + 0.5360i | 0.2762 + 0.4801i | 0.2960 + 0.5344i |
| w34 | 0.3387 + 0.5324i | 0.2733 + 0.4757i | 0.2450 + 0.5417i |
| w35 | 0.3400 + 0.5335i | 0.2748 + 0.4779i | 0.2873 + 0.5191i |
| w36 | 0.3374 + 0.5306i | 0.2703 + 0.4742i | 0.2049 + 0.3922i |
| w37 | 0.3405 + 0.5343i | 0.2725 + 0.4764i | 0.2173 + 0.3806i |
| w38 | 0.3379 + 0.5324i | 0.2696 + 0.4727i | 0.1990 + 0.3755i |
| w39 | 0.3400 + 0.5317i | 0.2718 + 0.4749i | 0.2107 + 0.3645i |
| w40 | 0.3397 + 0.5370i | 0.2740 + 0.4779i | 0.2493 + 0.5599i |
| w41 | 0.3400 + 0.5383i | 0.2755 + 0.4793i | 0.2975 + 0.5351i |
| w42 | 0.3381 + 0.5347i | 0.2725 + 0.4757i | 0.2450 + 0.5439i |
| w43 | 0.3382 + 0.5347i | 0.2748 + 0.4779i | 0.2887 + 0.5213i |
| w44 | 0.3379 + 0.5342i | 0.2711 + 0.4734i | 0.2056 + 0.3937i |
| w45 | 0.3389 + 0.5332i | 0.2725 + 0.4764i | 0.2187 + 0.3820i |
| w46 | 0.3402 + 0.5347i | 0.2696 + 0.4720i | 0.1998 + 0.3762i |
| w47 | 0.3384 + 0.5340i | 0.2711 + 0.4742i | 0.2122 + 0.3667i |
| w48 | 0.5350 + 0.3394i | 0.4771 + 0.2740i | 0.5607 + 0.2486i |
| w49 | 0.5363 + 0.3397i | 0.4786 + 0.2762i | 0.5381 + 0.2960i |
| w50 | 0.5342 + 0.3389i | 0.4764 + 0.2725i | 0.5439 + 0.2442i |
| w51 | 0.5384 + 0.3380i | 0.4771 + 0.2748i | 0.5220 + 0.2865i |
| w52 | 0.5329 + 0.3363i | 0.4734 + 0.2703i | 0.3908 + 0.2049i |
| w53 | 0.5330 + 0.3387i | 0.4757 + 0.2725i | 0.3813 + 0.2173i |
| w54 | 0.5311 + 0.3389i | 0.4734 + 0.2696i | 0.3740 + 0.1998i |
| w55 | 0.5332 + 0.3380i | 0.4742 + 0.2711i | 0.3653 + 0.2100i |
| w56 | 0.5313 + 0.3397i | 0.4771 + 0.2740i | 0.5643 + 0.2486i |
| w57 | 0.5324 + 0.3400i | 0.4779 + 0.2762i | 0.5410 + 0.2967i |
| w58 | 0.5339 + 0.3402i | 0.4764 + 0.2725i | 0.5475 + 0.2435i |
| w59 | 0.5360 + 0.3405i | 0.4771 + 0.2748i | 0.5257 + 0.2880i |
| w60 | 0.5285 + 0.3397i | 0.4742 + 0.2703i | 0.3937 + 0.2049i |
| w61 | 0.5317 + 0.3379i | 0.4749 + 0.2725i | 0.3850 + 0.2187i |
| w62 | 0.5319 + 0.3381i | 0.4734 + 0.2696i | 0.3762 + 0.1998i |
| w63 | 0.5327 + 0.3395i | 0.4749 + 0.2711i | 0.3689 + 0.2114i |

In this case, the values of constellation points of other quadrants can be determined by symmetry.

Table 13 indicates values of constellation points of a 1D NU 1024-QAM constellation (1D 1024NUC) which is obtained by applying rounding-off of the values of constellation points defined in Table 8.

TABLE 13

| u/Shape | NUC_1k_2/15 | NUC_1k_3/15 | NUC_1k_4/15 |
|---|---|---|---|
| u0 | 0.3317 | 0.2382 | 0.1924 |
| u1 | 0.3321 | 0.2556 | 0.1940 |
| u2 | 0.3322 | 0.2749 | 0.2070 |
| u3 | 0.3321 | 0.2558 | 0.2050 |
| u4 | 0.3327 | 0.2748 | 0.3056 |
| u5 | 0.3328 | 0.2949 | 0.3096 |
| u6 | 0.3322 | 0.2749 | 0.2890 |
| u7 | 0.3322 | 0.2558 | 0.2854 |
| u8 | 0.9369 | 0.9486 | 0.7167 |
| u9 | 0.9418 | 0.8348 | 0.7362 |
| u10 | 0.9514 | 0.7810 | 0.7500 |
| u11 | 0.9471 | 0.8348 | 0.7326 |
| u12 | 0.9448 | 0.9463 | 0.9667 |
| u13 | 0.9492 | 0.8336 | 0.9665 |
| u14 | 0.9394 | 0.9459 | 1.1332 |
| u15 | 0.9349 | 1.4299 | 1.4761 |

Table 14 indicates values of constellation points of a 1D NU 4096-QAM constellation (1D 4096NUC) which is obtained by applying rounding-off of the values of constellation points defined in Table 9.

TABLE 14

| u/Shape | NUC_4k_2/15 | NUC_4k_3/15 | NUC_4k_4/15 | NUC_4k_5/15 |
|---|---|---|---|---|
| u0 | 0.2826 | 0.2038 | 0.1508 | 0.1257 |
| u1 | 0.2885 | 0.2038 | 0.1468 | 0.1257 |
| u2 | 0.2944 | 0.2155 | 0.1456 | 0.1257 |
| u3 | 0.2885 | 0.2155 | 0.1479 | 0.1257 |
| u4 | 0.2944 | 0.2155 | 0.1491 | 0.1257 |
| u5 | 0.3003 | 0.2155 | 0.1444 | 0.1257 |
| u6 | 0.2944 | 0.2097 | 0.1491 | 0.1257 |
| u7 | 0.2885 | 0.2038 | 0.1508 | 0.1257 |
| u8 | 0.2944 | 0.2796 | 0.3368 | 0.3599 |
| u9 | 0.3003 | 0.2912 | 0.3368 | 0.3599 |
| u10 | 0.3003 | 0.3029 | 0.3334 | 0.3484 |
| u11 | 0.3003 | 0.2970 | 0.3363 | 0.3484 |
| u12 | 0.2944 | 0.2970 | 0.3386 | 0.3484 |
| u13 | 0.3003 | 0.3029 | 0.3357 | 0.3484 |
| u14 | 0.2944 | 0.2796 | 0.3340 | 0.3599 |
| u15 | 0.2885 | 0.2796 | 0.3374 | 0.3599 |
| u16 | 0.9714 | 0.7222 | 0.6448 | 0.6112 |
| u17 | 0.8596 | 0.7397 | 0.6569 | 0.6112 |
| u18 | 0.7889 | 0.7455 | 0.7101 | 0.6969 |
| u19 | 0.8478 | 0.7339 | 0.6979 | 0.7026 |
| u20 | 0.8242 | 0.7397 | 0.6974 | 0.6969 |

TABLE 14-continued

| u/Shape | NUC_4k_2/15 | NUC_4k_3/15 | NUC_4k_4/15 | NUC_4k_5/15 |
|---|---|---|---|---|
| u21 | 0.7771 | 0.7513 | 0.7124 | 0.6969 |
| u22 | 0.8360 | 0.7455 | 0.6575 | 0.6112 |
| u23 | 0.9184 | 0.7339 | 0.6465 | 0.6112 |
| u24 | 1.1657 | 1.3046 | 1.3549 | 1.4052 |
| u25 | 0.9479 | 1.0833 | 1.1931 | 1.2281 |
| u26 | 0.8419 | 0.9785 | 1.0117 | 1.0054 |
| u27 | 0.9302 | 1.0134 | 0.9857 | 0.9482 |
| u28 | 0.9950 | 0.9901 | 0.9689 | 0.9425 |
| u29 | 0.8713 | 0.9610 | 0.9967 | 0.9939 |
| u30 | 1.0185 | 1.0658 | 1.1683 | 1.1882 |
| u31 | 1.4660 | 1.6424 | 1.6391 | 1.6566 |

Meanwhile, it needs to be noted that the method for obtaining complete set of constellation points as in Tables 13 and 14 is completely the same as the method described in Tables 8 and 9.

Meanwhile, those skilled in the art may recognize that rotation, scaling (here, the scaling factor applied to a real axis and an imaginary axis can be the same or different) or other transformation can be applied with respect to the constellation described above. The constellation indicates a comparative position of constellation points, and other constellation can be deduced through rotation, scaling, or other transformation.

In addition, those skilled in the art can recognize that the inventive concept is not limited to constellation defined in Tables 5-14 described above.

For example, in certain exemplary embodiments, a constellation having different order and/or a constellation including a different arrangement or a comparative position of constellation points can be used. As another example, a constellation which is similar to one of constellations defined in Tables 5-14 can be used.

For example, a constellation which has values of constellation points with differences which do not exceed a predetermined threshold (or error) from the values indicated in Tables 5-14 can be used. Here, the threshold value can be expressed as comparative numbers (for example, 0.1%, 1%, 5%, etc.), absolute numbers (for example, 0.001, 0.01, 0.1, etc.) or appropriate methods (rounding-off, flooring, ceiling, or the like). As an example of rounding-off, constellation point "0.707316+0.707473i" can be approximated to "0.7073+0.7075i" by rounding-off at the five decimal places.

In addition, a transmitter and a receiver may use different constellations. For example, a transmitter and a receiver may use respective constellations which have at least one constellation point that has a difference which does not exceed a predetermined threshold value. For example, a receiver may use a constellation having at least one round off/round down constellation point (for example, A2) to demap constellation points, whereas a transmitter may use a constellation having non-round off/round-down constellation points (for example, A1).

In addition, even if an order of the values in Tables 5-14 is changed, the set of constellation points itself is not changed, and thus, it is possible to arrange the values by changing the order of values as in Tables 5-14.

As described above, rotation, scaling, and other transformation can be applied to the constellations defined by the various exemplary embodiments To be specific, the constellation point of which the absolute values of the constellation points defined in tables 2-4 and 7-9 are not changed and indicated as constellation points which are converted to 1:1 can be considered the equivalent constellation as the constellation defined in tables 2-4 and 7-9. Here, conversion to 1:1 in dicates that inverse conversion is available.

For example, in a constellation, the below is applied to the constellation points defined in tables 2-4 and 7-9.

i) rotation->conjugation->rotation or ii) rotation->conjugation->multiplying a constant with absolute value of 1

The above constellation where the above is applied is considered to be the same as the constellation defined in tables 2-4 and 7-9.

As an example the constellation points (B+Ai)=(0.7075+0.7073i, 0.7074+0.7073i, 0.7077+0.7060i, 0.7071+0.7065i) which are obtained by rotating the constellation points defined in table 7 (A+Bi)=(0.7073+0.7075i, 0.7073+0.7074i, 0.7060+0.7077i, 0.7065+0.7071i) in a counter-clockwise direction by 90°->conjugation->counterclowise direction by 180° (or, multiplying −1) can be considered the same constellation as the constellation defined in table 7. Meanwhile, in the aforementioned example, table 7 is explained as an example, but the constellation points A+Bi defined in tables 2-4 and 8-9 and the constellation points B+Ai which are converted from A+Bi are considered the same as the constellation defined in tables 2-4 and 8-9.

Hereinbelow, an example of a normalization method and an exemplary embodiment of constituting 2D constellation from a 1D level set will be described.

For example, in Table 15, it is assumed that values of constellation points of a 1D NU 1K QAM constellation for a 13/15 coding rate are as shown below.

TABLE 15

| Level | Coding Rate 13/15 |
|---|---|
| 1 | 1 |
| 2 | 2.975413 |
| 3 | 4.997551 |
| 4 | 7.018692 |
| 5 | 9.102872 |
| 6 | 11.22209 |
| 7 | 13.42392 |
| 8 | 15.69921 |
| 9 | 18.09371 |
| 10 | 20.61366 |
| 11 | 23.2898 |
| 12 | 26.15568 |
| 13 | 29.23992 |
| 14 | 32.59361 |
| 15 | 36.30895 |
| 16 | 40.58404 |

Here, when a level vector A is indicated as $A=(a_i)$, $(I=0, 1, 2, \ldots, L-1)$, first of all, the vector A is normalized using Equation 3 shown below, and normalized vector $\overline{A}$ can be obtained.

$$\overline{A} = \frac{A}{\sqrt{\frac{2}{L}\Sigma_i a_i^2}} \qquad \text{[Equation 3]}$$

In above Equation 3, L indicates the number of level (that is, dimensionality of A). For example, in the case of 16-QAM, 64-QAM, 256-QAM, 1024-QAM, and 4096-QAM, dimensionality of level can be 4, 6, 8, 10 and 12 respectively.

In the example described above, the normalized vector $\overline{A}$ can be indicated as Table 16 shown below.

TABLE 16

| Level | Coding Rate 13/15 |
|---|---|
| 1 | 0.0325 |
| 2 | 0.0967 |
| 3 | 0.1623 |
| 4 | 0.228 |
| 5 | 0.2957 |
| 6 | 0.3645 |
| 7 | 0.4361 |
| 8 | 0.51 |
| 9 | 0.5878 |
| 10 | 0.6696 |
| 11 | 0.7566 |
| 12 | 0.8497 |
| 13 | 0.9498 |
| 14 | 1.0588 |
| 15 | 1.1795 |
| 16 | 1.3184 |

If the normalization method described above is applied to Tables 8 and 9 respectively, it can be easily recognized that Tables 13 and 14 will be obtained respectively.

Next, a final constellation is generated such that all the possible combinations of the real part and the imaginary part, which are the same as one of the entries (that is, components). In this case, for an example, gray mapping can be used.

In the example described above, constellation points in the final first quadrant can be indicated as in Table 17 shown below.

TABLE 17

| Label (int.) | Constellation Point |
|---|---|
| 1 | 1.3184 + 1.3184i |
| 2 | 1.3184 + 1.1795i |
| 3 | 1.1795 + 1.3184i |
| 4 | 1.1795 + 1.1795i |
| 5 | 1.3184 + 0.9498i |
| 6 | 1.3184 + 1.0588i |
| 7 | 1.1795 + 0.9498i |
| 8 | 1.1795 + 1.0588i |
| 9 | 0.9498 + 1.3184i |
| 10 | 0.9498 + 1.1795i |
| 11 | 1.0588 + 1.3184i |
| 12 | 1.0588 + 1.1795i |
| 13 | 0.9498 + 0.9498i |
| 14 | 0.9498 + 1.0588i |
| 15 | 1.0588 + 0.9498i |
| 16 | 1.0588 + 1.0588i |

TABLE 17-continued

| Label (int.) | Constellation Point |
|---|---|
| 17 | 1.3184 + 0.5878i |
| 18 | 1.3184 + 0.6696i |
| 19 | 1.1795 + 0.5878i |
| 20 | 1.1795 + 0.6696i |
| 21 | 1.3184 + 0.8497i |
| 22 | 1.3184 + 0.7566i |
| 23 | 1.1795 + 0.8497i |
| 24 | 1.1795 + 0.7566i |
| 25 | 0.9498 + 0.5878i |
| 26 | 0.9498 + 0.6696i |
| 27 | 1.0588 + 0.5878i |
| 28 | 1.0588 + 0.6696i |
| 29 | 0.9498 + 0.8497i |
| 30 | 0.9498 + 0.7566i |
| 31 | 1.0588 + 0.8497i |
| 32 | 1.0588 + 0.7566i |
| 33 | 0.5878 + 1.1795i |
| 34 | 0.6696 + 1.3184i |
| 35 | 0.6696 + 1.1795i |
| 36 | 0.5878 + 0.9498i |
| 37 | 0.5878 + 1.0588i |
| 38 | 0.6696 + 0.9498i |
| 39 | 0.6696 + 1.0588i |
| 40 | 0.8497 + 1.3184i |
| 41 | 0.8497 + 1.1795i |
| 42 | 0.7566 + 1.3184i |
| 43 | 0.7566 + 1.1795i |
| 44 | 0.8497 + 0.9498i |
| 45 | 0.8497 + 1.0588i |
| 46 | 0.7566 + 0.9498i |
| 47 | 0.7566 + 1.0588i |
| 48 | 0.5878 + 0.5878i |
| 49 | 0.5878 + 0.6696i |
| 50 | 0.6696 + 0.5878i |
| 51 | 0.6696 + 0.6696i |
| 52 | 0.5878 + 0.8497i |
| 53 | 0.5878 + 0.7566i |
| 54 | 0.6696 + 0.8497i |
| 55 | 0.6696 + 0.7566i |
| 56 | 0.8497 + 0.5878i |
| 57 | 0.8497 + 0.6696i |
| 58 | 0.7566 + 0.5878i |
| 59 | 0.7566 + 0.6696i |
| 60 | 0.8497 + 0.8497i |
| 61 | 0.8497 + 0.7566i |
| 62 | 0.7566 + 0.8497i |
| 63 | 0.7566 + 0.7566i |
| 64 | 1.3184 + 0.0325i |
| 65 | 1.3184 + 0.0967i |
| 66 | 1.1795 + 0.0325i |
| 67 | 1.1795 + 0.0967i |
| 68 | 1.3184 + 0.2280i |
| 69 | 1.3184 + 0.1623i |
| 70 | 1.1795 + 0.2280i |
| 71 | 1.1795 + 0.1623i |
| 72 | 0.9498 + 0.0325i |
| 73 | 0.9498 + 0.0967i |
| 74 | 1.0588 + 0.0325i |
| 75 | 1.0588 + 0.0967i |
| 76 | 0.9498 + 0.2280i |
| 77 | 0.9498 + 0.1623i |
| 78 | 1.0588 + 0.2280i |
| 79 | 1.0588 + 0.1623i |
| 80 | 1.3184 + 0.5100i |
| 81 | 1.3184 + 0.4361i |
| 82 | 1.1795 + 0.5100i |
| 83 | 1.1795 + 0.4361i |
| 84 | 1.3184 + 0.2957i |
| 85 | 1.3184 + 0.3645i |
| 86 | 1.1795 + 0.2957i |
| 87 | 1.1795 + 0.3645i |
| 88 | 0.9498 + 0.5100i |
| 89 | 0.9498 + 0.4361i |
| 90 | 1.0588 + 0.5100i |
| 91 | 1.0588 + 0.4361i |
| 92 | 0.9498 + 0.2957i |
| 93 | 0.9498 + 0.3645i |
| 94 | 1.0588 + 0.2957i |

TABLE 17-continued

| Label (int.) | Constellation Point |
|---|---|
| 95 | 1.0588 + 0.3645i |
| 96 | 0.5878 + 0.0325i |
| 97 | 0.5878 + 0.0967i |
| 98 | 0.6696 + 0.0325i |
| 99 | 0.6696 + 0.0967i |
| 100 | 0.5878 + 0.2280i |
| 101 | 0.5878 + 0.1623i |
| 102 | 0.6696 + 0.2280i |
| 103 | 0.6696 + 0.1623i |
| 104 | 0.8497 + 0.0325i |
| 105 | 0.8497 + 0.0967i |
| 106 | 0.7566 + 0.0325i |
| 107 | 0.7566 + 0.0967i |
| 108 | 0.8497 + 0.2280i |
| 109 | 0.8497 + 0.1623i |
| 110 | 0.7566 + 0.2280i |
| 111 | 0.7566 + 0.1623i |
| 112 | 0.5878 + 0.5100i |
| 113 | 0.5878 + 0.4361i |
| 114 | 0.6696 + 0.5100i |
| 115 | 0.6696 + 0.4361i |
| 116 | 0.5878 + 0.2957i |
| 117 | 0.5878 + 0.3645i |
| 118 | 0.6696 + 0.2957i |
| 119 | 0.6696 + 0.3645i |
| 120 | 0.8497 + 0.5100i |
| 121 | 0.8497 + 0.4361i |
| 122 | 0.7566 + 0.5100i |
| 123 | 0.7566 + 0.4361i |
| 124 | 0.8497 + 0.2957i |
| 125 | 0.8497 + 0.3645i |
| 126 | 0.7566 + 0.2957i |
| 127 | 0.7566 + 0.3645i |
| 128 | 0.0325 + 1.3184i |
| 129 | 0.0325 + 1.1795i |
| 130 | 0.0967 + 1.3184i |
| 131 | 0.0967 + 1.1795i |
| 132 | 0.0325 + 0.9498i |
| 133 | 0.0325 + 1.0588i |
| 134 | 0.0967 + 0.9498i |
| 135 | 0.0967 + 1.0588i |
| 136 | 0.2280 + 1.3184i |
| 137 | 0.2280 + 1.1795i |
| 138 | 0.1623 + 1.3184i |
| 139 | 0.1623 + 1.1795i |
| 140 | 0.2280 + 0.9498i |
| 141 | 0.2280 + 1.0588i |
| 142 | 0.1623 + 0.9498i |
| 143 | 0.1623 + 1.0588i |
| 144 | 0.0325 + 0.5878i |
| 145 | 0.0325 + 0.6696i |
| 146 | 0.0967 + 0.5878i |
| 147 | 0.0967 + 0.6696i |
| 148 | 0.0325 + 0.8497i |
| 149 | 0.0325 + 0.7566i |
| 150 | 0.0967 + 0.8497i |
| 151 | 0.0967 + 0.7566i |
| 152 | 0.2280 + 0.5878i |
| 153 | 0.2280 + 0.6696i |
| 154 | 0.1623 + 0.5878i |
| 155 | 0.1623 + 0.6696i |
| 156 | 0.2280 + 0.8497i |
| 157 | 0.2280 + 0.7566i |
| 158 | 0.1623 + 0.8497i |
| 159 | 0.1623 + 0.7566i |
| 160 | 0.5100 + 1.3184i |
| 161 | 0.5100 + 1.1795i |
| 162 | 0.4361 + 1.3184i |
| 163 | 0.4361 + 1.1795i |
| 164 | 0.5100 + 0.9498i |
| 165 | 0.5100 + 1.0588i |
| 166 | 0.4361 + 0.9498i |
| 167 | 0.4361 + 1.0588i |
| 168 | 0.2957 + 1.3184i |
| 169 | 0.2957 + 1.1795i |
| 170 | 0.3645 + 1.3184i |
| 171 | 0.3645 + 1.1795i |
| 172 | 0.2957 + 0.9498i |
| 173 | 0.2957 + 1.0588i |
| 174 | 0.3645 + 0.9498i |
| 175 | 0.3645 + 1.0588i |
| 176 | 0.5100 + 0.5878i |
| 177 | 0.5100 + 0.6696i |
| 178 | 0.4361 + 0.5878i |
| 179 | 0.4361 + 0.6696i |
| 180 | 0.5100 + 0.8497i |
| 181 | 0.5100 + 0.7566i |
| 182 | 0.4361 + 0.8497i |
| 183 | 0.4361 + 0.7566i |
| 184 | 0.2957 + 0.5878i |
| 185 | 0.2957 + 0.6696i |
| 186 | 0.3645 + 0.5878i |
| 187 | 0.3645 + 0.6696i |
| 188 | 0.2957 + 0.8497i |
| 189 | 0.2957 + 0.7566i |
| 190 | 0.3645 + 0.8497i |
| 191 | 0.3645 + 0.7566i |
| 192 | 0.0325 + 0.0325i |
| 193 | 0.0325 + 0.0967i |
| 194 | 0.0967 + 0.0325i |
| 195 | 0.0967 + 0.0967i |
| 196 | 0.0325 + 0.2280i |
| 197 | 0.0325 + 0.1623i |
| 198 | 0.0967 + 0.2280i |
| 199 | 0.0967 + 0.1623i |
| 200 | 0.2280 + 0.0325i |
| 201 | 0.2280 + 0.0967i |
| 202 | 0.1623 + 0.0325i |
| 203 | 0.1623 + 0.0967i |
| 204 | 0.2280 + 0.2280i |
| 205 | 0.2280 + 0.1623i |
| 206 | 0.1623 + 0.2280i |
| 207 | 0.1623 + 0.1623i |
| 208 | 0.0325 + 0.5100i |
| 209 | 0.0325 + 0.4361i |
| 210 | 0.0967 + 0.5100i |
| 211 | 0.0967 + 0.4361i |
| 212 | 0.0325 + 0.2957i |
| 213 | 0.0325 + 0.3645i |
| 214 | 0.0967 + 0.2957i |
| 215 | 0.0967 + 0.3645i |
| 216 | 0.2280 + 0.5100i |
| 217 | 0.2280 + 0.4361i |
| 218 | 0.1623 + 0.5100i |
| 219 | 0.1623 + 0.4361i |
| 220 | 0.2280 + 0.2957i |
| 221 | 0.2280 + 0.3645i |
| 222 | 0.1623 + 0.2957i |
| 223 | 0.1623 + 0.3645i |
| 224 | 0.5100 + 0.0325i |
| 225 | 0.5100 + 0.0967i |
| 226 | 0.4361 + 0.0325i |
| 227 | 0.4361 + 0.0967i |
| 228 | 0.5100 + 0.2280i |
| 229 | 0.5100 + 0.1623i |
| 230 | 0.4361 + 0.2280i |
| 231 | 0.4361 + 0.1623i |
| 232 | 0.2957 + 0.0325i |
| 233 | 0.2957 + 0.0967i |
| 234 | 0.3645 + 0.0325i |
| 235 | 0.3645 + 0.0967i |
| 236 | 0.2957 + 0.2280i |
| 237 | 0.2957 + 0.1623i |
| 238 | 0.3645 + 0.2280i |
| 239 | 0.3645 + 0.1623i |
| 240 | 0.5100 + 0.5100i |
| 241 | 0.5100 + 0.4361i |
| 242 | 0.4361 + 0.5100i |
| 243 | 0.4361 + 0.4361i |
| 244 | 0.5100 + 0.2957i |
| 245 | 0.5100 + 0.3645i |
| 246 | 0.4361 + 0.2957i |
| 247 | 0.4361 + 0.3645i |
| 248 | 0.2957 + 0.5100i |
| 249 | 0.2957 + 0.4361i |
| 250 | 0.3645 + 0.5100i |

TABLE 17-continued

| Label (int.) | Constellation Point |
|---|---|
| 251 | 0.3645 + 0.4361i |
| 252 | 0.2957 + 0.2957i |
| 253 | 0.2957 + 0.3645i |
| 254 | 0.3645 + 0.2957i |
| 255 | 0.3645 + 0.3645i |
| 256 | 1.3184 − 1.3184i |

Figure 57:
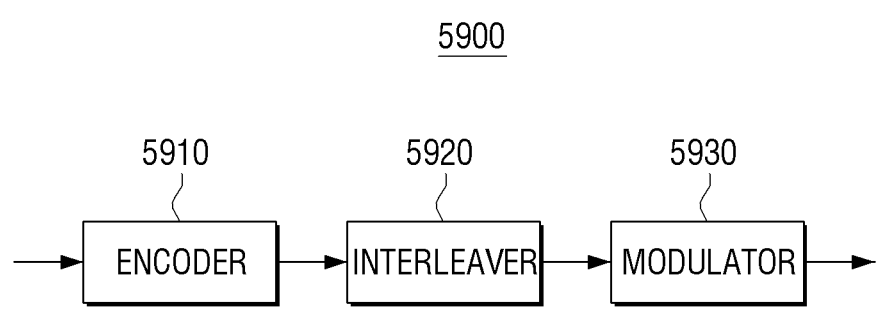
FIG. 57 is a block diagram to describe a configuration of a transmitting apparatus according to an exemplary embodiment.

FIG. 57 is a block diagram to describe a configuration of a transmitting apparatus according to an exemplary embodiment. Referring to FIG. 57, the transmitting apparatus 5900 includes an encoder 5910, an interleaver 5920, and a modulator 5930 (or, 'mapper', 'constellation mapper').

The encoder 5910 performs channel encoding with respect to input bits and generates a codeword.

For example, the encoder 5910 may perform LDPC encoding with respect to the bits and generate an LDPC codeword using an LDPC encoder (not shown).

Specifically, the encoder 5910 may perform LDPC encoding with the input bits as the information word bits, and generate the LDPC codeword constituting the information word bits and parity bits (that is, the LDPC parity bits). In this case, the LDPC code is a systematic code, the information word may be included in the LDPC codeword as it is.

Herein, the LDPC codeword is constituted by the information word bits and parity bits. For example, the LDPC codeword has $N_{ldpc}$ bits, and may include the information word bits formed of $K_{ldpc}$ bits and parity bits formed of $N_{parity}=N_{ldpc}−K_{ldpc}$ parity bits.

In this case, the encoder 5910 may perform LDPC encoding based on a parity check matrix and generate the LDPC codeword. That is, a process of performing LDPC encoding is a process of generating the LDPC codeword satisfying $H \cdot C^T = 0$, and thus, the encoder 5910 may use the parity check matrix when performing LDPC encoding. Herein, H is a parity check matrix and C is an LDPC codeword.

To do this, the transmitting apparatus 5900 may include a separate memory and prestore various types of a parity check matrix.

However, this is merely exemplary, and channel encoding may be performed in various schemes.

The encoder 5910 may perform channel encoding using various coding rates such as 2/15, 3/15, 4/15, 5/15, 6/15, 7/15, 8/15, 9/15, 10/15, 11/15, 12/15 and 13/15. In addition, the encoder 5910 may generate a codeword having various lengths such as 16200 and 64800 based on a length of the bits and coding rate.

An interleaver 5920 interleaves the codeword. That is, the interleaver 5920, based on various interleaving rules, may perform bit-interleaving of the codeword generated by the encoder 5910. In this case, the interleaver 5920 may include the parity interleaver 14210, group-wise interleaver 14229, and block interleaver 14230 of FIG. 7

A modulator 5930 maps the codeword which is interleaved according to a modulation scheme onto a non-uniform constellation.

Specifically, the modulator 5930 may perform serial-to-parallel conversion with respect to the interleaved codeword, and demultiplex the interleaved codeword into a cell (or a cell word) formed of a certain number of bits.

For example, the modulator 5930 may receive the codeword bits $Q=(q_0, q_1, q_2, \ldots)$ output from the interleaver 5920, and generates cells.

In this case, the number of bits constituting each cell may be the same as the number of bits constituting a modulation symbol (that is, a modulation order). For example, when the modulator 5930 performs modulation using QPSK, 16-QAM, 64-QAM, 256-QAM, 1024-QAM, 4096-QAM, the number of bits $\eta_{MOD}$ constituting the modulation symbol may be 2, 4, 6, 8, 10 and 12.

For example, when the modulation scheme is 64-QAM, $\eta_{MOD}$ is 6 ($q\eta_{MOD}=6$), and thus, each cell may be composed as $(q_0, q_1, q_2, q_3, q_4, q_5), (q_6, q_7, q_8, q_9, q_{10}, q_{11}), (q_{12}, q_{13}, q_{14}, q_{15}, q_{16}, q_{17}), \ldots$.

In addition, the modulator 5930 may perform modulation by mapping the cells onto the non-uniform constellation.

Specifically, each cell includes bits as many as the number constituting the modulation symbol, and thus, the modulator 5930 may generate the modulation symbol by sequentially mapping each cell onto a constellation point of the non-uniform constellation. Herein, the modulation symbol corresponds to a constellation point of a constellation.

In this case, constellation may include constellation points which are defined based on Tables 5-14 according to a modulation scheme.

To be specific, the constellation may include the constellation points which are defined by a constellation position vector as in Tables 5-7 and 10-12, according to a modulation scheme. Or, the constellation may include the constellation points which are defined by the constellation position vector which is generated based on the level set as in Tables 8, 9, 13, and 14 according to a modulation scheme.

That is, the modulator 5930, in consideration of the coding rate used for encoding by the encoder 5910, may perform modulation by mapping cells onto the set of constellation points which corresponds to the coding rate from among the sets of constellation points which are defined based on Tables 5-14 according to the coding rates.

For example, constellation may include constellation points which are defined based on Table 11, when a modulation scheme is 64-QAM.

To be specific, the modulator 5930, when encoding is performed with the coding rate of 2/15 by the encoder 5910, may map the interleaved codeword onto the non-uniform constellation which includes constellation points defined by NUC_64_2/15 of Table 11.

That is, when the coding rate is 2/15 and modulation is performed to 2D 64NUC, the constellation points in the first quadrant of constellation can be expressed as the constellation position vector $\{w_0, w_1, w_2, \ldots, w_{14}, w_{15}\} = \{0.6474+0.9831i, 0.6438+0.9829i, 0.6471+0.9767i, \ldots, 0.6385+0.4656i, 0.6353+0.4653i\}$ which is defined as NUC_64_2/15 of Table 11.

In addition, the modulator 5930, when encoding is performed with the coding rate of 3/15 by the encoder 5910, may map the interleaved codeword onto the non-uniform constellation which includes the constellation points defined by NUC_64_3/15 of Table 11.

That is, when the coding rate is 3/15 and modulation is performed to 2D 64NUC, the constellation points in the first quadrant of constellation can be expressed as the constellation position vector $\{w_0, w_1, w_2, \ldots, w_{14}, w_{15}\} = \{0.5472+1.1591i, 0.5473+1.1573i, 0.5467+1.1599i, \ldots, 0.5087+0.3163i, 0.5087+0.3163i\}$ which is defined as NUC_64_3/15 of Table 11.

In addition, the modulator 5930, when encoding is performed with the coding rate of 4/15 by the encoder 5910, may map the interleaved codeword onto the non-uniform constellation which includes the constellation points defined by NUC_64_4/15 of Table 11.

That is, when coding rate is 4/15 and modulation is performed to 2D 64NUC, the constellation points of the first quadrant of constellation may be expressed as the constellation position vector $\{w_0, w_1, w_2, \ldots, w_{14}, w_{15}\}=\{0.5008+1.2136i, 0.4994+1.2194i, 0.5313+1.1715i, \ldots, 0.4791+0.2773i, 0.4791+0.2758i\}$ which is defined as NUC_64_4/15 of Table 11.

Table 11 indicates the constellation points in one quadrant of constellation, and the constellation points in remaining quadrants of constellation may be obtained by indicating each constellation point a, which is defined in Table 11, as a*, −a*, and −a respectively. (Here, * indicates complex conjugation).

As another example, when the modulation scheme is 256-QAM, the constellation points which are defined based on Table 12 may be included.

Specifically, the modulator 5930, when encoding is performed with the coding rate of 2/15 by the encoder 5910, may map the interleaved codeword onto the non-uniform constellation which includes the constellation points defined by NUC_256_2/15 of Table 12.

That is, when coding rate is 2/15 and modulation is performed to 2D 256NUC, the constellation points of the first quadrant of constellation may be expressed as the constellation position vector $\{w_0, w_1, w_2, \ldots, w_{62}, w_{63}\}=\{0.5553+1.1262i, 0.5673+0.1336i, 0.5593+1.1204i, \ldots, 0.5319+0.3381i, 0.5327+0.3395i\}$ which is defined as NUC_256_2/15 of Table 12.

In addition, the modulator 5930, when encoding is performed with the coding rate of 3/15 by the encoder 5910, may map the interleaved codeword onto the non-uniform constellation which includes the constellation points defined by NUC_256_3/15 of Table 12.

That is, when coding rate is 3/15 and modulation is performed to 2D 256NUC, the constellation points of the first quadrant of constellation may be expressed as the constellation position vector $\{w_0, w_1, w_2, \ldots, w_{62}, w_{63}\}=\{0.5229+1.1810i, 0.5384+1.1625i, 0.5148+1.1943i, \ldots, 0.4734+0.2696i, 0.4749+0.2711i\}$ which is defined as NUC_256_3/15 of Table 12.

In addition, the modulator 5930, when encoding is performed with the coding rate of 4/15 by the encoder 5910, may map the interleaved codeword onto the non-uniform constellation which includes the constellation points defined by NUC_256_4/15 of Table 11.

That is, when coding rate is 4/15 and modulation is performed to 2D 256NUC, the constellation points of the first quadrant of constellation may be expressed as the constellation position vector $\{w_0, w_1, w_2, \ldots, w_{62}, w_{63}\}=\{0.2975+1.0564i, 0.5862+0.9617i, 0.2909+1.0696i, \ldots, 0.3762+0.1998i, 0.3689+0.2114i\}$ which is defined as NUC_256_4/15 of Table 12.

Table 12 indicates the constellation points in one quadrant of constellation, and the constellation points in remaining quadrants of constellation may be obtained by indicating each constellation point a, which is defined in Table 12, as a*, −a* and −a respectively (Here, * indicates complex conjugation).

As another example, constellation, when the modulation scheme is 1024-QAM, may include the constellation points which are defined based on Table 13.

Specifically, the modulator 5930, when encoding is performed with the coding rate of 2/15 by the encoder 5910, may map the interleaved codeword onto the non-uniform constellation which includes the constellation points defined by NUC_1k_2/15 of Table 130.

That is, when coding rate is 2/15 and modulation is performed to 1D 1024NUC, the level set may be A=$\{0.3317, 0.3321, 0.3322, \ldots, 0.9394, 0.9349\}$ as NUC_1k_2/15 of Table 13, and the constellation position vector indicating the constellation points in the first quadrant may be expressed as $\{0.3317+0.3317i, 0.3317+0.3321i, 0.3321+0.3317i, \ldots, 0.9349+0.9349i\}$.

In addition, the modulator 5930, when encoding is performed with the coding rate of 3/15 by the encoder 5910, may map the interleaved codeword onto the non-uniform constellation which includes the constellation points defined by NUC_1k_3/15 of Table 13.

That is, when coding rate is 3/15 and modulation is performed to 1D 1024NUC, level set may be A=$\{0.2382, 0.2556, 0.2749, \ldots, 0.9459, 1.4299\}$ as NUC_1k_3/15 of Table 13, and the constellation position vector indicating the constellation points of the first quadrant may be expressed as 10.2382+0.2382i, 0.2382+0.2556i, 0.2556+0.2382i, ..., 1.4299+1.42990.

In addition, the modulator 5930, when encoding is performed with the coding rate of 4/15 by the encoder 5910, may map the interleaved codeword onto the non-uniform constellation which includes the constellation points defined by NUC_1k_4/15 of Table 13.

That is, when coding rate is 4/15 and modulation is performed to 1D 1024NUC, the level set may be A=$\{0.1924, 0.1940, 0.2070, \ldots, 1.1332, 1.4761\}$ as NUC_1k_4/15 of Table 13, and the constellation position vector indicating the constellation points in the first quadrant may be expressed as $\{0.1924+0.1924i, 0.1924+0.1940i, 0.1940+0.1924i, \ldots, 1.4761+1.4761i\}$.

Table 13 is used to define the constellation points in one quadrant of constellation, and the constellation points in remaining quadrants may be obtained by indicating each constellation point, which is defined based on Table 13, as a*, −a*, and −a (Here, * indicates complex conjugation).

As another example, constellation, when the modulation scheme is 4096-QAM, may include the constellation points which are defined based on Table 14.

Specifically, the modulator 5930, when encoding is performed with the coding rate 2/15 by the encoder 5910, may map the interleaved codeword onto the non-uniform constellation which includes the constellation points defined by NUC_4k_2/15 of Table 14.

That is, when coding rate is 2/15 and modulation is performed to 1D 4096NUC, the level set may be A=$\{0.2826, 0.2885, 0.2944, \ldots, 1.0185, 1.4660\}$ as NUC_4k_2/15 of Table 14, and the constellation position vector indicating the constellation points in the first quadrant may be expressed as $\{0.2826+0.2826i, 0.2826+0.2885i, 0.2885+0.2826i, \ldots, 1.4660+1.4660i\}$.

In addition, the modulator 5930, when encoding is performed with the coding rate of 3/15 by the encoder 5910, may map the interleaved codeword onto the non-uniform constellation which includes the constellation points defined by NUC_4k_3/15 of Table 14.

That is, when coding rate is 3/15 and modulation is performed to 1D 4096NUC, level set may be A=$\{0.2038, 0.2038, 0.2155, \ldots, 1.0658, 1.6424\}$ as NUC_4k_3/15 of Table 14, and the constellation position vector indicating the constellation points in the first quadrant may be expressed as $\{0.2038+0.2038i, 0.2038+0.2155i, 0.2155+0.2038i, \ldots, 1.6424+1.6424i\}$.

In addition, the modulator 5930, when encoding is performed with the coding rate of 4/15 by the encoder 5910, may map the interleaved codeword onto the non-uniform constellation which includes the constellation points defined by NUC_4k_4/15 of Table 14.

That is, when coding rate is 4/15 and modulation is performed to 1D 4096NUC, the level set may be A=$\{0.1508,$ 0.1468, 0.1456, . . . , 1.1683, 1.6391} as NUC_4k_4/15 of Table 14, and the constellation position vector indicating the constellation points in the first quadrant may be expressed as {0.1508+0.1508i, 0.1508+0.1468i, 0.1468+0.1508i, . . . , 1.6391+1.6391i}.

In addition, the modulator 5930, when encoding is performed with the coding rate of 4/15 by the encoder 5910, may map the interleaved codeword onto the non-uniform constellation which includes the constellation points defined by NUC_4k_5/15 of Table 14.

That is, when coding rate is 5/15 and modulation is performed to 1D 4096NUC, the level set may be A={0.1257, 0.1257, 0.1257, . . . , 1.1882, 1.6566} as NUC_4k_5/15 of Table 14, and the constellation position vector indicating the constellation points in the first quadrant may be expressed as {0.1257+0.1257i, 0.1257+0.3599i, 0.3599+0.1257i, . . . , 1.6566+1.6566i}.

Table 14 is used to define the constellation points in one quadrant, and the constellation points with respect to the remaining quadrants of constellation may be obtained by indicating each constellation point a, which is defined based on Table 14, as a*, −a*, and −a (Here, * indicates complex conjugation).

In the above-described examples, it is described that the cells are mapped onto the set of constellation points which correspond to coding rate used for encoding, but this is merely exemplary, and in some cases, the modulator 5930 may map the cells onto the set of constellation points which do not correspond to coding rate which is used for encoding.

As an example, when 64-QAM is used, even if encoding is performed with the coding rate of 2/15, the modulator 5930 may map the cells onto the set of constellation points which are defined as NUC_64_3/15 or NUC_64_4/15 of Table 11, instead of the set of constellation points which are defined as NUC_64_2/15 of Table 11.

Figure 58:
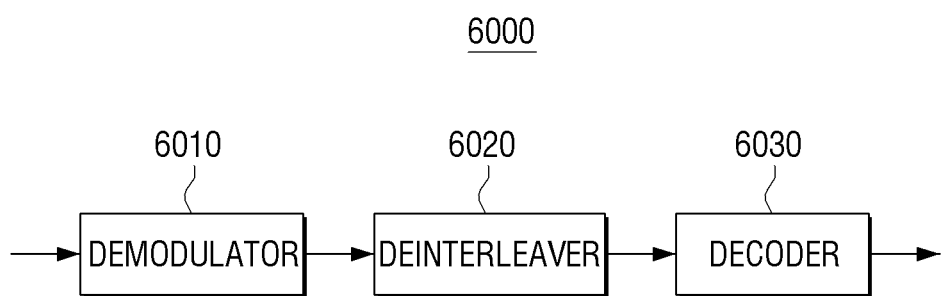
FIG. 58 is a block diagram to describe a configuration of a receiving apparatus according to an exemplary embodiment.

The transmitting apparatus 5900 may modulate a signal which is mapped onto the constellation and transmit the signal to a receiving apparatus (for example, 6000 of FIG. 58). For example the transmitting apparatus 5900 may map the signal which is mapped to the constellation onto an orthogonal frequency division multiplexing (OFDM) frame by using an OFDM scheme, and may transmit the signal to the receiving apparatus 6000 via an allocated channel.

In other word, in mapping method for 16-QAM, 64-QAM and 256-QAM, each input data cell word $(y_{0,s}, \ldots, y_{\eta_{MOD}-1,s})$ shall be modulated using a 2D non-uniform constellation to give a constellation point $z_s$. Index s denotes the discrete time index, $\eta_{MOD}=\log_2(M)$, M being the number of constellation points, e.g., M=64 for 64-QAM. The vector of complex constellation points $x=(x_0, \ldots, x_{M-1})$ includes all M constellation points of the QAM alphabet. The k-th element of this vector, $x_k$, corresponds to the QAM constellation point for the input cell word $(y_{0,s}, \ldots, y_{\eta_{MOD}-1,s})$, if these bits take on the decimal number k ($y_{0,s}$ being the most significant bit (MSB), and $y_{\eta_{MOD}-1,s}$ being the least significant bit (LSB)). Due to the quadrant symmetry, the complete vector x can be derived by defining just the first quarter of the complex constellation points, i.e., $(x_0, \ldots, x_{M/4-1})$, which corresponds to the first quadrant. The generation rule for the remaining points is described below. Defining b=M/4, the first quarter of complex constellation points is denoted as the NUC position vector $w=(w_0, \ldots, w_{b-1})$. The position vectors are defined the above tables. As an example, the NUC position vector for a 16-QAM comprises the complex constellation points with the labels corresponding to the decimal values 0, i.e., $(y_{0,s}, \ldots, y_{\eta_{MOD}-1,s})$=0000, to b−1, i.e., $(y_{0,s}, \ldots, y_{\eta_{MOD}-1,s})$=0011. The remaining constellation points are derived as follows:

$(x_0, \ldots, x_{b-1})$=w (first quarter)
$(x_b, \ldots, x_{2b-1})$=−conj(w) (second quarter)
$(x_{2b}, \ldots, x_{3b-1})$=conj(w) (third quarter)
$(x_{3b}, \ldots, x_{4b-1})$=−w (fourth quarter),
with conj being the complex conjugate.

As an example, the NUC position vector for 16-QAM and code rate 2/15 is constructed as follows. From Table 10, w=(0.7073+0.7075i, 0.7073+0.7074i, 0.7060+0.7077i, 0.7065+0.7071i). Here and in the following, i=√(−1) is the imaginary unit. Assuming the input data cell word is $(y_{0,s}, \ldots, y_{\eta_{MOD}-1,s})$=(1100), the corresponding QAM constellation point at time index s is $z_s=x_{12}=-w_0=-0.7073-0.7075i$.

Also, in mapping method for 1024-QAM and 4096-QAM, Each input data cell word $(y_{0,s}, \ldots, y_{\eta_{MOD}-1,s})$ at discrete time index s shall be modulated using a 1-dimensional non-uniform QAM constellation to give a constellation point $z_s$ prior to normalization. 1-dimensional refers to the fact that a 2-dimensional QAM constellation can be separated into two 1-dimensional PAM constellations, one for each I and Q component. The exact values of the real and imaginary components $Re(z_s)$ and $Im(z_s)$ for each combination of the relevant input cell word $(y_{0,s}, \ldots, y_{\eta_{MOD}-1,s})$ are given by a 1D-NUC position vector $u=(u_0, \ldots, u_v)$, which defines the constellation point positions of the non-uniform constellation in one dimension. The number of elements of the 1D-NUC position vector u is defined by $$v = \frac{\sqrt{M}}{2}.$$

As an example the 1024-NUC for code rate 2/15 is defined by the NUC position vector NUC_1k_2/15. From Table 13, $u=(u_0, \ldots, u_{15})$=(0.3317, 0.3321, 0.3322, 0.3321, 0.3327, 0.3328, 0.3322, 0.3322, 0.9369, 0.9418, 0.9514, 0.9471, 0.9448, 0.9492, 0.9394, 0.9349). Assuming the input data cell $(y_{0,s}, \ldots, y_{\eta_{MOD}-1,s})$=(0010011100) the corresponding QAM constellation point $z_s$ has $Re(z_s)=u_3=0.3321$ (defined by even index bit labels, i.e., 01010) and $Im(z_s)=u_{11}=0.9471$ (defined by odd index bit label, i.e., 00110).

FIG. 58 is a block diagram to describe a configuration of the receiving apparatus according to an exemplary embodiment. Referring to FIG. FIG. 58, the receiving apparatus 6000 includes a demodulator 6010, a deinterleaver 6020, and a decoder 6030.

The demodulator 6010 receives and demodulates a signal transmitted from the transmitting apparatus 5900. Specifically, the demodulator 6010 may generate a value corresponding to the codeword by demodulating the received signal.

In this case, the demodulator 6010 may perform demodulation to correspond to the modulation scheme which is used by the transmitting apparatus 5900. To do this, the transmitting apparatus 5900 may transmit information on the modulation scheme to the receiving apparatus 6000, or the transmitting apparatus 5900 may perform modulation using the modulation scheme which is predefined between the transmitting apparatus 5900 and the receiving apparatus 6000.

Meanwhile, a value which corresponds to the codeword may be expressed as a channel value with respect to the received signal. There may be various methods for determining the channel value, for example, a method for determining a log likelihood ratio (LLR) value is an example of the method for determining the channel value.

The LLR value may indicate a log value for a ratio of the probability that the bit transmitted from the transmitting apparatus 3500 is 0 and the probability that the bit is 1. In addition, the LLR value may be a bit value which is determined by a hard decision, or may be a representative value which is determined according to a section to which the probability that the bit transmitted from the transmitting apparatus 3500 is 0 or 1 belongs.

The demodulator 6010 may perform cell-to-bit conversion with respect to a value corresponding to the codeword and output an LLR value in the unit of bits.

The deinterleaver 6020 deinterleaves an output value of the demodulator 6010, and outputs the value to the decoder 6030.

To be specific, the deinterleaver 6020 is an element corresponding to the interleaver 5920 of the transmitting apparatus 5900 and performs an operation corresponding to the interleaver 5920. That is, the deinterleaver 6020 performs the interleaving operation of the interleaver 5920 inversely and deinterleaves an LLR value.

The decoder 6030 may perform channel decoding based on the output value of the deinterleaver 6020.

Specifically, the decoder 6030 is an element corresponding to the encoder 5910 of the transmitting apparatus 5900, which may correct an error by performing decoding by using the LLR value output from the deinterleaver 6020.

For example, the decoder 6030 may include an LDPC decoder (not shown) to perform LDPC decoding.

In this case, the decoder 6030 may perform LDPC decoding using an iterative decoding scheme based on a sum-product algorithm. Herein, the sum-product algorithm refers to an algorithm by which messages (e.g., LLR value) are exchanged through an edge on a bipartite graph of a message passing algorithm, and an output message is calculated from messages input to variable nodes or check nodes, and is updated.

Meanwhile, the decoder 6030 may use a parity check matrix for LDPC decoding. In this case, the parity check matrix which is used for decoding may have the same structure as the parity check matrix which is used for encoding.

Meanwhile, information on the parity check matrix or information on the code rate used for LDPC decoding may be prestored in the receiving apparatus 6000 or provided by the transmitting apparatus 5900.

The foregoing is merely exemplary, and channel decoding may be performed by various schemes which correspond to the channel coding which is performed by the transmitting apparatus 3500.

Figure 59:
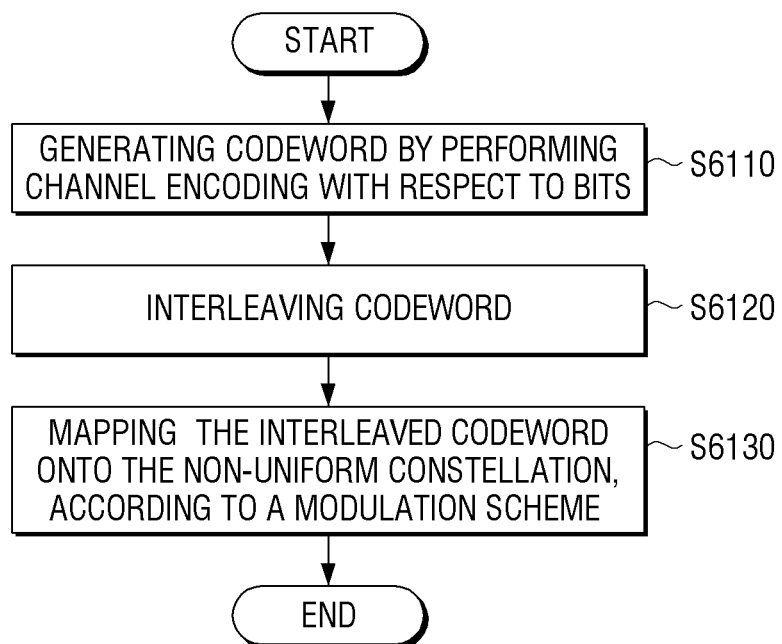
FIG. 59 is a flowchart to describe a modulation method according to an exemplary embodiment.

FIG. 59 is a flowchart to describe a method for transmitting of a transmitting apparatus according to an exemplary embodiment.

First of all, a codeword is generated (S6110) by performing channel encoding with respect to the bits, and the codeword is interleaved (S6120).

Thereafter, the interleaved codeword is mapped onto the non-uniform constellation according to a modulation scheme (S6130).

In this case, constellation may include the constellation points which are defined based on Tables 5-14 according to a modulation scheme.

As an example, when, the modulation scheme is 16-QAM, constellation may include the constellation points which are defined based on Table 10.

Specifically, when encoding is performed with the coding rate of 2/15, at S6130, an interleaved codeword may be mapped onto the non-uniform constellation which includes the constellation points defined by NUC_16_2/15 of Table 10.

When encoding is performed with the coding rate of 3/15, at S6130, the interleaved codeword may be mapped onto the non-uniform constellation which includes the constellation points which are defined by NUC_16_3/15 of Table 10.

In addition, when encoding is performed with the coding rate of 4/15, at S6130, the interleaved codeword may be mapped onto the non-uniform constellation which includes the constellation points defined by NUC_16_4/15 of Table 10.

As another example, when the modulation scheme is 64-QAM, constellation may include the constellation points which are defined based on Table 11.

Specifically, when encoding is performed with the coding rate of 2/15, at S6130, an interleaved codeword may be mapped onto the non-uniform constellation which includes the constellation points defined by NUC_64_2/15 of Table 11.

When encoding is performed with the coding rate of 3/15, at S6130, the interleaved codeword may be mapped onto the non-uniform constellation which includes the constellation points which are defined by NUC_64_3/15 of Table 11.

In addition, when encoding is performed with the coding rate of 4/15, at S6130, the interleaved codeword may be mapped onto the non-uniform constellation which includes the constellation points defined by NUC_64_4/15 of Table 11.

As another example, constellation may include the constellation points which are defined based on Table 12, when the modulation scheme is 256-QAM.

Specifically, when encoding is performed with the coding rate of 2/15, at S6130, the interleaved codeword may be mapped onto the non-uniform constellation which includes the constellation points defined by NUC_256_2/15 of Table 12.

In addition, when encoding is performed with the coding rate of 3/15, at S6130, the interleaved codeword may be mapped onto the non-uniform constellation which includes the constellation points which are defined by NUC_256_3/15 of Table 12.

When encoding is performed with the coding rate of 4/15, at S6130, the interleaved codeword may be mapped onto the non-uniform constellation which includes the constellation points defined by NUC_256_4/15 of Table 12.

Meanwhile, Tables 11 and 12 indicate the constellation points in one quadrant of the constellation, and the constellation points in the remaining quadrants of constellation may be obtained by indicating each constellation point a, which is defined in Tables 11 and 12, as a*, −a*, and −a respectively (Here, * indicates complex conjugation).

As another example, constellation may include, when the modulation scheme is 1024-QAM, the constellation points which are defined based on Table 13.

Specifically, when encoding is performed with the coding rate of 2/15, at S6130, the interleaved codeword may be mapped onto the non-uniform constellation which includes the constellation points defined based on NUC_1k_2/15 of Table 13.

In addition, when encoding is performed with the coding rate of 3/15, at S6130, the interleaved codeword may be mapped onto the non-uniform constellation which includes the constellation points defined based on NUC_1k_3/15 of Table 13.

In addition, when encoding is performed with the coding rate of 4/15, at S6130, the interleaved codeword may be mapped onto the non-uniform constellation which includes the constellation points defined based on NUC_1k_4/15 of Table 13.

As another example, constellation may include the constellation points which are defined based on Table 11, when the modulation scheme is 4096-QAM.

Specifically, when encoding is performed with the coding rate of 2/15, at S6130, the interleaved codeword may be mapped onto the non-uniform constellation which includes the constellation points defined based on NUC_4k_2/15 of Table 14.

In addition, when encoding is performed with the coding rate of 3/15, at S6130, the interleaved codeword may be mapped onto the non-uniform constellation which includes the constellation points defined based on NUC_4k_3/15 of Table 14.

When encoding is performed with the coding rate of 4/15, at S6130, the interleaved codeword may be mapped onto the non-uniform constellation which includes the constellation points which are defined based on NUC_4k_4/15 of Table 14.

When encoding is performed with the coding rate of 5/15, at S6130, the interleaved codeword may be mapped onto the non-uniform constellation which includes the constellation points which are defined based on NUC_4k_5/15 of Table 14.

Meanwhile, Tables 13 and 14 are used to define the constellation points in one quadrant, and the constellations in the remaining quadrants of constellation may be obtained by indicating each constellation point a, which is defined based on Tables 13 and 14, as a*, −a*, and −a respectively (Here, * indicates complex conjugation).

In the present disclosure, in order to generate the optimized constellation, capacity needs to be determined. To do this, SNR is an important parameter. However, optimizing with respect to the SNR does not necessarily mean that an environment which satisfies the SNR is necessary. Though it is highly likely that the optimized performance may be obtained in the environment which satisfies the SNR, but in general, receiving SNR may change frequently according to system environment, and it is obvious that different SNR or different channel coding rate may be used according to not only complexity of realizing the system but also various purposes to support several channel environments using the modulation scheme to which one NUC constellation point is applied.

Figure 60:
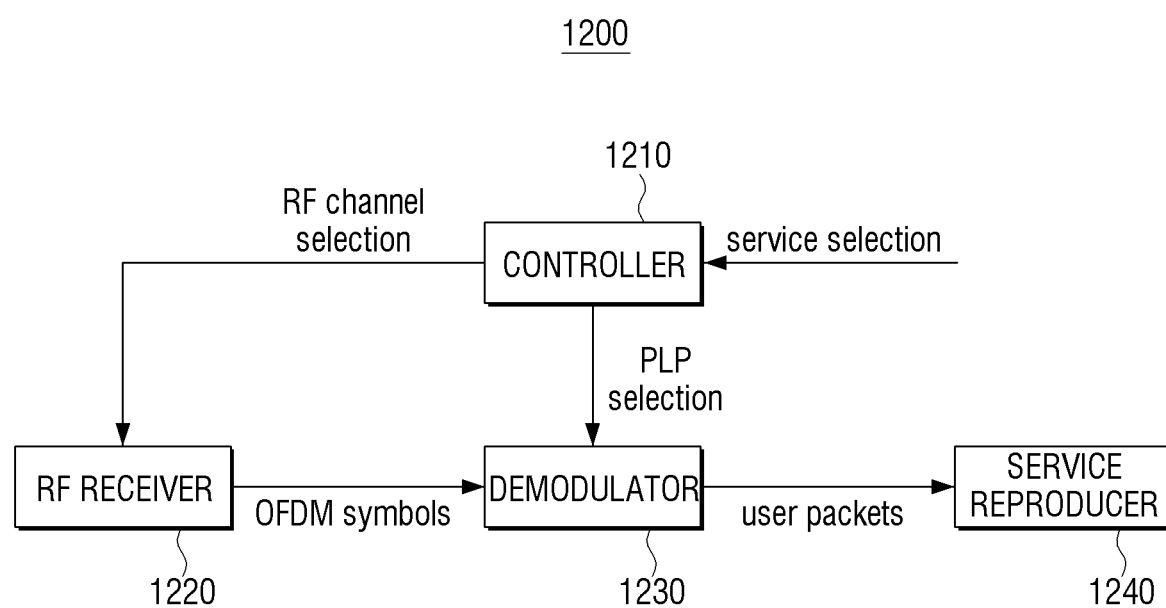
FIG. 60 is a block diagram illustrating a configuration of a receiving apparatus according to an exemplary embodiment.

FIG. 60 is a block diagram illustrating a configuration of a receiving apparatus according to an exemplary embodiment.

Referring to FIG. 60, a receiving apparatus 3800 may comprise a controller 3810, an RF receiver 3820, a demodulator 3830 and a service regenerator 3840.

The controller 3810 determines an RF channel and a PLP through which a selected service is transmitted. The RF channel may be identified by a center frequency and a bandwidth, and the PLP may be identified by its PLP ID. A specific service may be transmitted through at least one PLP included in at least one RF channel, for each component constituting the specific service. Hereinafter, for the sake of convenience of explanation, it is assumed that all of data needed to play back one service is transmitted as one PLP which is transmitted through one RF channel. In other words, a service has only one data obtaining path to reproduce the service, and the data obtaining path is identified by an RF channel and a PLP.

The RF receiver 3820 detects an RF signal from an RF channel selected by a controller 3810 and delivers OFDM symbols, which are extracted by performing signal processing on the RF signal, to the demodulator 3830. Herein, the signal processing may include synchronization, channel estimation, equalization, etc. Information required for the signal processing may be a value predetermined by the receiving apparatus 3810 and a transmitter according to use and implementation thereof and included in a predetermined OFDM symbol among the OFDM symbols and then transmitted to the receiving apparatus.

The demodulator 3830 performs signal processing on the OFDM symbols, extracts user packet and delivers the user packet to a service reproducer 3740, and the service reproducer 3840 uses the user packet to reproduce and then output a service selected by a user. Here, a format of the user packet may differ depending on a service implementation method and may be, for example, a TS packet or a IPv4 packet.

Figure 61:
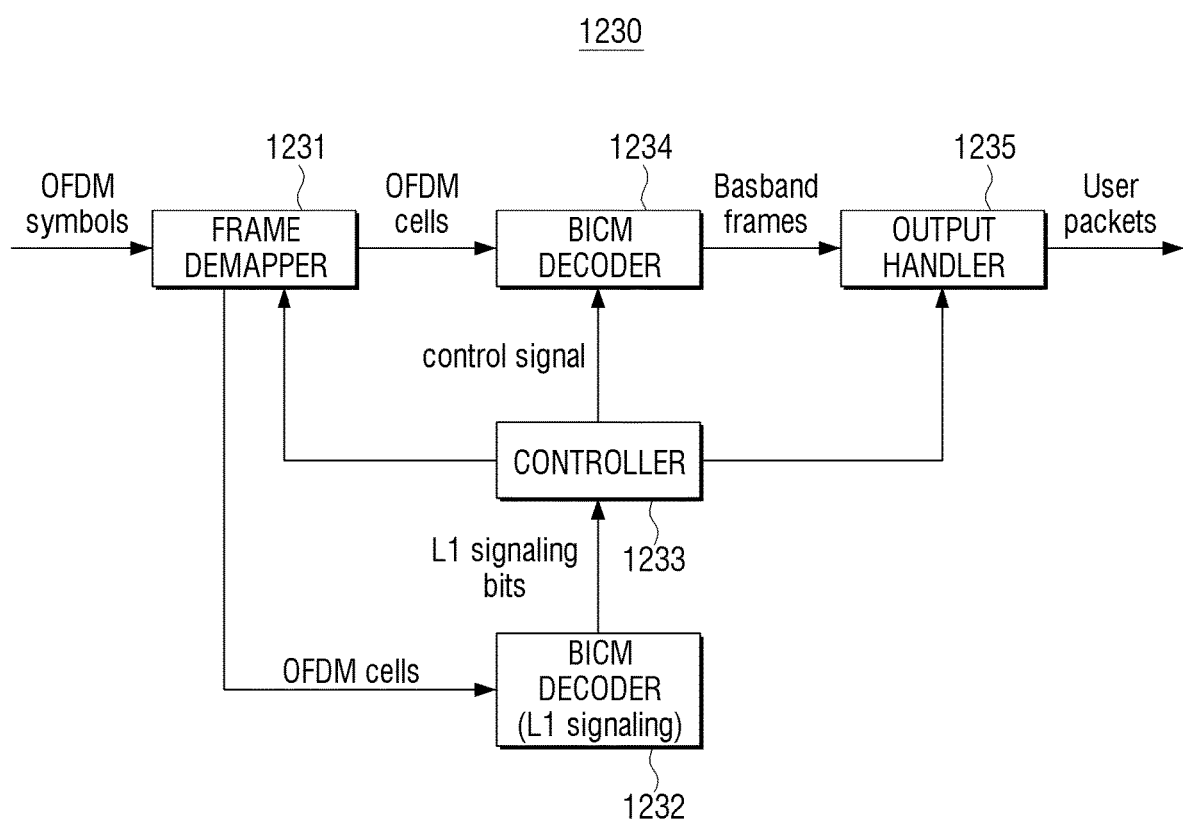
FIG. 61 is a block diagram illustrating a demodulator according to an exemplary embodiment.

FIG. 61 is a block diagram illustrating a demodulator according to an exemplary embodiment.

Referring to FIG. 61, a demodulator 3830 may include a frame demapper 3831, a BICM decoder 3832 for L1 signaling, a controller 3833, a BICM decoder 3834 and an output handler 3835.

The frame demapper 3831 selects a plurality of OFDM cells constituting an FEC block which belongs to a selected PLP in a frame including OFDM symbols, based on control information from the controller 3833, and provides the selected OFDM cells to the BICM decoder 3834. The frame demapper 3831 also selects a plurality of OFDM cells corresponding to at least one FEC block which includes L1 signaling, and delivers the selected OFDM cells to the BICM decoder 3832 for L1 signaling.

The BICM decoder for L1 signaling 3832 performs signal processing on an OFDM cell corresponding to an FEC block which includes L1 signaling, extracts L1 signaling bits and delivers the L1 signaling bits to the controller 3833. In this case, the signal processing may include an operation of extracting an LLR value for decoding an LDPC codeword and a process of using the extracted LLR value to decode the LDPC codeword.

The controller 3833 extracts an L1 signaling table from the L1 signaling bits and uses the L1 signaling table value to control operations of the frame demapper 3831, the BICM decoder 3834 and the output handler 3835. FIG. 61 illustrates that the BICM decoder 3832 for L1 signaling does not use control information of the controller 3833. However, when the L1 signaling has a layer structure similar to the layer structure of the above described L1 pre signaling and L1 post signaling, it is obvious that the BICM decoder 3832 for L1 signaling may be constituted by at least one BICM decoding block, and operation of this BICM decoding block and the frame demapper 3831 may be controlled by L1 signaling information of an upper layer.

The BICM decoder 3834 performs signal processing on the OFDM cells constituting FEC blocks which belong to a selected PLP to extract BBF (Baseband frame)s and delivers the BBFs to the output handler 3835. In this case, the signal processing may include an operation of extracting an LLR value for decoding an LDPC codeword and an operation of using the extracted LLR value to decode the LDPC codeword, which may be performed based on control information output from the controller 3833.

The output handler 3835 performs signal processing on a BBF, extracts a user packet and delivers the extracted user packet to a service reproducer 3840. In this case, the signal processing may be performed based on control information output from the controller 3833.

According to an exemplary embodiment, the output handler 3835 comprises a BBF handler (not shown) which extracts BBP (Baseband packet) from the BBF.

Figure 62:
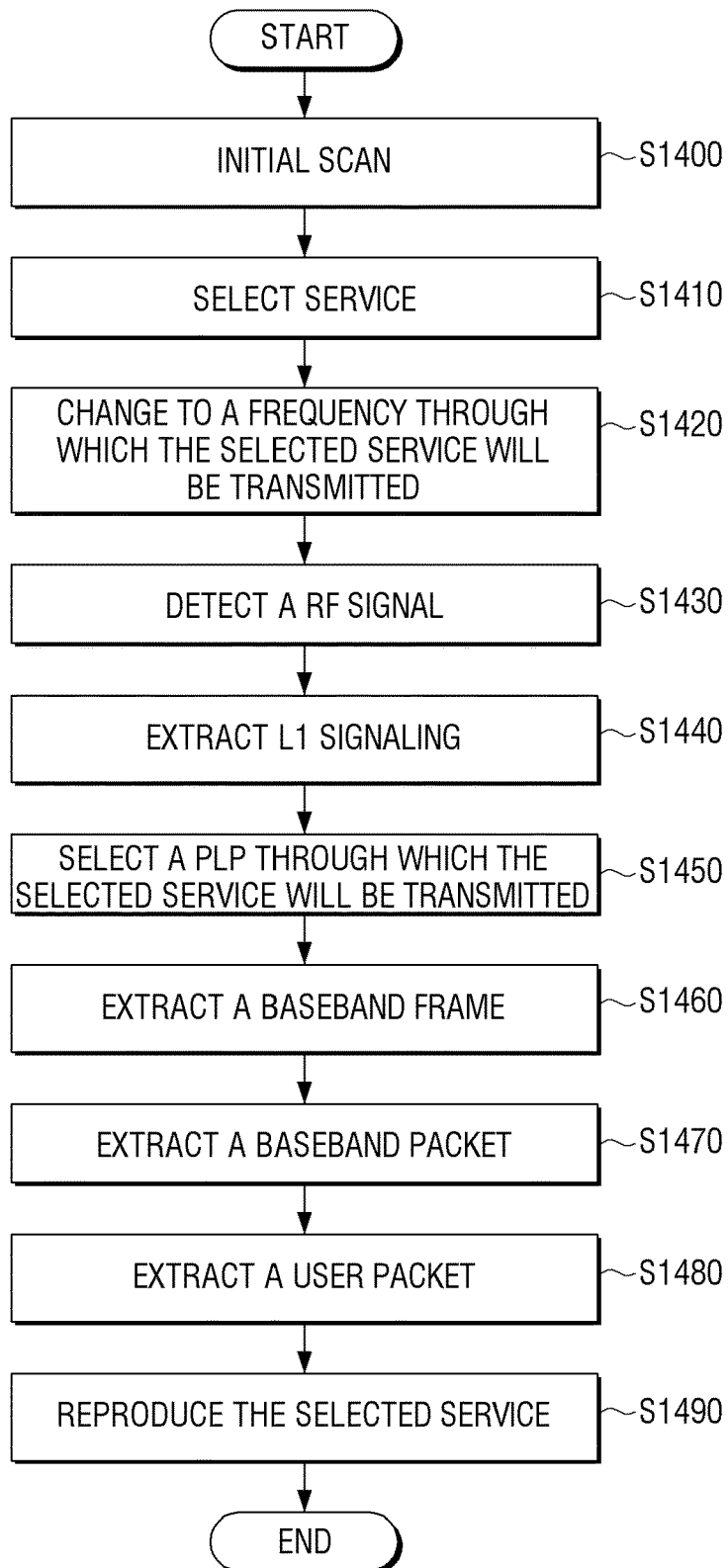
FIG. 62 is a flowchart provided to illustrate an operation of a receiving apparatus from a moment when a user selects a service until the selected service is reproduced, according to an exemplary embodiment.

FIG. 62 is a flowchart provided to illustrate an operation of a receiving apparatus from a moment when a user selects a service until the selected service is reproduced, according to an exemplary embodiment.

It is assumed that service information on all services selectable by a user are acquired at an initial scan (S4010) prior to the user's service selection (S4020). Service information may include information on a RF channel and a PLP which transmits data required to reproduce a specific service in a current receiving apparatus. As an example of the service information, program specific information/service information (PSI/SI) in an MPEG2-TS is available, and normally can be achieved through L2 signaling and an upper-layer signaling.

In the initial scan (S4010), comprehensive information on a payload type of PLPs which are transmitted to a specific frequency band. As an example, there may be information on whether every PLP transmitted to the frequency band includes a specific type of data.

When the user selects a service (S4020), the receiving apparatus transforms the selected service to a transmitting frequency and performs RF signaling detection (S4030). In the frequency transforming operation (S4020), the service information may be used.

When an RF signal is detected, the receiving apparatus performs an L1 signaling extracting operation from the detected RF signal (S4050). Then, the receiving apparatus selects a PLP transmitting the selected service, based on the extracted L1 signaling, (S4060) and extracts a BBF from the selected PLP (S4070). In S4060, the service information may be used.

The operation to extract a BBF (S4070) may include an operation of demapping the transmitted frame and selecting OFDM cells included in a PLP, an operation of extracting an LLR value for LDPC coding/decoding from an OFDM cell, and an operation of decoding the LDPC codeword using the extracted LLR value.

The receiving apparatus, using header information of an extracted BBF, extracts a BBP from the BBF (S4080). The receiving apparatus also uses header information of an extracted BBP to extract a user packet from the extracted BBP (S4090). The extracted user packet is used to reproduce the selected service (S4100). In the BBP extraction operation (S4080) and user packet extraction operation (S4090), L1 signaling information extracted in the L1 signaling extraction operation may be used.

According to an exemplary embodiment, the L1 signaling information includes information on types of a user packet transmitted through a corresponding PLP, and information on an operation used to encapsulate the user packet in a BBF. The foregoing information may be used in the user packet extraction operation (S1480). Specifically, this information may be used in an operation of extracting the user packet which is a reverse operation of encapsulation of the user packet in the BBF. In this case, process for extracting user packet from the BBP (restoring null TS packet and inserting TS sync byte) is same as above description.

A non-transitory computer readable medium in which a program which sequentially performs non-uniform constellation generation method is stored therein may be provided.

The non-transitory computer-recordable medium is not a medium configured to temporarily store data such as a register, a cache, or a memory but an apparatus-readable medium configured to semi-permanently store data. Specifically, the above-described various applications or programs may be stored in the non-transitory apparatus-readable medium such as a compact disc (CD), a digital versatile disc (DVD), a hard disc, a Blu-ray disc, a universal serial bus (USB), a memory card, or a read only memory (ROM), and provided.

In the block diagram which illustrates the transmitting apparatus and receiving apparatus, bus is not illustrated, but communication among elements of each apparatus can be done through the bus. In addition, each apparatus may further include CPU performing the steps described above and processors such as a micro processor.

The components, elements, modules or units may be embodied as various numbers of hardware, software and/or firmware structures that execute respective functions described above, according to an exemplary embodiment. For example, these components, elements, modules or units may use a direct circuit structure, such as a memory, processing, logic, a look-up table, etc. that may execute the respective functions through controls of one or more microprocessors or other control apparatuses. Also, these components, elements, modules or units may be specifically embodied by a program or a part of code, which contains one or more executable instructions for performing specified logic functions. Also, at least one of these components, elements, modules or units may further include a processor such as a central processing unit (CPU) that performs the respective functions, a microprocessor, or the like.

The foregoing exemplary embodiments and advantages are merely exemplary and are not to be construed as limiting the inventive concept. The exemplary embodiments can be readily applied to other types of device or apparatus. Also, the description of the exemplary embodiments is intended to be illustrative, and not to limit the scope of the inventive concept, and many alternatives, modifications, and variations will be apparent to those skilled in the art.

What is claimed is:

1. A broadcasting signal receiving apparatus comprising:
   a receiver configured to receive a signal from a broadcasting signal transmitting apparatus;
   a demodulator configured to demodulate the signal to generate values according to 4096-quadrature amplitude modulation (QAM);
   a deinterleaver configured to deinterleave the values; and
   a decoder configured to decode the deinterleaved values based on a low density parity check (LDPC) code having a code rate being 3/15,
   wherein the demodulator is configured to demodulate the signal based on constellation points,
   wherein each of the constellation points is represented in one of A+Bi, −A+Bi, A−Bi and −A−Bi,
   where A is a real component, B is an imaginary component, and each of A and B comprises one of values listed below:

0.2038
   0.2038
   0.2155
   0.2155
   0.2155
   0.2155
   0.2097
   0.2038
   0.2796
   0.2912

-continued 0.3029
0.2970
0.2970
0.3029
0.2796
0.2796
0.7222
0.7397
0.7455
0.7339
0.7397
0.7513
0.7455
0.7339
1.3046
1.0833
0.9785
1.0134
0.9901
0.9610
1.0658
1.6424.

2. A receiving method of a broadcasting signal receiving apparatus, the method comprising:
   receiving a signal from a broadcasting signal transmitting apparatus;
   demodulating the signal to generate values according to 4096-quadrature amplitude modulation (QAM);
   deinterleaving the values; and
   decoding the deinterleaved values based on a low density parity check (LDPC) code having a code rate being 3/15,
   wherein the demodulator is configured to demodulate the signal based on constellation points,
   wherein each of the constellation points is represented in one of A+Bi, −A+Bi, A−Bi and −A−Bi, where A is a real component, B is an imaginary component, and each of A and B comprises one of values listed below:

0.2038
0.2038
0.2155
0.2155
0.2155
0.2155
0.2097
0.2038
0.2796
0.2912
0.3029
0.2970
0.2970
0.3029
0.2796
0.2796
0.7222
0.7397
0.7455
0.7339
0.7397
0.7513
0.7455
0.7339
1.3046
1.0833
0.9785
1.0134
0.9901
0.9610
1.0658
1.6424.

* * * * *